United States Patent
Katsuyama et al.

(10) Patent No.: US 11,322,559 B2
(45) Date of Patent: May 3, 2022

(54) CONDUCTIVE MEMBER, CONDUCTIVE FILM, DISPLAY DEVICE HAVING THE SAME, TOUCH PANEL, METHOD OF PRODUCING WIRING PATTERN OF CONDUCTIVE MEMBER, AND METHOD OF PRODUCING WIRING PATTERN OF CONDUCTIVE FILM

(71) Applicant: FUJIFILM Corporation, Tokyo (JP)

(72) Inventors: Kimito Katsuyama, Kanagawa (JP); Masaya Nakayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 5 days.

(21) Appl. No.: 17/031,938

(22) Filed: Sep. 25, 2020

(65) Prior Publication Data

US 2021/0013269 A1     Jan. 14, 2021

Related U.S. Application Data

(63) Continuation of application No. PCT/JP2019/012864, filed on Mar. 26, 2019.

(30) Foreign Application Priority Data

Mar. 27, 2018    (JP) .............................. JP2018-059810

(51) Int. Cl.
    *H01L 27/32*        (2006.01)
    *G06F 3/041*        (2006.01)
    (Continued)

(52) U.S. Cl.
    CPC .......... *H01L 27/323* (2013.01); *G06F 3/0412* (2013.01); *H01B 5/14* (2013.01);
    (Continued)

(58) Field of Classification Search
    CPC ......... G02F 1/1333; G06F 2203/04103; G06F 2203/04112; G06F 3/0412; G06F 3/04164;
    (Continued)

(56) References Cited

U.S. PATENT DOCUMENTS

| | | |
|---|---|---|
| 9,791,712 B2 | 10/2017 | Iwami |
| 10,088,690 B2 | 10/2018 | Iwami et al. |

(Continued)

FOREIGN PATENT DOCUMENTS

| | | |
|---|---|---|
| JP | 2013213858 | 10/2013 |
| JP | 2013214545 | 10/2013 |

(Continued)

OTHER PUBLICATIONS

"International Search Report (Form PCT/ISA/210) of PCT/JP2019/012864," dated Jun. 25, 2019, with English translation thereof, pp. 1-5.

(Continued)

*Primary Examiner* — Michael Pervan
(74) *Attorney, Agent, or Firm* — JCIPRNET

(57) ABSTRACT

A conductive member has a wiring portion, and the wiring portion has a mesh-shaped wiring pattern in which line wirings each being composed of a plurality of thin metal wires arranged in parallel in one direction are overlapped in two or more directions. The line wiring in at least one direction is a straight line wiring in which a plurality of thin metal wires are straight lines. The straight line wiring in at least one direction has a non-equal pitch wiring pattern in which repetitive pitches of a predetermined number of the thin metal wires are equal and at least two pitches of the respective pitches of the predetermined number of the thin metal wires are different. The conductive member has a wiring pattern capable of reducing moiré compared to an (Continued)

equal pitch wiring pattern, particularly a wiring pattern capable of reducing both regular moiré and irregular moiré (noise). A conductive film, a display device, and a touch panel each include the conductive member.

20 Claims, 29 Drawing Sheets

(51) Int. Cl.
*H01B 5/14* (2006.01)
*H01L 51/52* (2006.01)

(52) U.S. Cl.
CPC ........ *H01L 27/326* (2013.01); *H01L 27/3276* (2013.01); *H01L 51/5284* (2013.01); *H01L 2227/323* (2013.01)

(58) Field of Classification Search
CPC ........ G06F 3/0445; G06F 3/0446; G09F 9/00; H01B 5/14; H01L 2227/323; H01L 27/323; H01L 27/326; H01L 27/3276; H01L 51/5284; H05B 33/02
USPC .................................................. 345/170–178
See application file for complete search history.

(56) References Cited

U.S. PATENT DOCUMENTS

| | | | |
|---|---|---|---|
| 10,254,904 | B2 | 4/2019 | Satou |
| 10,338,008 | B2 | 7/2019 | Iwami |
| 2011/0102361 | A1 | 5/2011 | Philipp |
| 2014/0152916 | A1 | 6/2014 | Nakamura et al. |
| 2015/0015979 | A1* | 1/2015 | Iwami ................... G02B 27/00 359/893 |
| 2015/0342034 | A1 | 11/2015 | Iwami |
| 2016/0026298 | A1 | 1/2016 | Hashida et al. |
| 2016/0266709 | A1 | 9/2016 | Kurasawa |
| 2017/0221196 | A1 | 8/2017 | Yamaguchi et al. |
| 2018/0018047 | A1* | 1/2018 | Iwami ..................... G06F 3/047 |
| 2018/0024689 | A1 | 1/2018 | Yoshiki |
| 2018/0307350 | A1* | 10/2018 | Nukui ..................... G06F 3/044 |
| 2020/0117301 | A1* | 4/2020 | Nakayama ............. G06F 3/047 |
| 2021/0011583 | A1* | 1/2021 | Katsuyama ........... G06F 3/0445 |
| 2021/0013269 | A1* | 1/2021 | Katsuyama ............... G09F 9/00 |
| 2021/0064106 | A1* | 3/2021 | Katsuyama ........... G02F 1/1343 |

FOREIGN PATENT DOCUMENTS

| | | |
|---|---|---|
| JP | 2014109997 | 6/2014 |
| JP | 2015035205 | 2/2015 |
| JP | 2015108884 | 6/2015 |
| JP | 2016014929 | 1/2016 |
| JP | 2016170730 | 9/2016 |
| JP | 2016184406 | 10/2016 |
| WO | 2014123009 | 8/2014 |
| WO | 2016060147 | 4/2016 |

OTHER PUBLICATIONS

"International Preliminary Report On Patentability (Form PCT/IPEA/409) of PCT/JP2019/012864," completed on Jun. 10, 2020, with English translation thereof, pp. 1-14.

"Office Action of Japan Counterpart Application" with English translation thereof, dated Sep. 7, 2021, p. 1-p. 10.

* cited by examiner

CONDUCTIVE MEMBER, CONDUCTIVE FILM, DISPLAY DEVICE HAVING THE SAME, TOUCH PANEL, METHOD OF PRODUCING WIRING PATTERN OF CONDUCTIVE MEMBER, AND METHOD OF PRODUCING WIRING PATTERN OF CONDUCTIVE FILM

CROSS-REFERENCE TO RELATED APPLICATIONS

This application is a Continuation of PCT International Application No. PCT/JP2019/012864 filed on Mar. 26, 2019, which claims priority under 35 U.S.C. § 119(a) to Japanese Patent Application No. 2018-059810 filed on Mar. 27, 2018. The above application is hereby expressly incorporated by reference, in its entirety, into the present application.

BACKGROUND OF THE INVENTION

1. Field of the Invention

The present invention relates to a conductive member, a conductive film, a display device having the same, a touch panel, a method of producing a wiring pattern of the conductive member, and a method of producing a wiring pattern of the conductive film. More specifically, the present invention relates to a conductive member having a mesh-shaped wiring pattern that provides an image quality with improved visibility of moiré even in a case where overlapped on a pixel array pattern of a display device, a conductive film, a display device having the same, a touch panel, a method of producing a wiring pattern of the conductive member, and a method of producing a wiring pattern of the conductive film.

2. Description of the Related Art

Examples of a conductive film provided on a display unit of a display device (hereinafter, also referred to as a display) include a conductive film for a touch panel having a conducting layer which is composed of thin metal wires having a mesh-shaped wiring pattern (hereinafter, also referred to as a mesh pattern).

In these conductive films, there is a problem of visibility of moiré due to interference between the mesh pattern and the pixel array pattern of the display. Here, the pixel array pattern of the display is, for example, each array pattern of red (R), green (G), and blue (B) color filters or a black matrix (hereinafter also referred to as BM) pattern which is an inverted pattern thereof. As for the problem of visibility of moiré, specifically, there is a known problem that regular moiré is conspicuous in a case where the equal pitch wiring pattern is overlapped on the pixel array pattern. For this reason, various conductive films, each of which has a mesh pattern in which moiré (particularly regular moiré) is not visible or hardly likely to be visible, have been proposed (refer to, for example, JP2013-213858A, JP2013-214545A, and JP2016-014929A).

The technology disclosed in JP2013-213858A relating to the application filed by the present applicant relates to a conductive film provided on a display unit of a display device. In the technology, the sum of moiré intensities within a predetermined frequency range is equal to or less than a predetermined value with respect to moiré frequency information and intensity obtained by applying visual response characteristics to moiré frequency information and intensity calculated from the frequency and intensity of a 2-dimensional fast Fourier transform (2DFFT) spectrum between a wiring pattern and a pixel array pattern of the conductive film. In the technology of JP2013-213858A, it is possible to restrain occurrence of moiré, and it is possible to improve visibility.

The technology disclosed in JP2013-214545A relating to the application filed by the present applicant is based on the technology disclosed in JP2013-213858A described above. In the technology, the wiring pattern is limited to rhomboids, and irregularity is provided to the rhomboid shape of the mesh pattern, in which the sum of moiré intensities is equal to or less than a predetermined value, in accordance with the width of the thin metal wires forming the mesh pattern. In the technology of JP2013-214545A, it is also possible to restrain occurrence of moiré, and it is possible to improve visibility.

The technology disclosed in JP2016-014929A relating to the application filed by the present applicant is a technology based on a 2-layer wiring pattern on the upper side (TOP) and the lower side (BOTTOM) and a rhomboid wiring pattern to which irregularity is provided. Here, at least one of TOP or BOTTOM is a wiring pattern in which irregularity is provided to the pitches of rhomboids. According to this technology, the 2-layer wiring pattern is configured such that the moiré evaluation value calculated from the moiré evaluation values of the respective colors is equal to or less than a threshold value. The moiré evaluation value of each color is obtained by applying visual response characteristics to the intensity and frequency of the spectrum peak of the 2DFFT spectrum of each color and the intensity and frequency of moiré calculated from the intensity and frequency of the 2DFFT spectrum of the overlapping wiring pattern. According to the technology disclosed in JP2016-014929A, it is possible to restrain occurrence of moiré depending on the intensity of the display regardless of the observation distance, and it is possible to greatly improve visibility.

SUMMARY OF THE INVENTION

By the way, in JP2013-213858A, a rhomboid (diamond) mesh pattern is shown as a specific example of the wiring pattern. However, in an equal pitch wiring pattern such as a rhomboid mesh pattern, even in a case where the rotation angle and pitch are optimized, there is a limit in restraining occurrence of regular moiré.

On the other hand, in JP2013-214545A and JP2016-014929A, an attempt is made to provide irregularity to the wiring pattern in order to reduce regular moiré.

However, in a case where irregularity is provided to the wiring pattern, although regular moiré is reduced, irregular moiré (noise) increases. As a result, there is a problem that visibility of moiré (the sum of regular moiré and irregular moiré) does not change.

In JP2016-014929A, an attempt is made to "select a wiring pattern in which the moiré evaluation index is equal to or less than a threshold value after providing irregularity". However, in a case where such an attempt is made, although the regular moiré can be reduced as compared with the regular wiring pattern, there is no guarantee that both the regular moiré and the irregular moiré (noise) can be reduced. In JP2016-014929A, the characteristics of a wiring pattern capable of reducing both regular moiré and irregular moiré (noise) as compared with a regular wiring pattern and the reason for that are not clarified.

In order to solve the above-mentioned problems of the prior art, the present invention has an object to provide a conductive member, a conductive film, a display device and a touch panel having the same, a method of producing a wiring pattern of the conductive member, and a method of producing a wiring pattern of the conductive film. The conductive member and the conductive film each have a wiring pattern capable of reducing moiré compared to an equal pitch wiring pattern, in particular, a wiring pattern capable of reducing both regular moiré and irregular moiré (noise) by making the repetitive pitches of the predetermined number of wirings as an equal pitch and the respective pitches of the predetermined number of wirings as non-equal pitches, in a straight line wiring in at least one direction based on the frequency information of the pixel array pattern, in a mesh-shaped wiring pattern in which straight line wirings in two or more directions are overlapped or a mesh-shaped wiring pattern in which straight line wirings in one or more directions and non-straight line wirings in other one or more directions are overlapped.

In order to achieve the above object, according to a first aspect of the present invention, there is provided a conductive member including a wiring portion which is composed of a plurality of thin metal wires. The wiring portion has a mesh-shaped wiring pattern in which line wirings each being composed of a plurality of thin metal wires arranged in parallel in one direction are overlapped in two or more directions. The line wiring in at least one direction is a straight line wiring in which the plurality of thin metal wires are straight lines. In addition, the straight line wiring in at least one direction has a non-equal pitch wiring pattern in which repetitive pitches of a predetermined number of the thin metal wires are equal and at least two pitches of the respective pitches of the predetermined number of the thin metal wires are different.

Here, it is preferable that the plurality of thin metal wires are all straight lines in the line wirings in all the two or more directions.

Further, it is preferable that the conductive member is to be provided on a display unit of a display device. In addition, it is preferable that the mesh-shaped wiring pattern is overlapped on a pixel array pattern of the display unit.

Further, it is preferable that a moiré evaluation value in the non-equal pitch wiring pattern is less than a moiré evaluation value in an equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal. In addition, it is preferable that the moiré evaluation value is a sum of intensities of frequency components of moiré obtained by applying human's visual response characteristics to frequency components of the moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

In order to achieve the above object, according to a second aspect of the present invention, there is provided a conductive film including: a transparent substrate; and a wiring portion that is formed on at least one surface of the transparent substrate and composed of a plurality of thin metal wires. The wiring portion has a mesh-shaped wiring pattern in which line wirings each being composed of a plurality of thin metal wires arranged in parallel in one direction are overlapped in two or more directions. The line wiring in at least one direction is a straight line wiring in which the plurality of thin metal wires are straight lines. In addition, the straight line wiring in at least one direction has a non-equal pitch wiring pattern in which repetitive pitches of a predetermined number of the thin metal wires are equal and at least two pitches of the respective pitches of the predetermined number of the thin metal wires are different.

In order to achieve the above object, according to a third aspect of the present invention, there is provided a display device including: a display unit having a predetermined pixel array pattern; and the conductive member according to the first aspect of the present invention or the conductive film according to the second aspect of the present invention, which is provided on the display unit.

Here, it is preferable that the display unit is an organic EL display (OELD), and the pixel array patterns of at least two colors of red (R), green (G), and blue (B) are different.

In order to achieve the above object, according to a fourth aspect of the present invention, there is provided a touch panel using the conductive member according to the first aspect of the present invention or the conductive film according to the second aspect of the present invention.

In addition, in order to achieve the above-mentioned object, according to a fifth aspect of the present invention, there is provided a method of producing a wiring pattern of a conductive member which is provided on a display unit of a display device and has a wiring portion that is composed of a plurality of thin metal wires, where the wiring portion has a mesh-shaped wiring pattern in which line wirings each being composed of a plurality of thin metal wires arranged in parallel in one direction are overlapped in two or more directions. The line wiring in at least one direction is a straight line wiring in which the plurality of thin metal wires are straight lines. The mesh-shaped wiring pattern is overlapped on a pixel array pattern of the display unit, and the straight line wiring in at least one direction has a non-equal pitch wiring pattern in which repetitive pitches of a predetermined number of the thin metal wires are equal and at least two pitches of the respective pitches of the predetermined number of the thin metal wires are different. The method includes acquiring a luminance or a transmittance of the pixel array pattern; acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal; deriving a 2-dimensional Fourier frequency distribution of the transmittances of the respective wiring patterns of the non-equal pitch wiring pattern and the equal pitch wiring pattern; deriving a 2-dimensional Fourier frequency distribution of the luminance or the transmittance of the pixel array pattern; calculating respective frequency components of moiré from frequency components of the 2-dimensional Fourier frequency distribution of the transmittances of the non-equal pitch wiring pattern and the equal pitch wiring pattern and frequency components of the 2-dimensional Fourier frequency distribution of the luminance or the transmittance of the pixel array pattern; applying human's visual response characteristics to the calculated respective frequency components of the moiré so as to obtain a moiré evaluation value, which is a sum of intensities of the respective frequency components; and producing the non-equal pitch wiring pattern in a state where the obtained moiré evaluation value in the non-equal pitch wiring pattern is less than a moiré evaluation value in the equal pitch wiring pattern.

Here, it is preferable that the line wirings are straight line wirings in all of two or more directions.

In order to achieve the above object, according to a sixth aspect of the present invention, there is provided a method of producing a wiring pattern of a conductive film which is provided on a display unit of a display device and has a transparent substrate and a wiring portion that is formed on at least one surface of the transparent substrate and composed of a plurality of thin metal wires, where the wiring portion has a mesh-shaped wiring pattern in which line wirings each being composed of a plurality of thin metal wires arranged in parallel in one direction are overlapped in two or more directions. The line wiring in at least one direction is a straight line wiring in which the plurality of thin metal wires are straight lines. The mesh-shaped wiring pattern is overlapped on a pixel array pattern of the display unit, and the straight line wiring in at least one direction has a non-equal pitch wiring pattern in which repetitive pitches of a predetermined number of the thin metal wires are equal and at least two pitches of the respective pitches of the predetermined number of the thin metal wires are different. The method includes acquiring a luminance or a transmittance of the pixel array pattern is obtained. Transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal; deriving a 2-dimensional Fourier frequency distribution of the transmittances of the respective wiring patterns of the non-equal pitch wiring pattern and the equal pitch wiring pattern; deriving a 2-dimensional Fourier frequency distribution of the luminance or the transmittance of the pixel array pattern; calculating respective frequency components of moiré from frequency components of the 2-dimensional Fourier frequency distribution of the transmittances of the non-equal pitch wiring pattern and the equal pitch wiring pattern and frequency components of the 2-dimensional Fourier frequency distribution of the luminance or the transmittance of the pixel array pattern; applying human's visual response characteristics to the calculated respective frequency components of the moiré so as to obtain a moiré evaluation value, which is a sum of intensities of the respective frequency components; and producing the non-equal pitch wiring pattern in a state where the obtained moiré evaluation value in the non-equal pitch wiring pattern is less than a moiré evaluation value in the equal pitch wiring pattern.

In any one of the first to sixth aspects, it is preferable that the visual response characteristics are given by a visual transfer function VTF represented by Expression (1).

$$k \leq \log(0.238/0.138)/0.1$$

$$VTF=1$$

$$k > \log(0.238/0.138)/0.1$$

$$VTF = 5.05 e^{-0.138k}(1-e^{0.1k}) \quad (1)$$

$$k = \pi du/180$$

Here, log is a natural logarithm, k is a spatial frequency defined by solid angle (cycle/deg), u is a spatial frequency defined by length (cycle/mm), and d is an observation distance (mm) within a range of 100 mm to 1000 mm.

Further, it is preferable that the observation distance d in the visual response characteristics is a certain distance in a range from 300 mm to 800 mm.

Furthermore, it is preferable that assuming that the moiré evaluation value is I, the moiré evaluation value I is derived from an intensity of each frequency component of the moiré by Expression (2).

$$I=(\Sigma(R[i])^x)^{1/x} \quad (2)$$

Here, R[i] is an intensity of an i-th frequency component of moiré, and the order x is a certain value in a range of 1 to 4.

In addition, it is preferable that the order x is 2.

Further, it is preferable that the moiré evaluation value is derived by a non-linear sum of the intensities of the frequency components of the moiré.

Furthermore, it is preferable that the moiré evaluation value also includes frequency components of the moiré calculated from a frequency of 0 of the pixel array pattern and the frequency components of the wiring pattern.

Further, it is preferable that an intensity of a frequency component of the moiré that contributes most to the moiré in the non-equal pitch wiring pattern is less than an intensity of a frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal.

Furthermore, it is preferable that a frequency of the frequency component of the moiré that contributes most to the moiré in the non-equal pitch wiring pattern is greater than a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal.

In addition, it is preferable that at or below a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, the moiré evaluation value in the non-equal pitch wiring pattern is less than the moiré evaluation value in the equal pitch wiring pattern. In addition, it is preferable that the moiré evaluation value is a sum of intensities of frequency components of moiré obtained by applying human's visual response characteristics to frequency components of the moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

In addition, it is preferable that at a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the moiré in the non-equal pitch wiring pattern is less than an intensity of the frequency component of the moiré in the equal pitch wiring pattern.

Further, it is preferable that an intensity of the frequency component of the non-equal pitch wiring pattern as a cause of the frequency component of the moiré that contributes most to the moiré in the non-equal pitch wiring pattern is less than an intensity of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal.

In addition, it is preferable that at a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the non-equal pitch wiring pattern is less than an intensity of the frequency component of the equal pitch wiring pattern.

Further, It is preferable that assuming that the predetermined number is n and the thin metal wires are thin metal wires 1, 2, . . . , and n in the non-equal pitch wiring pattern, a pitch p of each thin metal wire from the thin metal wire 1 satisfies at least one of Condition 1 or Condition 2.

Condition 1: a difference between the number of thin metal wires where the pitch p belongs to an interval of $(N-d)*T<p<(N+d)*T$ and the number of thin metal wires where the pitch p belongs to an interval of $(N+0.5-d)*T<p<(N+0.5+d)*T$ is equal to or less than 1.

Condition 2: a difference between the number of thin metal wires where the pitch p belongs to an interval of $(N+0.25-d)*T<p<(N+0.25+d)*T$ and the number of thin metal wires where the pitch p belongs to an interval of $(N+0.75-d)*T<p<(N+0.75+d)*T$ is equal to or less than 1.

Here, T is a period given by 1/F in a case where F is a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal or a frequency of the frequency component of the equal pitch wiring pattern as a cause of the frequency component of the moiré that contributes most to the moiré in the wiring pattern formed only of any of thin metal wires 1, 2, . . . , and n. N is 0 or a positive integer and is equal to or less than an integer of $(n*PA/T)$ in which PA is a pitch of the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal. d is a certain value in a range of 0.025 to 0.25.

Further, it is preferable that the pixel array pattern is a black matrix pattern.

Furthermore, it is preferable that the predetermined number is equal to or less than 16.

Further, it is preferable that the wiring portion has the mesh-shaped wiring pattern in which the line wirings are overlapped in two directions and all the plurality of thin metal wires are straight lines.

Moreover, it is preferable that the mesh-shaped wiring pattern in which the line wirings are overlapped in two directions is a bilaterally asymmetric wiring pattern.

Further, it is preferable that an angle formed by the line wirings in the two directions is in a range of 40 degrees to 140 degrees.

Further, it is preferable that an average pitch of the line wiring in at least one direction among the line wirings overlapped in the two or more directions is in a range of 30 μm to 600 μm.

Furthermore, it is preferable that the average pitch is equal to or less than 300 μm.

Further, it is preferable that the wiring portion has a wiring pattern in which an average pitch of the line wiring in at least one direction among the line wirings in two or more directions is equal to an average pitch of the line wiring in at least one different direction but the wiring portion may have a wiring pattern in which the average pitches thereof are different.

In addition, it is preferable that there is a wiring pattern of a line wiring in a direction, in which the average pitch is the narrowest is the non-equal pitch wiring pattern, among the line wirings in two or more directions.

As described above, according to the embodiment of the present invention, it is possible to provide a conductive member having a wiring pattern capable of reducing moiré compared to an equal pitch wiring pattern, a conductive film having the same, a display device, and a touch panel, a method of producing a wiring pattern of the conductive member, and a method of producing a wiring pattern of the conductive film.

Further, according to the embodiment of the present invention, it is possible to reduce moiré, in particular, it is possible to provide a conductive member having a wiring pattern capable of reducing both regular moiré and irregular moiré (noise), a conductive film, and a display device having the same, a touch panel, a method of producing a wiring pattern of the conductive member, and a method of producing a wiring pattern of the conductive film.

DESCRIPTION OF THE PREFERRED EMBODIMENTS

Figure 1:
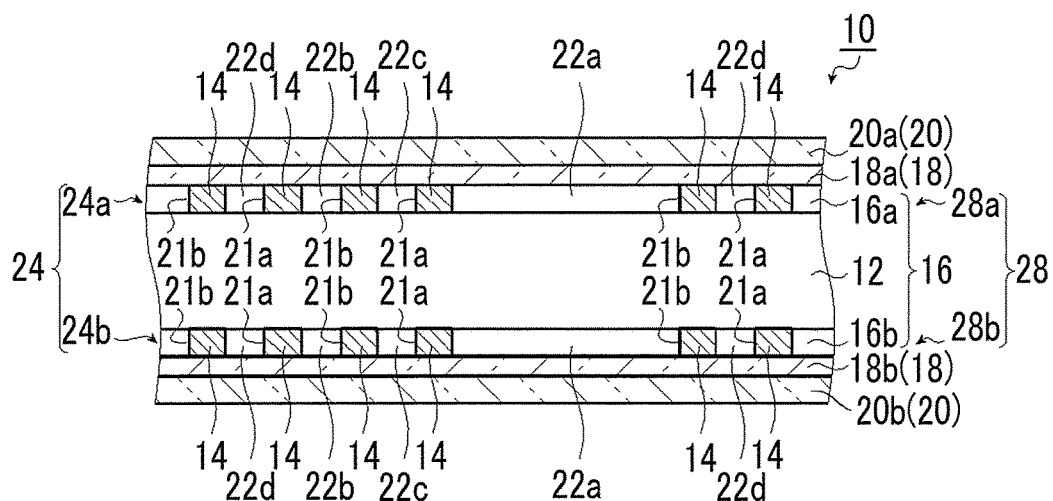
FIG. 1 is a partial cross-sectional view schematically showing an example of a conductive film according to a first embodiment of the present invention.

Hereinafter, a conductive member, a conductive film, a display device having the same, a touch panel, a method of producing a wiring pattern of a conductive member, and a method of producing a wiring pattern of a conductive film according to the embodiment of the present invention will be described in detail with reference to suitable embodiments shown in the accompanying drawings.

In the embodiment of the present invention, one having at least a wiring portion being composed of a plurality of thin metal wires is defined as a conductive member, and one having a transparent substrate among them is defined as a conductive film. That is, the conductive member of the embodiment of the present invention includes both a conductive film, which does not have a transparent substrate, and a conductive film, which has a transparent substrate, used in a case where the film is directly disposed on the display unit or in a case where the film is directly disposed on the pixel array of the display unit. Therefore, the present invention is characterized by a wiring pattern being composed of a plurality of thin metal wires, and relates to a typical wiring pattern itself being composed of thin metal wires, regardless of the transparent substrate, in both the conductive member that does not define the transparent substrate and the conductive film including the transparent substrate. Hereinafter, the present invention will be mainly described with respect to a conductive film having a transparent substrate, but the embodiment of the present invention is characterized in a wiring pattern being composed of a plurality of thin metal wires. Thus, the description thereof relates to a conductive member which is a superordinate concept. Here, the conductive member of the embodiment of the present invention can be called a sensor member.

In addition, the conductive member and the conductive film according to the embodiment of the present invention will be described below by using a conductive film for a touch panel as a representative example, but the embodiment of the present invention is not limited thereto. For example, the conductive film of the embodiment of the present invention is formed on at least one surface of a transparent substrate. Any conductive film may be used as long as the film has a wiring portion having a wiring pattern including a non-equal pitch wiring pattern in which repetitive pitches of a predetermined number of thin metal wires are equal and respective pitches of the predetermined number of the thin metal wires are not equal in a straight line wiring in at least one direction. Therefore, the wiring pattern of the wiring portion of the conductive film of the embodiment of the present invention may include a non-equal pitch wiring pattern.

Further, the present invention may be any conductive film having such a wiring pattern as long as the conductive film is provided on a display unit of various light emission intensities of a display device. For example, as a matter of course, the present invention may be applied to a conductive film for shielding electromagnetic waves and the like. Here, a display device having a display unit, on which the conductive film of the embodiment of the present invention is provided, may be a liquid crystal display (LCD), a plasma display panel (PDP), an organic electro-luminescence display (OELD), an inorganic EL display, or the like.

Here, the wiring pattern formed on at least one surface of the transparent substrate means "a wiring pattern disposed on only one surface of the transparent substrate", "a wiring pattern on one surface or wiring patterns on both surfaces, among wiring patterns disposed on both respective surfaces of the transparent substrate", or "one wiring pattern or two or more wiring patterns, among the wiring patterns laminated on one surface of the transparent substrate". In addition, the wiring pattern formed on at least one surface of the transparent substrate also means "a wiring pattern in which wiring patterns disposed on both respective surfaces of the transparent substrate are overlapped (superposed)", "a wiring pattern in which two or more wiring patterns among wiring patterns laminated on one surface of the transparent substrate are overlapped (superposed)", or "a wiring pattern in which two wiring patterns are overlapped (superposed) by cementing two wiring patterns respectively disposed on two transparent substrates". Details will be described later.

A display unit (hereinafter, also referred to as a display) of a display device, on which the conductive film of the embodiment of the present invention is overlapped, is not particularly limited as long as pixels are arranged in accordance with a pixel array pattern (hereinafter, also referred to as a BM pattern) and the light emission intensity (luminance) thereof can be considered in the evaluation of visibility of moiré due to the overlap of conductive films. Alternatively, the display unit is not particularly limited as long as respective sub-pixels that emit light of a plurality of colors including at least three different colors, for example, three colors of red, green, and blue, are arranged in accordance with the pixel array patterns of the respective sub-pixels and the light emission intensity (luminance) thereof can be considered in the evaluation of visibility of moiré due to the overlap of conductive films. For example, as in the conventional case, the display unit may be a display unit of which the pixel array patterns (shapes, sizes, pixel array periods, and directions of the sub-pixels) of the sub-pixels of respective colors such as RGB are all the same and are represented by the G sub-pixel. In addition, in a similar manner to the above-mentioned OELD, the display unit may be a display unit which has pixel array patterns not the same for a plurality of colors, that is, different pixel array patterns of sub-pixels for at least two colors.

In a manner similar to that of a high resolution smartphone, a tablet terminal, or the like, the display of the display device subjected to the embodiment of the present invention may be a display which has a high light emission intensity. In a manner similar to that of a low resolution desktop PC, a television (TV), or the like, the display may be a display having a low light emission intensity. In a manner similar to that of a medium resolution laptop or the like, the display may be a display having approximately a medium light emission intensity.

Figure 2:
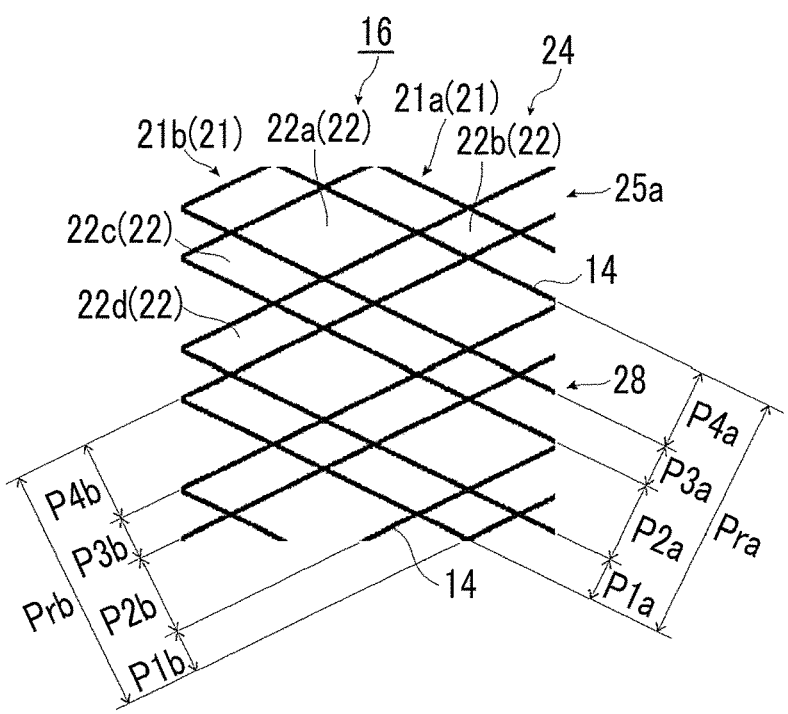
FIG. 2 is a plan view schematically showing an example of a mesh-shaped wiring pattern of a wiring portion of the conductive film shown in FIG. 1.

FIG. 1 is a partial cross-sectional view schematically showing an example of a conductive film according to a first embodiment of the present invention. FIG. 2 is a plan view schematically showing an example of a wiring pattern of a wiring portion of the conductive film shown in FIG. 1.

As shown in FIGS. 1 and 2, the conductive film 10 of the present embodiment is provided on the display unit of the display device, and is a conductive film which has a wiring pattern excellent in restraining occurrence of moiré with respect to the pixel array of the display unit, particularly, a wiring pattern optimized in terms of visibility of moiré with respect to the pixel array pattern in a case where the film is overlapped on the pixel array pattern.

The conductive film 10 shown in FIG. 1 comprises: a transparent substrate 12; a first wiring portion 16a that is formed on one surface (upper surface in FIG. 1) of the transparent substrate 12, is composed of a plurality of thin metal wires (hereinafter, referred to as thin metal wires) 14, and serves as the first electrode portion; a first protective layer 20a that is adhered to the substantially entire surface of the first wiring portion 16a with the first adhesive layer 18a interposed therebetween so as to cover the thin metal wires 14; a second wiring portion (electrode) 16b that is formed on the other surface (lower surface in FIG. 1) of the transparent substrate 12, is composed of a plurality of thin metal wires 14, and serves as a second electrode portion; and a second protective layer 20b that is adhered to the substantially entire surface of the wiring portion 16b with the second adhesive layer 18b interposed therebetween.

Hereinafter, the first wiring portion 16a and the second wiring portion 16b are collectively referred to as simply wiring portions 16, the first adhesive layer 18a and the second adhesive layer 18b are collectively referred to as simply adhesive layers 18, and the first protective layer 20a and the second protective layer 20b are collectively referred to as simply protective layers 20.

The conductive film 10 may have at least the transparent substrate 12 and the first wiring portion 16a. Although not shown, a functional layer such as an adhesion enhancing layer or an undercoat layer may be provided between the transparent substrate 12 and the first wiring portion 16a or between the transparent substrate 12 and the second wiring portion 16b.

The transparent substrate 12 is transparent and electrically insulating, that is, made of a material having a high insulating property and a high light-transmitting property, and is particularly not limited as long as the substrate is able to support the first wiring portion 16a and the second wiring portion 16b. Examples of the material forming the transparent substrate 12 include materials such as resin, glass, and silicon. Examples of the glass include tempered glass and alkali-free glass. Examples of the resin include polyethylene terephthalate (PET), polyethylene naphthalate (PEN), polymethyl methacrylate (PMMA), cycloolefin polymer (COP), cyclic olefin copolymer (COC), polycarbonate (PC), acrylic resin, polyethylene (PE), polypropylene (PP), polystyrene (PS), polyvinyl chloride (PVC), polyvinylidene chloride (PVDC), cellulose triacetate (TAC), and the like. The thickness of the transparent substrate 12 is, for example, 20 to 1000 μm, and particularly preferably 30 to 100 μm.

In the embodiment of the present invention, "transparent" means that the light transmittance is at least 30% or more, preferably 50% or more, more preferably 70% or more, even more preferably 90% or more, in the visible light wavelength range of 400 to 800 nm. The light transmittance is measured using "a method of calculating a total light transmittance and a total light reflectance of plastic" prescribed in JIS K7375: 2008.

The total light transmittance of the transparent substrate 12 is preferably 30% to 100%. The total light transmittance is measured using, for example, "a method of calculating a total light transmittance and a total light reflectance of plastic" prescribed in JIS K7375: 2008.

The conductive member according to the first embodiment of the present invention is the conductive film according to the first embodiment of the present invention shown in FIG. 1 having at least the wiring portion 16a. FIG. 2 is a plan view schematically showing an example of a wiring pattern of a wiring portion of the conductive member according to the first embodiment of the present invention, and is a diagram showing the conductive member according to the first embodiment of the present invention.

The thin metal wires 14 are not particularly limited as long as they are thin lines being composed of metal having high conductivity, and include thin lines made of a line material such as gold (Au), silver (Ag) or copper (Cu). While it is more preferable indeed in terms of visibility in a case where the thin metal wires 14 have a narrower line width, the line width has only to be equal to or less than 30 μm, for example. For application to a touch panel, the line width of the thin metal wires 14 is preferably equal to or greater than 0.1 μm and equal to or less than 15 μm, more preferably equal to or greater than 1 μm and equal to or less than 9 μm, and still more preferably equal to or greater than 1 μm and equal to or less than 7 μm. Furthermore, the line width is particularly preferably equal to or greater than 1 μm and equal to or less than 4 μm.

Figure 3:
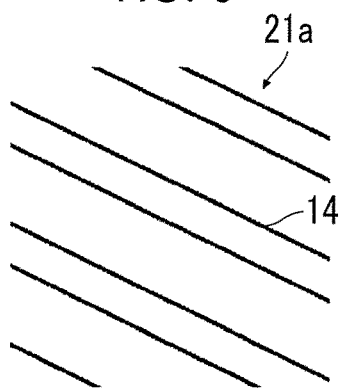
FIG. 3 is a plan view schematically showing a non-equal pitch wiring pattern in a straight line wiring of the wiring pattern in one direction shown in FIG. 2.
Figure 4:
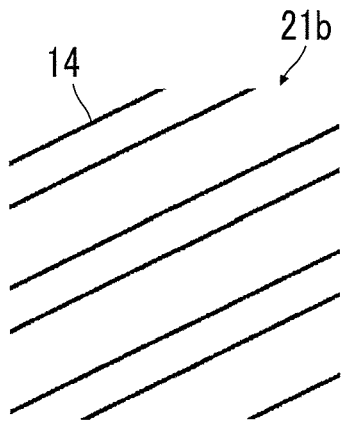
FIG. 4 is a plan view schematically showing a non-equal pitch wiring pattern in a straight line wiring of the wiring pattern in another direction shown in FIG. 2.

As shown in FIG. 2, the wiring portion 16 (16a, 16b) comprises a wiring layer 28 (28a, 28b) having a mesh-shaped wiring pattern 24 (24a, 24b) in which wirings are arranged in a mesh shape by overlapping a straight line wiring 21a being composed of a plurality of thin metal wires 14 arranged in parallel in one direction shown in FIG. 3 and a straight line wiring 21b being composed of the plurality of thin metal wires 14 arranged in parallel in another direction shown in FIG. 4. Here, the wiring pattern 24a of the wiring layer 28a and the wiring pattern 24b of the wiring layer 28b may be the same mesh-shaped wiring patterns or different mesh-shaped wiring patterns. However, hereinafter, the wiring patterns are the same mesh-shaped wiring patterns and not distinguished, and thus will be described as a mesh-shaped wiring pattern 24 (hereinafter, simply referred to as a wiring pattern in a case where it is clear that the wirings are the mesh-shaped wiring patterns).

The wiring pattern 24 shown in FIG. 2 is a non-equal pitch wiring patterns in which each of the respective straight line wiring 21a and 21b has a repetitive pitch Pra or Prb of four thin metal wires 14. The repetitive pitches Pra and Prb are equal pitches (Pra and Prb are constant values), and the pitches P1a, P2a, P3a, and P4a of the four thin metal wires 14 of the straight line wiring 21a are non-equal pitches (among P1a, P2a, P3a, and P4a, at least two pitches are different). At the same time, the wiring pattern is a non-equal pitch wiring patterns in which the pitches P1b, P2b, P3b, and P4b of the respective four thin metal wires 14 of the straight line wiring 21b are non-equal pitches (at least two pitches among P1b, P2b, P3b, and P4b are different). Further, the repetitive pitches Pra and Prb of the four thin metal wires 14 of the straight line wirings 21a and 21b are equal (Pra=Prb), and the respective pitches of the four thin metal wires 14 of the straight line wirings 21a and 21b are also equal (P1a=P1b, P2a=P2b, P3a=P3b, and P4a=P4b).

As shown in FIG. 2, the wiring pattern 24 is a mesh-shaped wiring pattern 25a of the first example of the present invention in which the opening portions (cells) 22 (22a, 22b, 22c, and 22d) each having a predetermined shape are arranged. The opening portions 22 are formed by intersecting the plurality of thin metal wires 14 with each other by overlapping the straight line wiring 21a and the straight line wiring 21b which are non-equal pitch wiring patterns.

Therefore, it can be said that the mesh-shaped wiring pattern 25a is a wiring pattern in which a plurality of opening portions 22 (22a, 22b, 22c, and 22d), which have a plurality of types of parallelogram shapes having predetermined angles kept therebetween in plan view and having different pitches (accordingly, sizes), are successively connected in two directions forming the predetermined angle.

In the straight line wirings 21a and 21b of the mesh-shaped wiring pattern 25a shown in FIG. 2, the repetitive pitches of the four thin metal wires 14 are equal pitches, and the respective pitches of the four thin metal wires 14 are non-equal pitches. However, the present invention is not limited to this, and the wiring pattern may be a non-equal pitch wiring pattern in which the repetitive pitches of the predetermined number of the thin metal wires 14 are equal pitches and the respective pitches of the predetermined number of the thin metal wires 14 are non-equal pitches.

Since the minimum number of the thin metal wires 14 that can be formed in the non-equal pitch is 2, the predetermined number is 2 or more. Further, the predetermined number is preferably 64 or less, more preferably 32 or less, and still more preferably 16 or less. A particularly preferable predetermined number is 2 or more and 8 or less. The reason for this is that, as will be described later, the minimum frequency of the straight line wirings 21 becomes lower and the straight line wirings 21 themselves becomes more visible as the predetermined number of non-equal pitches is increased. Further, the reason for this is that, as the predetermined number is increased, the frequency components of the straight line wirings 21 is more finely spread, as a result, a large number of fine moiré components are generated, and no matter how the pitches of the predetermined number of the thin metal wires 14 is optimized, it may be difficult to keep all of a large number of moiré s away from each frequency component of the pixel array pattern. In the embodiment of the present invention, it is not necessary that all the pitches of the predetermined number of thin metal wires 14 are different, and pitches of at least two thin metal wires 14 of the predetermined number of the thin metal wires 14 may be different.

Further, in the example shown in FIG. 2, the straight line wirings 21 each being composed of the plurality of thin metal wires 14 arranged in parallel in one direction has two directions of the straight line wirings 21a and 21b. However, the present invention is not limited to this, and the straight line wirings 21 in three or more directions may be overlapped. In addition, the number of directions of the straight line wirings 21 having different overlapping directions is preferably 8 or less, more preferably 4 or less, and still more preferably two directions. The reason for this is that, as will be described later, there is an upper limit to the number of the thin metal wires 14 per unit area in order to secure the transmittance. Therefore, the smaller the number of directions of the straight line wirings 21, the more the number of the thin metal wires 14 per one direction, and as a result, the wiring pitches of the thin metal wires 14 can be narrowed such that moiré is hardly likely to occur. Further, as the wiring pitches of the thin metal wires 14 are narrower, the more freely the pitches of the predetermined number of the thin metal wires 14 can be optimized and the moiré can be reduced within a range in which visibility of the straight line wirings 21 themselves is not affected. On the other hand, in order to prevent loss of the function of the conductive film as the touch sensor, it is necessary for the number of directions of the straight line wirings 21 to be at least two directions, and thus two directions are most desirable.

In the wiring pattern 25a shown in FIG. 2, the straight line wirings 21a and 21b of which the repetitive pitches are equal are overlapped in two directions. However, the present invention is not limited to this, and the straight line wirings having different repetitive pitches may be overlapped in two or more directions. Here, in a wiring pattern in which straight line wirings are overlapped in two directions, as in the example shown in FIG. 2, rhomboids are formed in units of the repetitive pitches in a case where the repetitive pitches in the two directions are equal, and parallelograms are formed in units of the repetitive pitches in a case where the repetitive pitches in the two directions are different.

In addition, in the example shown in FIG. 2, the mesh-shaped wiring pattern 25a is a non-equal pitch wiring pattern in which repetitive pitches of predetermined number (4) of thin metal wires 14 are equal pitches and pitches of the predetermined number (4) of the thin metal wires 14 are non-equal pitches in the straight line wirings 21 in the two directions of the straight line wirings 21a and 21b. However, the present invention is not limited to this. In the embodiment of the present invention, wiring patterns having different directions in the non-equal pitch wiring pattern in which the repetitive pitches of the predetermined number of the thin metal wires 14 are equal pitches and the respective pitches of the predetermined number of the thin metal wires 14 are non-equal pitches may be only the straight line wiring 21 in one direction (either one of the straight line wirings 21a and 21b), as in the wiring pattern 25b of the second example of the present invention shown in FIG. 5. Further, although not shown, all the straight line wirings 21 in three or more directions each may be a non-equal pitch wiring pattern in which the repetitive pitches of the predetermined number of the thin metal wires 14 are equal pitches and the respective pitches of the predetermined number of the thin metal wires 14 are non-equal pitches.

Figure 5:
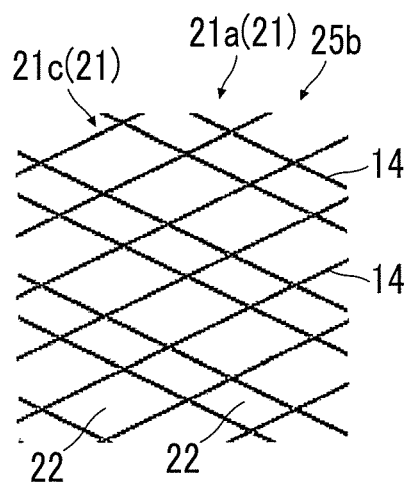
FIG. 5 is a plan view schematically showing another example of a mesh-shaped wiring pattern of a wiring portion of the conductive film shown in FIG. 1.
Figure 59:
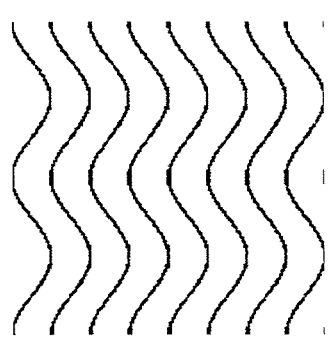
FIG. 59 is a plan view schematically showing another example of the line wiring of the wiring portion of the conductive film.

The wiring pattern 25b shown in FIG. 5 is a mesh-shaped wiring pattern in which the straight line wiring 21a and the straight line wiring 21c are overlapped and arranged in a mesh shape. In the straight line wiring 21a, the repetitive pitches of the predetermined number (4) of thin metal wires 14 arranged in parallel in one direction shown in FIG. 3 are equal pitches, and the pitches of the predetermined number (4) of the thin metal wires 14 are non-equal pitches. The straight line wiring 21c is composed of a plurality of thin metal wires 14 arranged at equal pitches in parallel in another direction shown in FIG. 6. As described above, according to the embodiment of the present invention, there is provided at least a wiring pattern being composed of the straight line wirings in which the repetitive pitches of the predetermined number of thin metal wires 14 arranged in parallel in one direction are equal pitches, and the respective pitches of the predetermined number of the thin metal wires 14 are non-equal pitches. Here, the line wiring, which overlaps with the straight line wiring having the characteristics of the embodiment of the present invention and which is composed of a plurality of thin metal wires arranged in parallel in another direction, does not necessarily have to be a straight line wiring. The line wiring may be, for example, a curved line wiring 23c as shown in FIG. 59 to be described later, and may be a line wiring being composed of polygonal lines. In the embodiment of the present invention, a straight line wiring, a curved line wiring, and a line wiring being composed of polygonal lines are collectively referred to as a line wiring. In the embodiment of the present invention, it is preferable that the line wirings overlapped in two or more directions are straight line wirings in all the two or more overlapped directions in order to reduce moiré. In the following description, an example in which the line wirings overlapped in two or more directions are all straight line wirings will be described as a representative example. However, it is needless to say that the embodiment of the present invention includes the following case. As long as the line wiring in at least one direction among the line wirings overlapped in two or more directions is a straight line wiring having the characteristics of the embodiment of the present invention, straight line wiring in at least one different direction may not be a straight line wiring.

Therefore, it can be said that the wiring pattern 25b includes a non-equal pitch wiring pattern of the straight line wiring 21a, and is a wiring pattern in which a plurality of opening portions 22, which have a plurality of types of parallelogram shapes having predetermined angles kept therebetween in plan view and having different pitches (accordingly, sizes), are successively connected in two directions forming the predetermined angle.

It should be noted that, needless to say, the number of the straight line wirings 21 having different directions, in which the repetitive pitches of the predetermined number of thin metal wires 14 are equal pitches and the respective pitches of the predetermined number of thin metal wires 14 are non-equal pitches, is equal to or less than the number of directions of straight line wirings overlapped in different directions but preferably equal to the number of directions of straight line wirings overlapped in different directions. That is, it is preferable that the repetitive pitches of the predetermined number of thin metal wires 14 in the straight line wirings 21 overlapped in all the directions are equal pitches, and the pitches of the predetermined number of the thin metal wires 14 are non-equal pitches. The reason for this is as follows. As will be described later, in the straight line wirings 21 in the respective directions, each of the predetermined number of the thin metal wires 14 has a non-equal pitch so as to cancel out the frequency components that cause moiré. Thereby, moiré can be reduced rather than that in the case of setting the equal pitches. Thus, it is preferable to reduce moiré by setting the non-equal pitches so as to cancel out the frequency components that cause moiré in the straight line wirings 21 in all directions. Further, in the embodiment of the present invention, the repetitive pitches of the predetermined number of the thin metal wires 14 to be non-equal pitches, the respective pitches of the thin metal wires 14, and the predetermined numbers thereof may be equal in all directions or may be different in the respective directions.

In the straight line wirings 21 (21a, 21b) of the wiring patterns 25a and 25b, assuming that the average pitch obtained by dividing the repetitive pitches by the predetermined number is 100%, non-equal pitches of at least two thin metal wires 14 among the predetermined number of the thin metal wires 14 of which the repetitive pitches are equal pitches are preferably 10% or more or 190% or less in order to make the straight line wirings 21 themselves invisible, and are preferably 99% or less or 101% or more in order to obtain an effect of reducing moiré. That is, it is preferable that the non-equal pitches of at least two thin metal wires are 10% or more and 99% or less, or 101% or more and 190% or less in order to obtain the effect of reducing moiré without making the straight line wirings 21 themselves visible.

Further, the variation of the predetermined number of repetitive pitches is preferably within ±20%, more preferably within ±10%, and still more preferably within ±5%.

Although details will be described later, the conductive film 10 of the embodiment of the present invention includes a wiring pattern in which straight line wirings 21 each being composed of a plurality of thin metal wires 14 arranged in parallel in one direction are overlapped in two or more directions, and a non-equal pitch wiring pattern, in which the repetitive pitches of the predetermined number of the thin metal wires 14 are equal pitches and the respective pitches of the predetermined number of the thin metal wires 14 are non-equal pitches in the straight line wiring 21 in at least one direction. The conductive film 10 has a wiring pattern which is optimized in terms of moiré visibility with respect to the pixel array pattern having a predetermined luminance of the display unit. In the embodiment of the present invention, the wiring pattern optimized in terms of moiré visibility with respect to the pixel array pattern having the predetermined luminance means a wiring pattern in which moiré is not perceived by human vision with respect to a pixel array pattern having a predetermined luminance.

Therefore, the wiring pattern 24 (24a, 24b) has a non-equal pitch wiring pattern, and is a wiring pattern which is optimized in terms of moiré visibility with respect to the pixel array pattern of the predetermined luminance of the display unit and in which a moiré evaluation index is equal to or less than a predetermined evaluation threshold value. The moiré evaluation index is calculated from the combined image data of the combined wiring pattern 24 in which (the transmittance image data pieces of) the wiring patterns 24a and 24b are overlapped and the luminance data of the pixel array pattern of each color in a case where light of each of a plurality of colors of the display is turned on. That is, the wiring pattern 24 is overlapped on the display screen of the display having a predetermined light emission intensity. Thereby, it is possible to sufficiently restrain occurrence of moiré and to improve visibility. In addition, the wiring pattern 24 is a wiring pattern including a non-equal pitch wiring pattern optimized in terms of moiré visibility with respect to the pixel array pattern having a predetermined luminance of the display unit.

According to the embodiment of the present invention, as described above, it is possible to generate a wiring pattern which is excellent in visibility of moiré by using a wiring pattern in which straight line wirings in two or more directions are overlapped, a non-equal pitch wiring pattern in which the repetitive pitches of the predetermined number of the thin metal wires are equal pitches and the respective pitches of the predetermined number of the thin metal wires are non-equal pitches in the straight line wiring in at least one direction, and a non-equal pitch wiring pattern which is optimized in terms of moiré visibility with respect to the pixel array pattern having the predetermined luminance of the display unit.

In addition, in the wiring pattern 24 included in such an optimized wiring pattern, disconnection (break) may be included in the side (straight line wiring 21) of the thin metal wires 14 forming the opening portion 22. The thin metal wires 14 may be cut in the middle due to disconnection (break) in order to form electrical insulation like a dummy electrode portion and an in-electrode dummy pattern portion described later. In addition, even in the straight line wiring 21c having an equal pitch shown in FIG. 5 which overlaps with the straight line wiring 21a having a non-equal pitch wiring pattern, disconnection (break) may be included in the side of the thin metal wires 14 forming the opening portion 22. Needless to say, the thin metal wires 14 may be cut in the middle. As the shape of the mesh-shaped wiring pattern having such a break (disconnection portion), it is possible to apply the shape of the mesh-shaped wiring pattern of the conductive film described in JP6001089B or WO 2013/094729A relating to the application filed by the present applicant.

In the conductive film 10 of the embodiment shown in FIG. 1, in FIG. 1, a plurality of thin metal wires 14 of the first wiring portion 16a on the upper side (viewing side) of the transparent substrate 12 and a plurality of thin metal wires 14 of the second wiring portion 16b on the lower side (display side) respectively have a wiring pattern 25a including the non-equal pitch wiring pattern shown in FIG. 2 or a wiring pattern 25b including the non-equal pitch wiring pattern shown in FIG. 5 as wiring patterns 24a and 24b, thereby forming a combined wiring pattern 24 by overlapping wiring patterns 24a and 24b including non-equal pitch wiring patterns on the upper side and the lower side. In the conductive film 10 of the embodiment shown in FIG. 1, together with the wiring patterns 24a and 24b, the combined wiring pattern 24 is also a wiring pattern including non-equal pitch wiring patterns. The wiring patterns 24a and 24b are wiring patterns including non-equal pitch wiring patterns optimized in terms of moiré visibility with respect to the pixel array pattern of the predetermined luminance of the display unit, and the combined wiring pattern 24 is also a wiring pattern including a non-equal pitch wiring pattern optimized in terms of moiré visibility.

That is, in the example shown in FIG. 1, both the first wiring portion 16a and the second wiring portion 16b each are composed of a plurality of thin metal wires having a wiring pattern including a non-equal pitch wiring pattern optimized in terms of moiré visibility as shown in FIG. 2 or FIG. 5 (as a result, a combined wiring pattern formed by overlapping the wiring patterns of the thin metal wires of the first wiring portion 16a and the second wiring portion 16b includes a non-equal pitch wiring pattern optimized in terms of moiré visibility). However, the present invention is not limited to this, and at least a part of one of the wiring portions 16 has a plurality of thin metal wires having the wiring pattern 25a or 25b including the non-equal pitch wiring pattern shown in FIG. 2 or 5. Alternatively, a plurality of the thin metal wires of the first wiring portion 16a and the second wiring portion 16b may be configured such that both the wiring pattern 24a of the first wiring portion 16a and the wiring pattern 24b of the second wiring portion 16b do not include the non-equal pitch wiring pattern shown in FIG. 2 or FIG. 5 and the combined wiring pattern 24 includes a non-equal pitch wiring pattern as shown in FIG. 2 or FIG. 5.

In such a manner, all or a part of the thin metal wires of the wiring portion 16 (wiring portion 16a or 16b) on the upper side or the lower side of the conductive film are formed in the wiring pattern 25a or 25b including the non-equal pitch wiring pattern, and/or a plurality of thin metal wires of both wiring portions 16 are formed such that the combined wiring pattern 24 formed by overlapping the wiring patterns of both wiring portions 16 includes non-equal pitch wiring patterns such as the wiring pattern 25a or 25b. Thereby, it is possible to improve moiré visibility due to interference with the display such that the combined wiring pattern 24 formed by overlapping the wiring patterns of the both wiring portions 16 includes a non-equal pitch wiring pattern optimized in terms of moiré visibility. While the wiring patterns of both wiring portions 16 each are composed of a plurality of thin metal wires 14 having an equal pitch wiring pattern (for example, an equal pitch wiring pattern 25c shown in FIG. 12 described later), it is also possible to form the plurality of thin metal wires of both wiring portions 16 such that the combined wiring pattern 24 formed by overlapping the wiring patterns of both wiring portions 16 is a non-equal pitch wiring pattern optimized in terms of visibility of moiré.

Further, the first and second wiring portions 16a and 16b may be composed of pluralities of thin metal wires having different wiring patterns 24. For example, the first wiring portion 16a on the upper side of the transparent substrate 12 may be composed of a plurality of thin metal wires 14 having the wiring pattern 25a or 25b (hereinafter represented by 25a) including the non-equal pitch wiring pattern shown in FIG. 2 or 5 (hereinafter represented by FIG. 2). The second wiring portion 16b on the lower side of the transparent substrate 12 may be composed of a plurality of thin metal wires 14 having an equal pitch wiring pattern 25c shown in FIG. 12 to be described later. Alternatively, conversely, the first wiring portion 16a may be composed of a plurality of thin metal wires 14 having the equal pitch wiring pattern 25c shown in FIG. 12, and the second wiring portion 16b may be composed of a plurality of thin metal wires 14 having a wiring pattern 25a including a non-equal pitch wiring pattern. Such a combined wiring pattern formed by overlapping the wiring pattern 25a including the non-equal pitch wiring pattern and the equal pitch wiring pattern 25c also includes the non-equal pitch wiring pattern optimized in terms of visibility of moiré. Therefore, it is possible to improve moiré visibility due to the interference with the display by using this combined wiring pattern.

Figure 7:
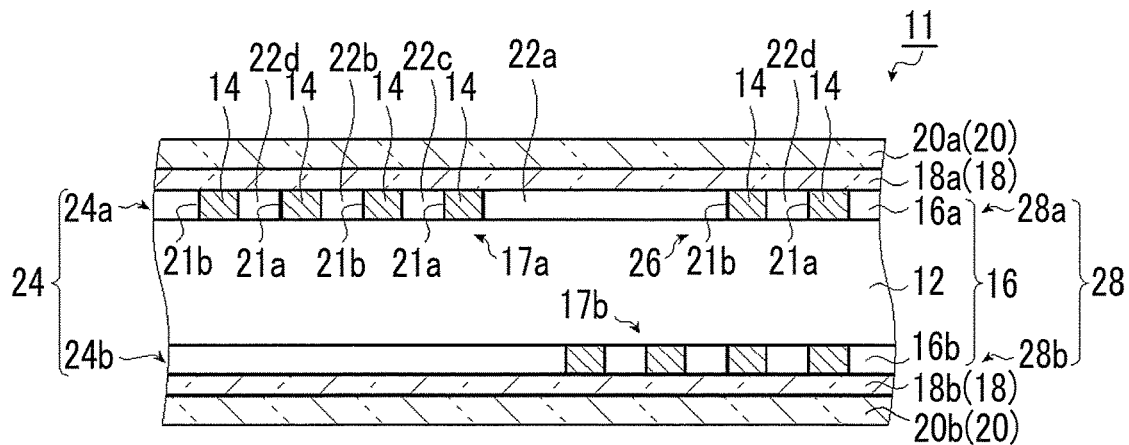
FIG. 7 is a schematic partial cross-sectional view of an example of a conductive film according to a second embodiment of the present invention.
Figure 12:
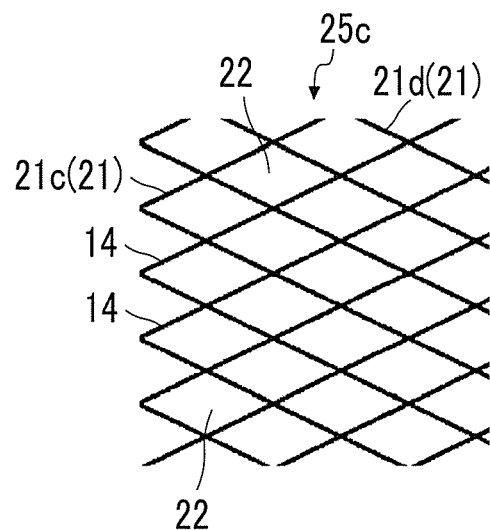
FIG. 12 is a plan view schematically showing a conventional mesh-shaped wiring pattern (transmittance pattern of the wiring).

In addition, as described above, the plurality of thin metal wires 14 of at least one of the first and second wiring portions 16a and 16b are divided into an electrode portion 17 (17a, 17b) and a dummy electrode portion (non-electrode portion) 26 forming the wiring layer 28 through disconnection (break) as shown in FIG. 7, and any one of the electrode portion 17 (17a, 17b) and the dummy electrode portion 26 is composed of a plurality of thin metal wires 14 having the wiring pattern 25a including the non-equal pitch wiring pattern shown in FIG. 2, and the other is composed of the plurality of thin metal wires 14 having the equal pitch wiring pattern 25c shown in FIG. 12. The conductive film 11 of the second embodiment having the above configuration may be used. Such a combined wiring pattern formed by combining the wiring pattern 25a including the non-equal pitch wiring pattern and the equal pitch wiring pattern 25c and overlapping the wiring pattern 25a or the wiring pattern 25c also include the non-equal pitch wiring pattern optimized in terms of visibility of moiré. Therefore, it is possible to improve moiré visibility due to the interference with the display by using this combined wiring pattern.

The structure of the conductive film 11 according to the second embodiment of the present invention shown in FIG. 7 will be described later.

As described above, the first protective layer 20a is adhered to the substantially entire surface of the wiring layer 28a being composed of the first wiring portion 16a through the first adhesive layer 18a so as to cover the thin metal wires 14 of the first wiring portion 16a. Further, the second protective layer 20b is adhered to the substantially entire surface of the wiring layer 28b being composed of the second wiring portion 16b through the second adhesive layer 18b so as to cover the thin metal wires 14 of the second wiring portion 16b.

In the above-described example, the first protective layer 20a is adhered to the wiring layer 28a by the first adhesive layer 18a, and the second protective layer 20b is adhered to the substantially entire surface of the wiring layer 28b by the second adhesive layer 18b. However, the present invention is not limited to this, and the protective layer does not necessarily need to be adhered to each other as long as the protective layer is able to cover and protect the thin metal wires of the wiring portion of the wiring layer, and the adhesive layer may be omitted. Further, in the embodiment of the present invention, the first protective layer 20a and/or the second protective layer 20b may be omitted.

Here, examples of materials of the adhesive layers 18 (the first adhesive layer 18a and the second adhesive layer 18b) include a wet lamination adhesive, a dry lamination adhesive, a hot melt adhesive, and the like. The material of the first adhesive layer 18a and the material of the second adhesive layer 18b may be the same or different.

Further, the protective layers 20 (the first protective layer 20a and the second protective layer 20b) each are composed of a high light transmitting material including resin, glass, and silicon, similarly to the transparent substrate 12. The material of the first protective layer 20a and the material of the second protective layer 20b may be the same or may be different.

It is preferable that both a refractive index n1 of the first protective layer 20a and a refractive index n2 of the second protective layer 20b are values equal or approximate to a refractive index n0 of the transparent substrate 12. In this case, both the relative refractive index nr1 of the transparent substrate 12 with respect to the first protective layer 20a and the relative refractive index nr2 of the transparent substrate 12 with respect to the second protective layer 20b are values approximate to 1.

In this specification, the refractive index means a refractive index for the light at a wavelength of 589.3 nm (sodium D ray). For example, in regard to resins, the refractive index is defined by ISO 14782: 1999 (corresponding to JIS K 7105) that is an international standard. Further, the relative refractive index nr1 of the transparent substrate 12 with respect to the first protective layer 20a is defined as nr1=(n1/n0), and the relative refractive index nr2 of the transparent substrate 12 with respect to the second protective layer 20b is defined as nr2=(n2/n0).

Here, the relative refractive index nr1 and the relative refractive index nr2 are preferably in a range equal to or greater than 0.86 and equal to or less than 1.15, and more preferably in a range equal to or greater than 0.91 and equal to or less than 1.08.

By limiting the ranges of the relative refractive index nr1 and the relative refractive index nr2 as the above-mentioned range and controlling a member-to-member light transmittance between the transparent substrate 12 and the protective layers 20 (20a, 20b), visibility of moiré can be further improved, and thus the conductive film can be improved.

In the conductive film 10 of the embodiment shown in FIG. 1, the wiring portions 16 (16a and 16b) on both the upper side and the lower side of the transparent substrate 12 each are formed as an electrode portion having the plurality of thin metal wires 14. However, the present invention is not limited to this, and at least one of the first or second wiring portion 16a or 16b may be composed of an electrode portion and a non-electrode portion (dummy electrode portion).

FIG. 7 is a schematic partial cross-sectional view of an example of a conductive film according to a second embodiment of the present invention. The plan view of the wiring patterns of the conductive film according to the second embodiment of the present invention shown in FIG. 7 is the same as the plan view of the wiring pattern shown in FIG. 2, 5, or 12, and accordingly, will be omitted herein.

As shown in FIG. 7, the conductive film 11 according to the second embodiment of the present invention has: the first wiring portion 16a that is composed of a first electrode portion 17a and the dummy electrode portion 26 which are formed on one surface (on the upper side in FIG. 7) of the transparent substrate 12; the second wiring portion 16b that is composed of the second electrode portion 17b which is formed on the other surface (on the lower side in FIG. 7) of the transparent substrate 12; the first protective layer 20a that is adhered to the substantially entire surface of the first wiring portion 16a, which is composed of the first electrode portion 17a and the dummy electrode portion 26, through the first adhesive layer 18a; and the second protective layer 20b that is adhered to the substantially entire surface of the second wiring portion 16b, which is composed of the second electrode portion 17b, through the second adhesive layer 18b.

In the conductive film 11, the first electrode portion 17a and the dummy electrode portion 26 each are composed of the plurality of thin metal wires 14 and both thereof are formed as the wiring layer 28a on one surface (on the upper side in FIG. 7) of the transparent substrate 12, and the second electrode portion 17b is composed of the plurality of thin metal wires 14 and is formed as the wiring layer 28b on the other surface (on the lower side in FIG. 7) of the transparent substrate 12. Here, the dummy electrode portion 26 is formed on one surface (on the upper side in FIG. 7) of the transparent substrate 12 similarly to the first electrode portion 17a, and is composed of the plurality of thin metal wires 14 similarly arranged at positions corresponding to the plurality of thin metal wires 14 of the second electrode portion 17b formed on the other surface (on the lower side in FIG. 7), as shown in the drawing.

The dummy electrode portion 26 is disposed to be spaced from the first electrode portion 17a by a predetermined interval, and is in the state of being electrically insulated from the first electrode portion 17a.

In the conductive film 11 according to the present embodiment, the dummy electrode portion 26 being composed of the plurality of thin metal wires 14 corresponding to the plurality of thin metal wires 14 of the second electrode portion 17b formed on the other surface (on the lower side in FIG. 7) of the transparent substrate 12 is formed on one surface (on the upper side in FIG. 7) of the transparent substrate 12. Therefore, scattering due to the thin metal wires on the one surface (on the upper side in FIG. 7) of the transparent substrate 12 can be controlled, and it is thus possible to improve visibility of electrode.

Here, the first electrode portion 17a and the dummy electrode portion 26 of the wiring layer 28a have the wiring pattern 24a having a mesh shape which is formed by the thin metal wires 14 and opening portions 22. The second electrode portion 17b of the wiring layer 28b has a wiring pattern 24b having a mesh shape which is formed by the thin metal wires 14 and opening portions 22, similarly to the first electrode portion 17a. As described above, the transparent substrate 12 is composed of an insulating material, and the second electrode portion 17b is in the state of being electrically insulated from the first electrode portion 17a and the dummy electrode portion 26.

In addition, the first and second electrode portions 17a and 17b and the dummy electrode portion 26 each can be composed of the same material as the wiring portions 16 of the conductive film 10 shown in FIG. 1 in the same manner.

The first protective layer 20a is adhered to the substantially entire surface of the wiring layer 28a being composed of the first electrode portion 17a and the dummy electrode portion 26 through the first adhesive layer 18a so as to cover the thin metal wires 14 of the first electrode portion 17a and the dummy electrode portion 26 of the first wiring portion 16a.

Further, the second protective layer 20b is adhered to the substantially entire surface of the wiring layer 28b being composed of the second electrode portion 17b through the second adhesive layer 18b so as to cover the thin metal wires 14 of the second electrode portion 17b of the second wiring portion 16b.

It should be noted that the first and second adhesive layers 18a and 18b and the first and second protective layers 20a and 20b of the conductive film 11 shown in FIG. 7 are those of the conductive film 10 shown in FIG. 1, and description thereof will be omitted. As described above, the first protective layer 20a, the second protective layer 20b, the first adhesive layer 18a, and the second adhesive layer 18b may be omitted.

In the conductive film 11 of the present embodiment, the second wiring portion 16b having the second electrode portion 17b does not have the dummy electrode portion. However, the present invention is not limited to this, and in the second wiring portion 16b, the dummy electrode portion, which is electrically insulated from the second electrode portion 17b to be spaced by a predetermined interval from the first electrode portion 17a and composed of the thin metal wires 14, may be disposed at a position corresponding to the first electrode portion 17a of the first wiring portion 16a.

In the conductive film 11 of the present embodiment, the dummy electrode portion is provided on the first wiring portion 16a, and such a dummy electrode portion is provided on the second wiring portion 16b. Thereby, the dummy electrode portions may be disposed to correspond to respective mesh wirings of the first electrode portion 17a of the first wiring portion 16a and the second electrode portion 17b of the second wiring portion 16b. Therefore, scattering due to the thin metal wires on the one surface (on the upper side or the lower side in FIG. 7) of the transparent substrate 12 can be controlled, and it is thus possible to improve visibility of electrode. It should be noted that the dummy electrode portion described herein corresponds to the non-conductive pattern described in WO2013/094729A.

In the conductive films 10 and 11 of the first and second embodiments shown in FIGS. 1 and 7, the wiring portions 16 (16a and 16b) are respectively formed on both the upper side and the lower side of the transparent substrate 12. However, the present invention is not limited to this, and in a manner similar to that of a conductive film 11A of a third embodiment of the present invention shown in FIG. 8A, the following structure may be adopted: the wiring portion 16 being composed of the plurality of thin metal wires 14 may be formed on one surface (the upper surface in FIG. 8A) of the transparent substrate 12, and two conductive film elements, in which the protective layers 20 are adhered to substantially the entire surfaces of the wiring portions 16 through the adhesive layers 18 so as to cover the thin metal wires 14, overlap with each other.

Figure 8A:
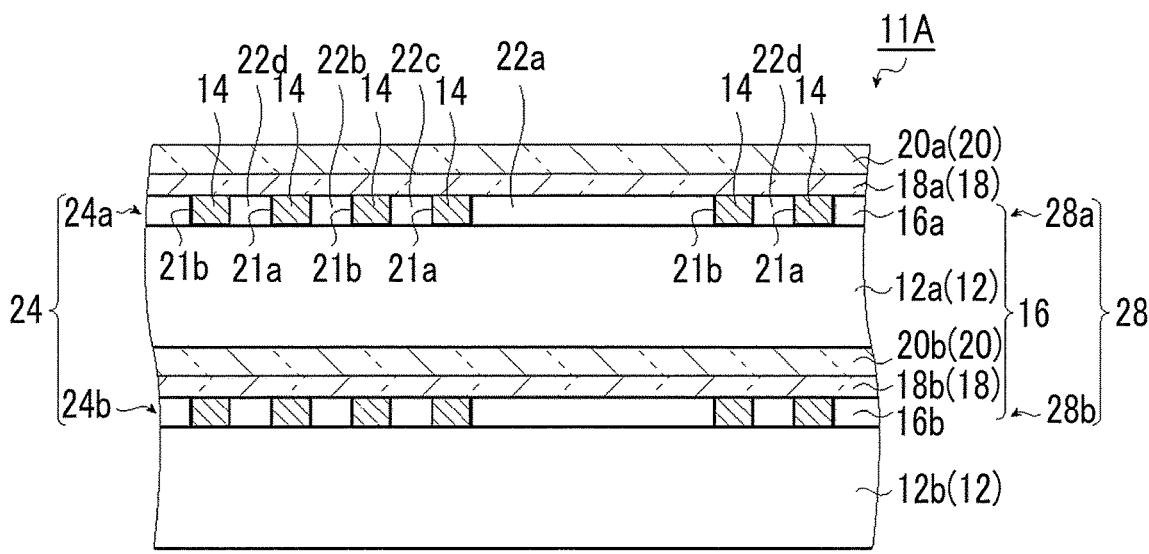
FIG. 8A is a schematic partial cross-sectional view of an example of a conductive film according to a third embodiment of the present invention.

The conductive film 11A of the third embodiment of the present invention shown in FIG. 8A has: a lower transparent substrate 12b in FIG. 8A; the second wiring portion 16b that is composed of the plurality of thin metal wires 14 formed on the upper surface of the transparent substrate 12b; the second protective layer 20b that is adhered onto the second wiring portion 16b through the second adhesive layer 18b; an upper transparent substrate 12a that is adhered onto and disposed on the second protective layer 20b through for example an adhesive or the like; the first wiring portion 16a that is composed of the plurality of thin metal wires 14 formed on the upper surface of the transparent substrate 12a; and the first protective layer 20a that is adhered onto the first wiring portion 16a through the first adhesive layer 18a.

Here, the entirety or a part of at least one of the thin metal wires 14 of the first wiring portion 16a and/or second wiring portion 16b is the wiring pattern including the non-equal pitch wiring pattern shown in FIG. 2. Alternatively, the combined wiring pattern obtained by overlapping the wiring pattern of the first wiring portion 16a and the wiring pattern of the second wiring portion 16b is a wiring pattern including the non-equal pitch wiring pattern shown in FIG. 2.

In the conductive films 10 and 11 of the first and second embodiments shown in FIGS. 1 and 7, the wiring portions 16 (16a and 16b) are respectively formed on both the upper side and the lower side of the transparent substrate 12. However, the present invention is not limited to this, and in a manner similar to that of a conductive film 11B of a fourth embodiment of the present invention shown in FIG. 8B, the following structure may be adopted: the wiring portion 16 being composed of the plurality of thin metal wires 14 may be formed on one surface (the upper surface in FIG. 8B) of the transparent substrate 12, and only one conductive film element, in which the protective layers 20 are adhered to substantially the entire surfaces of the wiring portions 16 through the adhesive layers 18 so as to cover the thin metal wires 14, is provided.

Figure 8B:
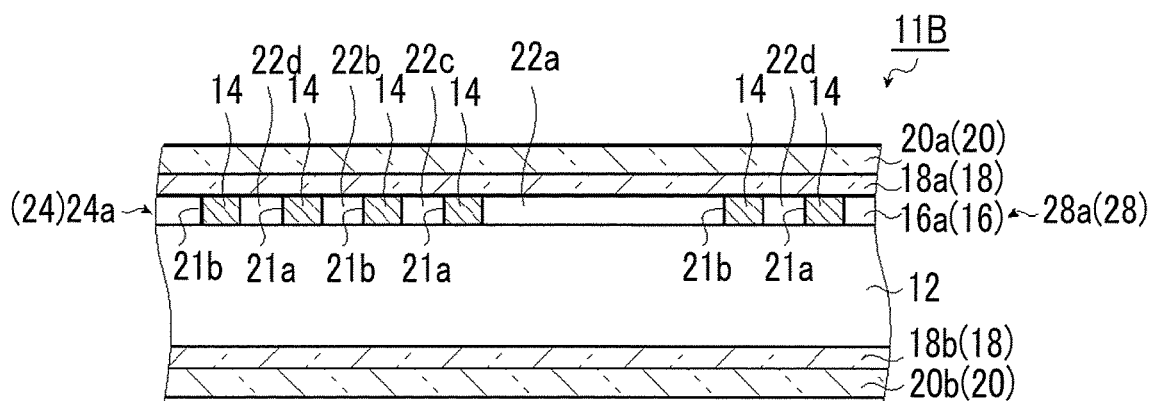
FIG. 8B is a schematic partial cross-sectional view of an example of a conductive film according to a fourth embodiment of the present invention.

The conductive film 11B of the fourth embodiment of the present invention shown in FIG. 8B includes a transparent substrate 12, a first wiring portion 16a being composed of a plurality of thin metal wires 14 formed on the upper surface of the transparent substrate 12, a first protective layer 20a adhered onto the first wiring portion 16a through a first adhesive layer 18a, and a second protective layer 20b adhered to the substantially entire lower surface of the transparent substrate 12 through a second adhesive layer 18h. At this time, the adhesive layer 18 and the protective layer 20 on the lower surface of the transparent substrate 12 may be omitted.

Here, all or a part of the thin metal wires 14 of the wiring portion 16a have a wiring pattern including the non-equal pitch wiring pattern shown in FIG. 2.

Figure 9:
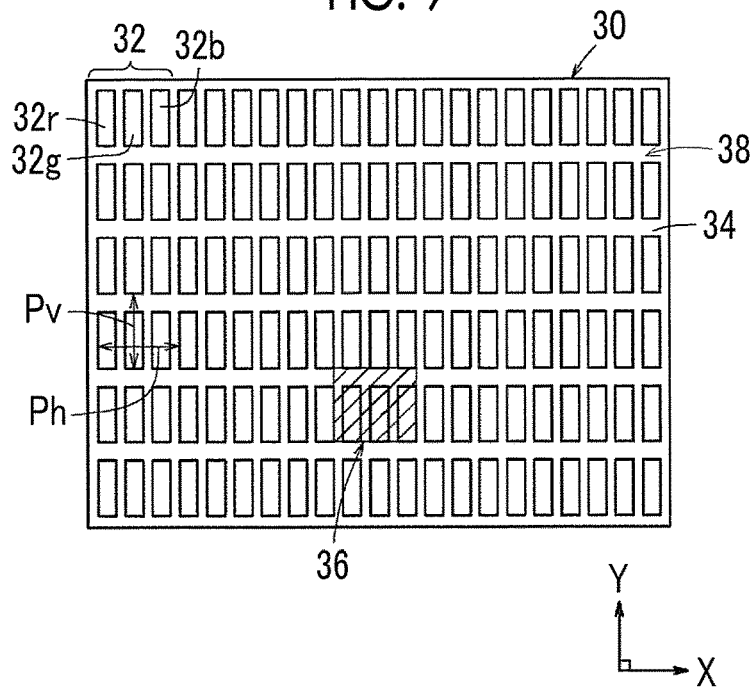
FIG. 9 is a schematic explanatory diagram showing an example of a pixel array pattern of a part of the display unit to which the conductive film according to the embodiment of the present invention is applied.

The conductive films 10, 11, 11A, and 11B of the first, second, third, and fourth embodiments of the present invention described above each are, for example, a conductive film in which a wiring pattern optimized in terms of moiré visibility with respect to the pixel array (BM) pattern of the display is included in a wiring pattern of thin metal wires of all or a part of a wiring portion on the upper side or the lower side of the conductive film applied to a touch panel (44: refer to FIG. 10) of a display unit 30 (display) schematically shown in FIG. 9 and/or a combined wiring pattern formed by overlapping wiring patterns of both wiring portions.

The optimization of moiré visibility of the wiring pattern with respect to the pixel array pattern of the display, which is essential in the embodiment of the present invention, will be described later.

The conductive film according to the embodiment of the present invention basically has the above-mentioned configuration.

FIG. 9 is a schematic explanatory diagram schematically showing an example of a pixel array pattern of a part of the display unit using the conductive film of the embodiment of the present invention.

As the part thereof is shown in FIG. 9, the display unit 30 has a plurality of pixels 32 arranged in a matrix shape to constitute a predetermined pixel array pattern. Each pixel 32 has a configuration in which three sub-pixels (a red sub-pixel 32r, a green sub-pixel 32g, and a blue sub-pixel 32b) are arranged in a horizontal direction. Each sub-pixel has a quadrilateral shape which is long in the vertical direction. The arrangement pitch (horizontal pixel pitch Ph) of the pixels 32 in the horizontal direction and the arrangement pitch (vertical pixel pitch Pv) of the pixels 32 in the vertical direction are approximately equal to each other. That is, a shape (refer to a region 36 indicated by hatching), which is composed of a single pixel 32 and a black matrix (BM) 34 (pattern material) surrounding the single pixel 32, is a square shape. Further, in the example of FIG. 9, an aspect ratio of the single pixel 32 is not 1, and satisfies the following expression: a length thereof in the horizontal (transverse) direction>a length thereof in the vertical (longitudinal) direction.

As clearly seen from FIG. 9, a pixel array pattern formed by sub-pixels 32r, 32g, and 32b of a plurality of pixels 32 is defined by a BM pattern 38 of the BMs 34 each of which surrounds the sub-pixels 32r, 32g, and 32b. Moiré, which occurs in a case where the display unit 30 and the conductive film 10, 11, 11A, or 11B are overlapped, is caused by interference between the pixel array pattern of each of the sub-pixels 32r, 32g, and 32b, which is defined by the BM pattern 38 of the BMs 34 of the display unit 30, and the wiring pattern 24 of the conductive film 10, 11, 11A, or 11B.

For example, in a case where the conductive film 10, 11, 11A, or 11B is disposed on the display panel of the display unit 30 having the pixel array pattern of each of the sub-pixels 32r, 32g, and 32b described above, the wiring pattern 24 of the conductive film 10, 11, 11A, or 11B (combined wiring pattern of the wiring patterns 24a and 24b) includes at least one of the wiring pattern 24a or 24b, and/or the combined wiring pattern 24 includes a non-equal pitch wiring pattern, and is optimized in terms of moiré visibility with respect to the pixel array pattern of each of the sub-pixels 32r, 32g, and 32b. Therefore, there is no interference of the spatial frequency between the pixel array pattern of each of the sub-pixels 32r, 32g, and 32b, and the wiring pattern of the thin metal wires 14 of the conductive films 10, 11, 11A, or 11B, and the occurrence of moiré is restrained. As a result, visibility of the moiré is excellent. Hereinafter, the conductive film 10 will be described as a representative example, but the description is the same as those of the conductive film 11, 11A, or 11B.

It should be noted that the display unit 30 shown in FIG. 9 may be formed as a display panel such as a liquid crystal panel, a plasma panel, an organic EL panel, or an inorganic EL panel, and a light emission intensity thereof may be different in accordance with a resolution.

The pixel array pattern and the light emission intensity of the display, which can be applied to the embodiment of the present invention, is not particularly limited, and may be the same as the pixel array pattern and the light emission intensity of a known display. For example, a display such as OLED having different periods and/or intensities of the respective colors of RGB may be used. A display, which is composed of RGB sub-pixels having the same shapes as shown in FIG. 9 and in which an intensity variation of the sub-pixels is large, or a display, in which an intensity variation of the sub-pixels is small and only a G sub-pixel (channel) having a highest intensity is considered, may be used. In particular, a display such as a smartphone or a tablet having a high intensity may be used. As a pixel pattern of OELD, for example, there is a pen-tile array disclosed in JP2018-198198A. The display of the display device into the conductive film of the embodiment of the present invention is incorporated may be a pen-tile array OELD.

Figure 10:
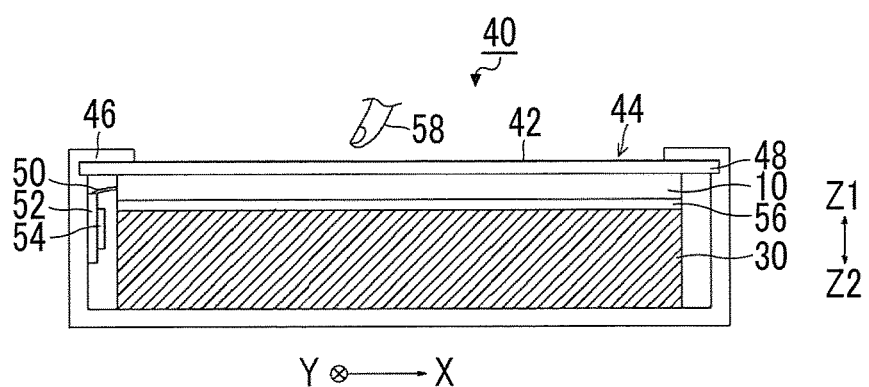
FIG. 10 is a schematic cross-sectional view of one example of a display device provided with the conductive film shown in FIG. 1.

Next, a display device, in which the conductive film according to the embodiment of the present invention is incorporated, will be described in FIG. 10. In FIG. 10, a projected electrostatic capacitive type touch panel, in which the conductive film 10 according to the first embodiment of the present invention is incorporated, will be described as a representative example of a display device 40, but it is needless to say that the present invention is not limited to this example.

As shown in FIG. 10, the display device 40 includes the display unit 30 (refer to FIG. 9) that can display a color image and/or a monochrome image, a touch panel 44 that detects a contact position on an input side 42 (located on the side as directed by the arrow Z1), and a housing 46 in which the display unit 30 and the touch panel 44 are housed. A user is able to access the touch panel 44 through a large opening portion provided in one surface (on the side as directed by the arrow Z1) of the housing 46.

The touch panel 44 includes not only the conductive film 10 (refer to FIGS. 1 and 2) described above but also a cover member 48 stacked on one surface (on the side as directed by the arrow Z1) of the conductive film 10, a flexible substrate 52 electrically connected to the conductive film 10 through a cable 50, and a detection control unit 54 disposed on the flexible substrate 52.

The conductive film 10 is adhered to one surface (on the side as directed by the arrow Z1) of the display unit 30 through an adhesive layer 56. The conductive film 10 is disposed on the display screen such that the other main surface side (second wiring portion 16b side) is opposite to the display unit 30.

The cover member 48 functions as the input side 42 by covering one surface of the conductive film 10. In addition, by preventing a contact body 58 (for example, a finger or a stylus pen) from coming into direct contact with the conductive film 10, it is possible to restrain the occurrence of a scratch, adhesion of dust, and/or the like, and thus it is possible to stabilize conductivity of the conductive film 10.

The material of the cover member 48 may be, for example, glass, a tempered glass, or a resin film. One surface (on the side as directed by the arrow Z2) of the cover member 48 may be coated with silicon oxide or the like, and may be adhered to one surface (on the side as directed by the arrow Z1) of the conductive film 10. Further, in order to prevent damage due to rubbing or the like, the conductive film 10 and the cover member 48 may be configured to be adhered to each other.

The flexible substrate 52 is an electronic substrate having flexibility. In the example shown in this diagram, the flexible substrate 52 is fixed to an inner side wall of the housing 46, while the position of the substrate may be varied. The detection control unit 54 constitutes an electronic circuit that catches a change in capacitance between the contact body 58 and the conductive film 10 and detects the contact position (or the approach position) in a case where the contact body 58 as a conductor is brought into contact with (or comes closer to) the input side 42.

The display device, to which the conductive film according to the embodiment of the present invention is applied, basically has the above-mentioned configuration.

Next, the following configuration in the embodiment of the present invention will be described. In a wiring pattern in which straight line wirings in two or more directions are overlapped, repetitive pitches of a predetermined number of wirings are equal pitches on the basis of the frequency information of the pixel array pattern in at least one direction, and respective pitches of the predetermined number of wirings are non-equal pitches. Thereby, the wiring pattern is configured as a wiring pattern in which moiré less occurs compared to the equal pitch wiring pattern in that direction. In the following description, the wiring pattern in which all the line wirings overlapped in two or more directions are straight line wirings is described as a representative example. However, as described above, as long as the line wiring in at least one direction among the line wirings overlapped in two or more directions is a straight line wiring, in the straight line wiring of the embodiment of the present invention, "the repetitive pitches of the predetermined number of wirings are equal pitches, and respective pitches of the predetermined number of wirings are non-equal pitches", whereby the straight line wiring pattern is a wiring pattern in which moiré less occurs compared to the equal pitch wiring pattern.

First, the principle of moiré occurrence in a case where the pixel array pattern and the wiring pattern are overlapped will be described. Next, on the basis of the principle, description will be given of a reason for the following: "the repetitive pitches of the predetermined number of wirings are equal pitches, and respective pitches of the predetermined number of wirings are non-equal pitches", whereby it is possible to reduce moiré compared to the equal pitch wiring pattern.

(Principle of Moiré in Case where Pixel Array Pattern and Wiring Pattern are Overlapped)

The following is considered 1-dimensionally for convenience of description.

First, the light emission luminance pattern of the pixel array is set to $bm(x)$. Here, $bm(x)$ represents a luminance at a position x. The Fourier series expansion of $bm(x)$ can be expressed as Expression (3). Here, the symbol "*" represents multiplication. Further, $bm(x)$ is a periodic function having a period of $2*Lb$, and $\omega 1, \omega 2, \omega 3, \ldots$ represent $\pi/Lb$, $2*\pi/Lb$, $3*\pi/Lb$, ... respectively.

$$bm(x)=A0+(a1*\cos(\omega 1*x)+b1*\sin(\omega 1*x)+a2*\cos(\omega 2*x)+b2*\sin(\omega 2*x)) \qquad (3)$$

From Euler's formula, $\cos(\omega n*x)$ and $\sin(\omega n*x)$ can be represented by complex numbers as follows, respectively. Here, i represents an imaginary unit.

$$\cos(\omega n*x)=(\exp(i*\omega n*x)+\exp(-i*\omega n*x))/2$$

$$\sin(\omega n*x)=(\exp(i*\omega n*x)-\exp(i*\omega n*x))/(2*i)$$

Therefore, from Expression (3), Expression (4) is obtained.

$$bm(x)=A0+(((a1-i*b1)/2)*\exp(i*\omega 1*x)+((a1+i*b1)/2)*\exp(-i*\omega 1*x)) \qquad (4)$$

Thus, Expression (4) can be expressed by a complex number as Expression (5).

$$bm(x)=A0+\Sigma(An*\exp(i*\omega n*x)+Bn*\exp(-i*\omega n*x)) \qquad (5)$$

Here, An and Bn are complex numbers and have a conjugate relation as follows.

$$An=(an-i*bn)/2$$

$$Bn=(an+i*bn)/2$$

Similarly, in a case where the transmittance pattern of the wiring is $mesh(x)$ and $mesh(x)$ is expressed by a Fourier series of complex numbers, $mesh(x)$ can be represented by Expression (6).

$$mesh(x)=C0+\Sigma(Cm*\exp(i*\beta m*x)+Dm*\exp(-i*\beta m*x)) \qquad (6)$$

Here, assuming that $mesh(x)$ is a periodic function having a period of $2*Lm$, $\beta(m)$ represents $m*\pi/Lm$. Further, Cm and Dm are complex numbers and have a conjugate relation as follows.

$$Cm=(cm-i*dm)/2$$

$$Dm=(cm+i*dm)/2$$

The pattern in which the pixel array pattern and the wiring pattern are overlapped is a product of the above-described light emission luminance pattern (5) of the pixel array and the transmittance pattern (6) of the wiring. Therefore, the product can be expressed as follows.

$$bm(x)*mesh(x)=A0*C0+C0*(\Sigma(An*\exp(i*\beta m*x)+Bn*\exp(-i*\omega n*x)))+A0*(\Sigma(Cm*\exp(i*(m*x)+Dm*\exp(-i*\beta m*x)))+\Sigma\Sigma(An*\exp(i*\omega n*x)+Bn*\exp(-i*\omega n*x))*(Cm*\exp(i*\beta m*x)+Dm*\exp(-i*\beta m*x)) \qquad (7)$$

In Expression (7), $A0*C0$ in the first row indicates the average luminance of the overlapped pattern, the second row indicates each frequency component of the luminance pattern of the pixel array multiplied by the average transmittance C0 of the wiring pattern, and the third row indicates each frequency component of the wiring pattern multiplied by the average luminance A0 of the pixel array pattern.

The moiré of the overlapped pattern is given by the expression on the fourth row. In a case where the expression on the fourth row is expanded for one combination of n and m, the expression be represented by Expression (8).

$$(An^* \exp(i^* \omega n^* x) + Bn^* \exp(-i^* \omega n^* x))^* (Cm^* \exp(i^* \beta m^* x) + Dm^* \exp(-i^* \beta m^* x)) = An^* Cm^* \exp(i^* (\omega n^* x + \beta m^* x)) + Bn^* Dm^* \exp(-i^* (\omega n^* x + \beta m^* x)) + An^* Dm^* \exp(i^* (\omega n^* x - \beta m^* x)) + Bn^* Cm^* \exp(-i^* (\omega n^* x - \beta m^* x)) \quad (8)$$

Here, considering that An and Bn have a conjugate relation and Cm and Dm also have a conjugate relation, it can be seen that An*Cm and Bn*Dm, and An*Dm and Bn*Cm in the above expression have conjugate relations.

In addition, it can be seen that An*Cm*exp(i*(ωn*x+βm*x)) and Bn*Dm*exp(−i*(ωn*x+(m*x)), and An*Dm*exp(i*(ωn*x−βm*x)) and Bn*Cm*exp(−i*(ωn*x−βm*x)) in the above expression also have conjugate relations.

Here, An*Cm and Bn*Dm can be expressed as follows.

$$An^*Cm = \mathrm{ABS}(An^*Cm)^* \exp(i^*\theta 1)$$

$$Bn^*Dm = \mathrm{ABS}(An^*Cm)^* \exp(-i^*\theta 1)$$

Then, An*Cm*exp(i*(ωn*x+βm*x))+Bn*Dm*exp(−i*(m*x+βm*x)) in Expression (8) is 2*ABS(An*Cm)*cos(ωn*x+(m*x+θ1), which can be represented only by real numbers. Here, ABS(An*Cm) represents the absolute value of the complex number An*Cm.

Similarly, An*Dm*exp(i*(ωn*x−βm*x))+Bn*Cm*exp(−i*(ωn*x−βm*x)) in Expression (8) is 2*ABS(An*Dm)*cos(ωn*x−βm*x+θ2), which can be represented only by real numbers.

After all, in a case where the expression on the fourth row of Expression (7) is expanded for one combination of n and m, Expression (9) is obtained.

$$2^* \mathrm{ABS}(An^*C)^* \cos(\omega n^* x + \beta m^* x + \theta 1) + 2^* \mathrm{ABS}(An^*Dm)^* \cos(\omega n^* x - \beta m^* x + \theta 2) \quad (9)$$

In a case where the pixel array pattern and the wiring pattern are overlapped (that is, multiplied) from Expression (9), it can be seen that moiré with the intensity of 2*ABS(An*Cm)=2*ABS(An)*ABS(Cm) occurs at a frequency ωn+βm of the sum of the respective frequencies ωn and βm, and moiré with the intensity 2*ABS(An*Dm)=2*ABS(An)*ABS(Dm) occurs at a difference frequency ωn−βm. Here, ABS(Cm) and ABS(Dm) both have the same value of the intensity of the frequency βm of the wiring pattern.

It should be noted that ABS(An), ABS(Bn), ABS(Cm), and ABS(Dm) respectively are intensities in the complex Fourier series, as can be seen from the above description, and thus becomes ½ of intensities in the Real Fourier series (the reason for this is that in a complex Fourier series, the intensity is separated into two complex numbers having a conjugate relation).

In addition, in the 1-dimensional frequency distribution of the pattern obtained by overlapping (multiplying) the pixel array pattern and the wiring pattern from Expression (8), it can be seen that the moiré components occur at frequencies to which frequencies ωn and βm are added. Coefficients of the moiré components are multiplication values (complex numbers) of the coefficients An and Bn of the components of the frequencies ωn in the 1-dimensional frequency distribution of the pixel array pattern and the coefficients Cm and Dm of the components of the frequencies βm in the 1-dimensional frequency distribution of the wiring pattern.

Here, it is assumed that the frequency of the coefficient Bn is −ωn and the frequency of the coefficient Dm is −βm. Among these moiré s, the problematic moiré is a moiré having a frequency ωn−βm and −(ωn−βm)). The reason for this is that since the human's visual response characteristics are sensitive to low-frequency patterns, even in a case where the respective patterns ωn and βm of the pixel array pattern and the wiring pattern are not visible, the moiré with the frequency ωn−βm is at a low frequency and is likely to be visible.

In order to make understanding of the description easier, the luminance pattern of the pixel array and the transmittance pattern of the wiring are hitherto considered 1-dimensionally. In reality, both patterns are 2-dimensional, but in the case of two dimensions, not only the frequency in the x direction but also the frequency in the y direction may be taken into consideration, and an expression expressing moiré can be derived in the same manner. In conclusion, in the case of two dimensions, the moiré of the intensity of the product of the respective intensities of the difference frequency and the sum frequency of the frequency components in the x direction and the y direction of the luminance pattern of the pixel array and the transmittance pattern of the wiring occurs.

Figure 11:
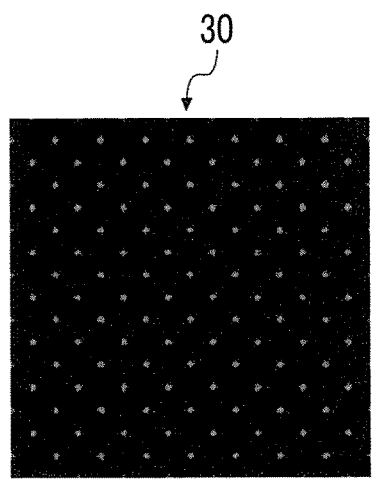
FIG. 11 is a plan view schematically showing an example of a luminance pattern of a pixel array of the display unit shown in FIG. 9.

Next, a specific example will be described. FIG. 11 schematically shows an example of the luminance pattern of the pixel array of any of the sub-pixels 32r, 32g, and 32b of the display unit 30 shown in FIG. 9. In addition, FIG. 12 schematically shows an equal pitch wiring pattern (that is, a transmittance pattern of the wiring) 25c.

Figure 6:
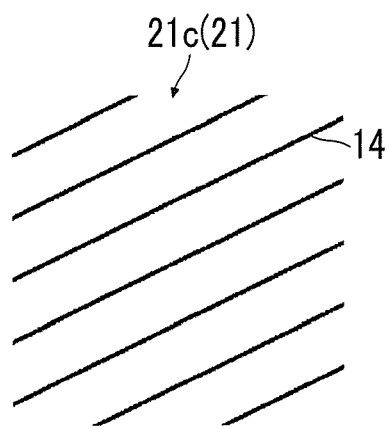
FIG. 6 is a plan view schematically showing an equal pitch wiring pattern in a straight line wiring of the wiring pattern in another direction shown in FIG. 5.
Figure 13:
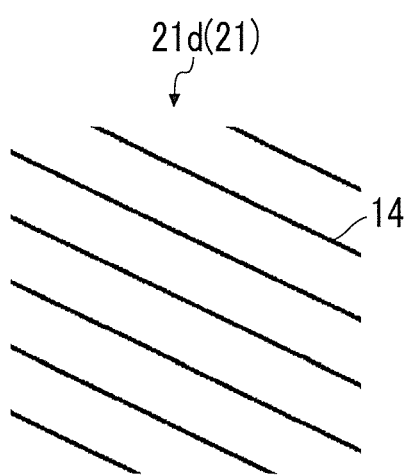
FIG. 13 is a plan view schematically showing an equal pitch wiring pattern in a straight line wiring of the wiring pattern in one direction shown in FIG. 12.

Here, for example, a shape of the opening portion 22 of the wiring pattern 25c shown in FIG. 12 is a rhomboid, and in FIG. 12, an angle formed with the x direction is 26°, and a pitch is 101 μm. In a case where the shape of the opening portion 22 of the wiring pattern 25 is a rhomboid, the shape can be represented by overlapping the wiring patterns of straight line wirings in two directions. FIG. 13 shows a straight line wiring 21d in the right direction (extending in the left (up) direction and arranged in the right (up) direction) of the two directions. It should be noted that FIG. 6 shows a straight line wiring 21c in the left direction (extending in the right (up) direction and arranged in the left (up) direction) of the two directions. Here, the "direction" of the straight line wiring is a direction in which the straight line wirings are arranged, and means a direction vertical to the straight line.

Figure 14:
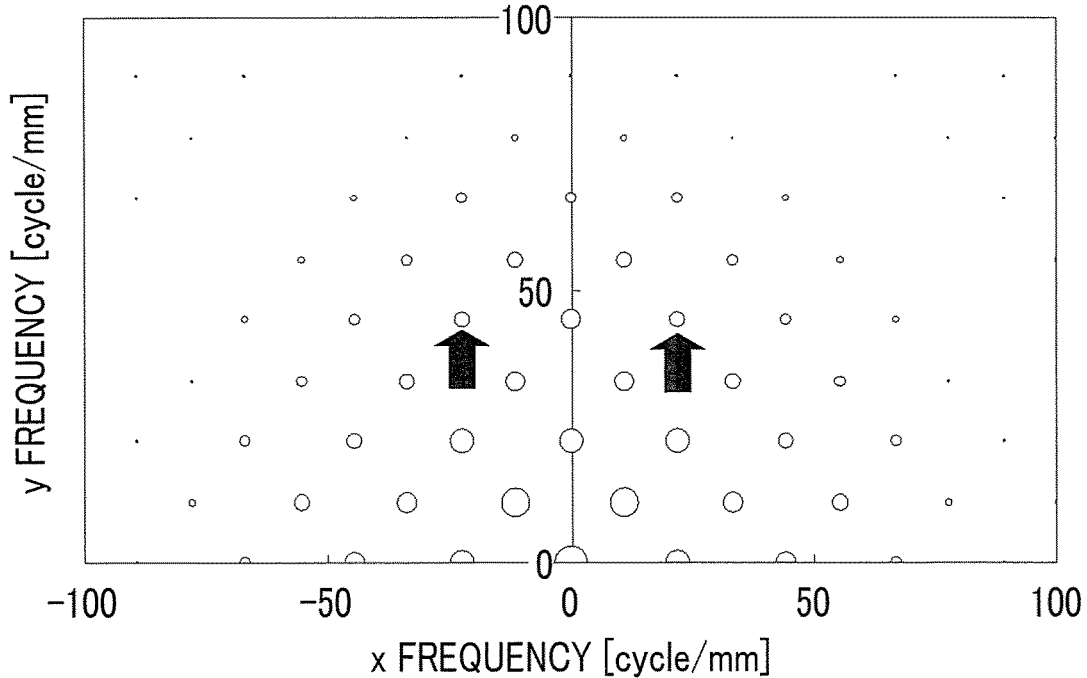
FIG. 14 is a diagram of a 2-dimensional frequency distribution of the pixel array pattern shown in FIG. 11.
Figure 15:
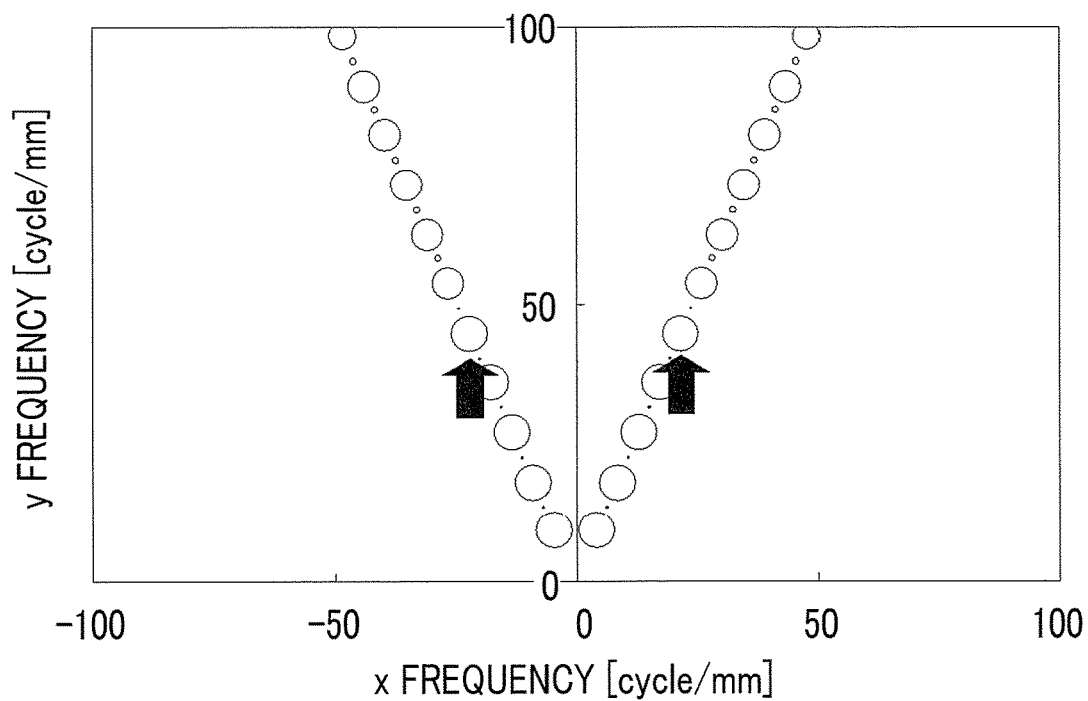
FIG. 15 is a diagram showing a 2-dimensional frequency distribution of the wiring pattern shown in FIG. 12.

Further, FIG. 14 is a 2-dimensional frequency distribution of the pixel array pattern of FIG. 11 (that is, the luminance pattern of the pixel array), where the intensity of each frequency component is indicated by the area of the circle. FIG. 15 is a 2-dimensional frequency distribution of the wiring pattern 25c of FIG. 12, where the intensity of each frequency component is indicated by the area of the circle. It should be noted that the 2-dimensional frequency distributions of FIGS. 14 and 15 each show only the first quadrant and the second quadrant. The frequency components in the first quadrant of FIG. 15 represent the frequency components in the straight line wiring 21d in the right direction in FIG. 12, and the frequency components in the second quadrant of FIG. 15 represent the frequency components in the straight line wiring 21c in the left direction in FIG. 12.

Figure 64:
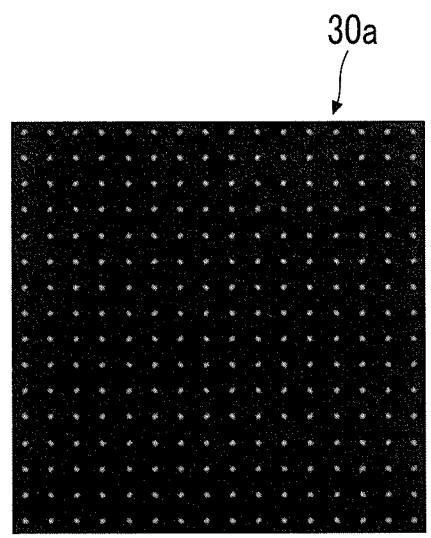
FIG. 64 is a plan view schematically showing another example of the luminance pattern of the pixel array of the display unit to which the conductive film according to the embodiment of the present invention is applied.
Figure 65:
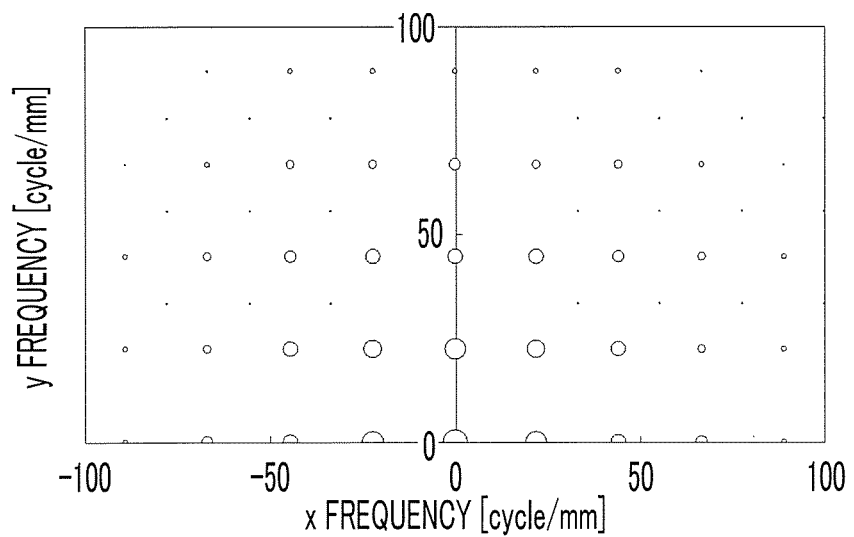
FIG. 65 is a diagram of a 2-dimensional frequency distribution of the pixel array pattern shown in FIG. 64.

It should be noted that, In the embodiment of the present invention, as a display unit, it is possible to use a display unit of a display having different pixel array patterns for at least two colors of red (R), green (G), and blue (B), as in an organic EL display (OELD). FIG. 64 schematically shows another example of the luminance pattern of any pixel array of the sub-pixels RGB of the display unit 30*a* of such an organic EL display (OELD). Further, FIG. 65 is a 2-dimensional frequency distribution of the pixel array pattern of FIG. 64 (that is, the luminance pattern of the pixel array), where the intensity of each frequency component is indicated by the area of the circle. Here, FIG. 64 shows a pixel array pattern corresponding to FIG. 11, and FIG. 65 shows a 2-dimensional frequency distribution corresponding to FIG. 14.

Figure 16:
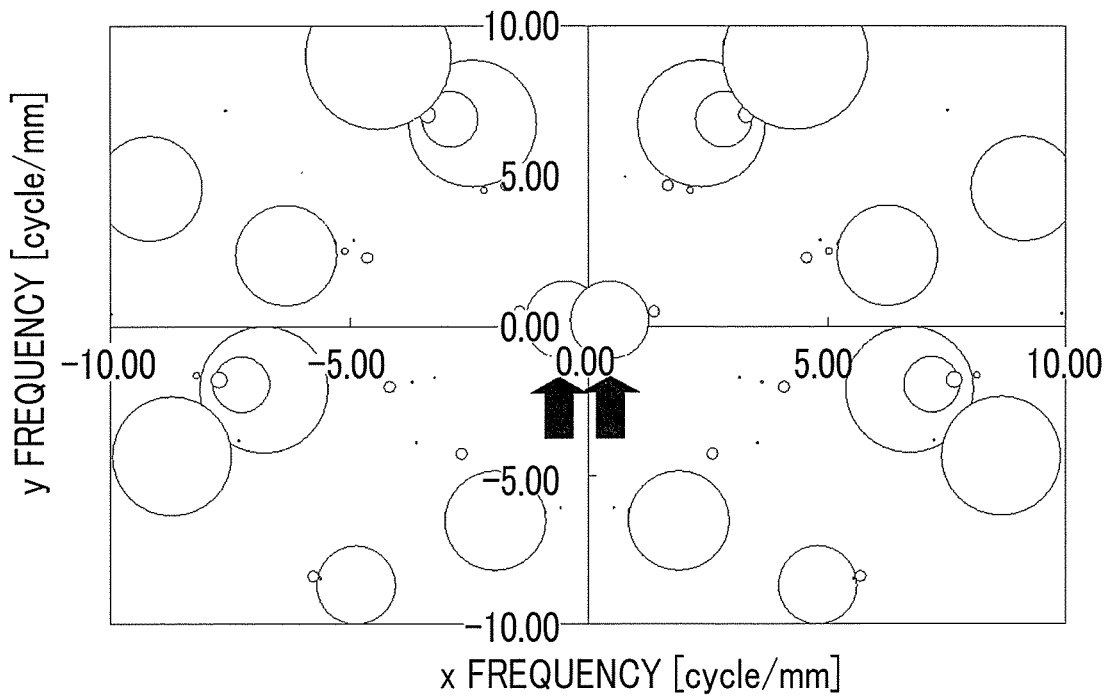
FIG. 16 is a diagram in which moiré components calculated from frequency components of the pixel array pattern shown in FIG. 14 and frequency components of the wiring pattern shown in FIG. 15 are plotted.

FIG. 16 is a diagram in which a multiplication value of each intensity is plotted at the difference frequency obtained by calculating a difference between moiré components, that is, a difference between frequencies, which are calculated from each frequency component of the pixel array pattern shown in FIG. 14 and each frequency component of the wiring pattern 25*c* shown in FIG. 15. Here, FIG. 16 differs from FIG. 14 and FIG. 15 in the scale range of the x frequency and the y frequency, and also there is a difference in the relationship between the area of the circle of each component and the intensity.

Here, as can be seen from Expression (8), in order to accurately derive the moiré component, it is necessary for all frequency components of the pixel array pattern (including components of the conjugate relation) and all frequency components of the wiring to be multiplied by the coefficients (complex numbers) of the components and to be plotted on the frequency of the sum of the frequencies of the components (the sum with the negative frequencies corresponds to the above difference calculation). However, description thereof will be omitted for simplification of description. FIG. 16 is a diagram in which moiré s of components are plotted. The components include components in a region in which the y frequency is 0 or less in the 2-dimensional frequency distribution of the pixel array pattern and components obtained by excluding components of the frequency 0 from a region in which the y frequency is 0 or more in the region of the 2-dimensional frequency distribution of the wiring pattern.

Here, as can be seen from Expression (7), the pattern, in which the pixel array pattern and the wiring pattern are overlapped, includes, in addition to the moiré given by the expression in the fourth row of Expression (7), "the frequency components of the wiring pattern multiplied by the average luminance of the pixel array pattern" given by the third row of Expression (7). In FIG. 16, these components are also included. Specifically, the component of the frequency 0 of the pixel array pattern (corresponding to A0 in Expression (7)) is multiplied by the components of the wirings, and the multiplication values are plotted on the sum of the frequencies of the component of the frequency 0 and the components of the wirings, that is, in the frequencies of the components of the wirings.

The pattern obtained by overlapping the pixel array pattern and the wiring pattern includes "each frequency component of the luminance pattern of the pixel array multiplied by the average transmittance of the wiring pattern" given in the second row of Expression (7). However, in FIG. 16, this component is not included. Specifically, in a case where the multiplication values of the frequency components of the pixel array pattern and the frequency components of the wiring pattern are plotted on the frequency of the sum of the frequencies of the respective components, the component of the frequency 0 of the wiring pattern (corresponding to C0 in Expression (7)) is excluded. In the plot of FIG. 16, the phase information of each moiré component is not necessary and only the intensity thereof may be derived therefrom. Therefore, the intensity can be easily derived from each frequency component of the pixel array pattern of FIG. 14 and each frequency component of the wiring pattern of FIG. 15. That is, the difference between each frequency component of the wiring pattern of FIG. 15 and the frequency of each frequency component of the pixel array pattern of FIG. 14 is simply calculated, and the multiplication values of the intensities of the components are plotted on the frequencies of the differences.

Here, as described above, the plot of FIG. 16 includes "each frequency component of the wiring pattern multiplied by the average luminance of the pixel array pattern". Therefore, the frequency distribution of the pixel array pattern of FIG. 14 includes the frequency distribution of the component of the frequency 0 (corresponding to A0 in Expression (7)), and does not include "each frequency component of the pixel array pattern multiplied by the average transmittance of the wiring pattern". As a result, the frequency distribution of the wiring pattern of FIG. 15 does not include the component of the frequency 0 (corresponding to C0 in Expression (7)). In the embodiment of the present invention, not only FIG. 16 but also any moiré component diagrams in the following description include "each frequency component of the wiring pattern multiplied by the average luminance of the pixel array pattern", and does not include "each frequency component of the pixel array pattern multiplied by the average transmittance of the wiring pattern".

The human eye's visual response characteristics are sensitive to low frequencies, that is, only the low-frequency components of the moiré components in FIG. 16 are visible to the human eye.

Figure 17:
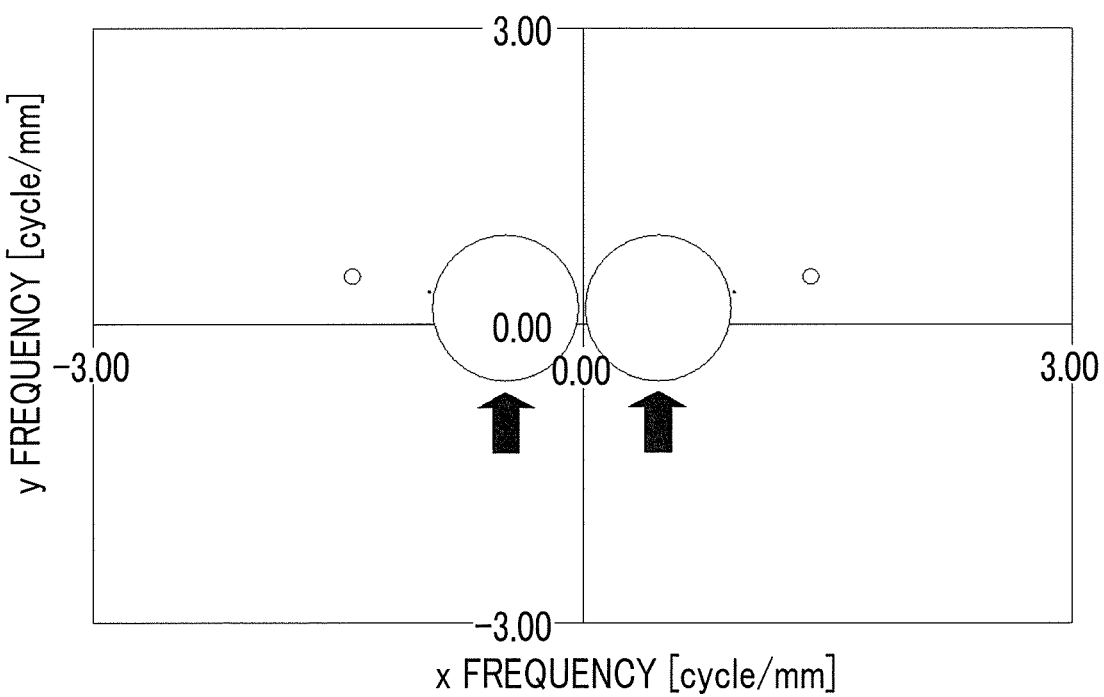
FIG. 17 is a diagram showing a result of multiplying each moiré component shown in FIG. 16 by the sensitivity of the human eye's visual characteristics.

FIG. 17 shows a result of multiplying each moiré component shown in FIG. 16 by the sensitivity of the human eye's visual response characteristics. Here, FIG. 17 differs from FIG. 16 in the scale range of the x frequency and the y frequency. In addition, the intensity indicated by the area of the circle of each component is different, and each component is plotted as a circle having a larger area in FIG. 17. In the embodiment of the present invention, as the sensitivity of the human eye's visual response characteristics, the Dooley-Shaw expression (R. P. Dooley, R. Shaw: Noise Perception in Electrophotography, J. Appl. Photogr. Eng., 5, 4 (1979), pp. 190-196.) is used, which is represented by Expression (1). Here, Expression (1) is given as the visual transfer function VTF.

$k \leq \log(0.238/0.138)/0.1$ $VTF = 1$ $k > \log(0.238/0.138)/0.1$ $$VTF = 5.05e^{-0.138k}(1 - e^{-0.1k}) \quad (1)$$

$k = \pi du/180$

Here, k is a spatial frequency (cycle/deg) defined by a solid angle, and is represented by the above expression. u is a spatial frequency (cycle/mm) defined by a length, and d is an observation distance (mm).

The Dooley-Shaw expression is given by $VTF = 5.05e^{-0.138k}(1 - e^{-0.1k})$ in Expression (1), and is less than 1 around 0 cycle/mm, and has so-called characteristics of a bandpass filter. However, in the embodiment of the present invention, even in a case where the spatial frequency band is low ($k \leq \log(0.238/0.138)/0.1$), the value of VTF is set to 1 so as to eliminate attenuation in sensitivity of low-frequency components.

Figure 18A:
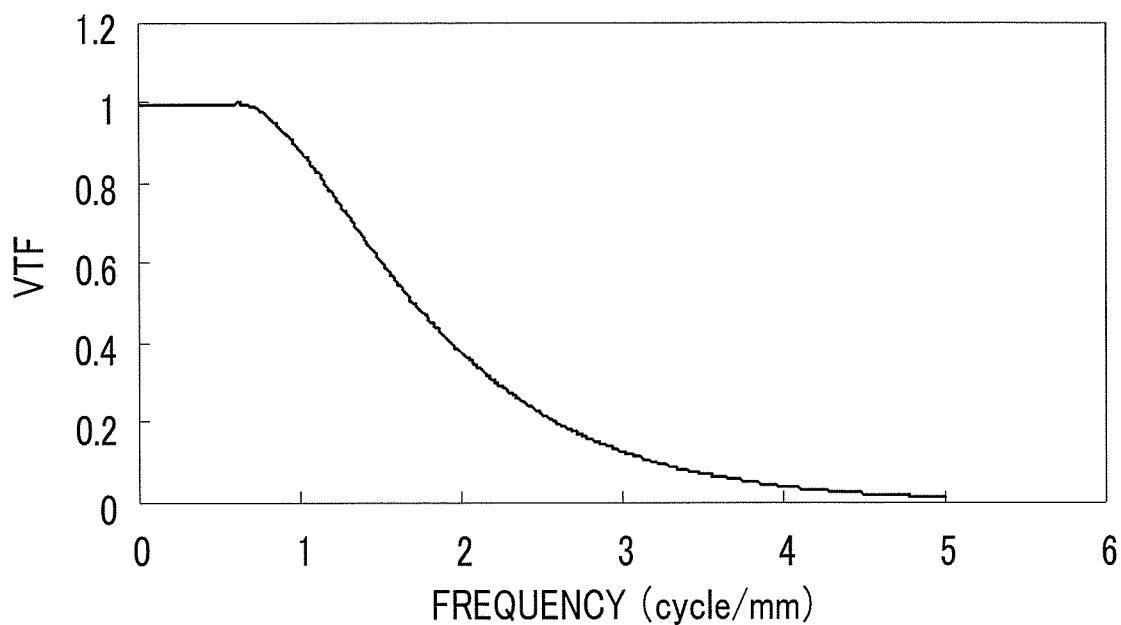
FIG. 18A is a graph of a visual transfer function indicating the sensitivity of the human eye's visual characteristics.
Figure 18B:
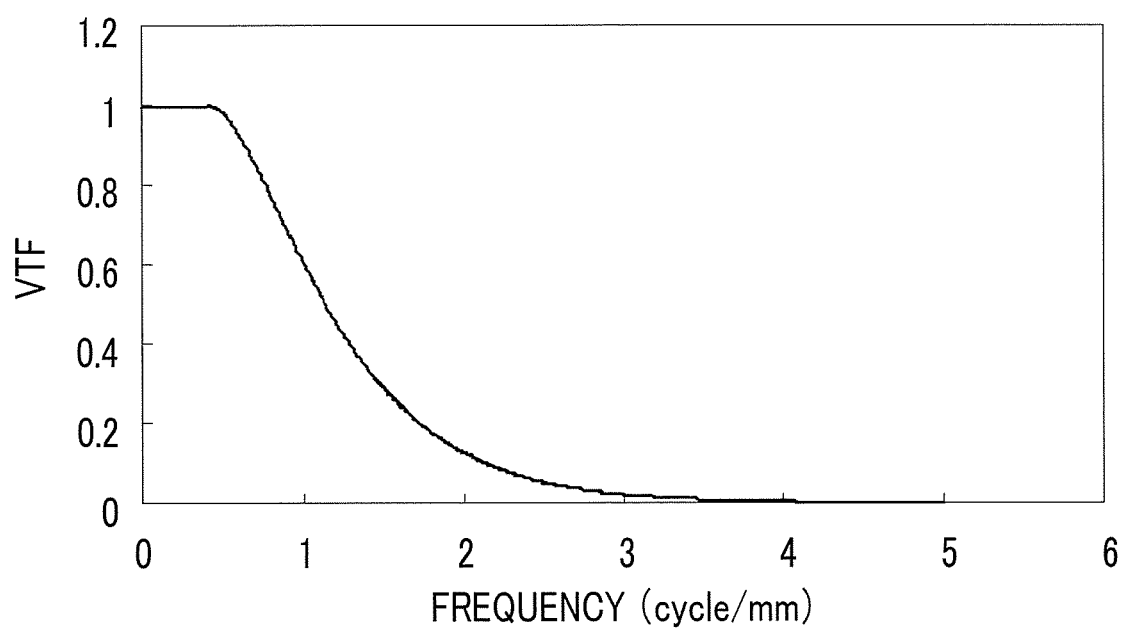
FIG. 18B is a graph of another visual transfer function indicating the sensitivity of the human eye's visual characteristics.

FIGS. 18A and 18B show examples of an observation distance of 500 mm and an observation distance of 750 mm as examples of VTF. In the description of the present specification, the VTF at the observation distance of 500 mm is used as the sensitivity of the human eye's visual response characteristics.

In FIG. 17, it can be seen that there is a moiré component in the low frequency range of 1 cycle/mm or less, and there is moiré that is visible to the human eye.

This moiré is caused by the components (x=22.2 cycle/mm, y=44.4 cycle/mm) indicated by the black arrows in the frequency distribution of the pixel array pattern of FIG. 14 and the components (x=21.8 cycle/mm, y=44.6 cycle/mm) indicated by the black arrows in the frequency distribution of the wiring pattern of FIG. 15.

As described above, it can be seen that in a case where there are close components of frequencies in the frequency distribution of the pixel array pattern and the frequency distribution of the wiring pattern, low-frequency moiré visible to the human eye occurs.

It should be noted that, as in the components indicated by the black arrows in FIG. 17, a component having the highest intensity among the moiré components obtained by applying the human eye's visual response characteristics is referred to as "a frequency component of moiré that contributes most to the moiré" or "a main moiré component".

(Principle of Moiré Reduction According to Embodiment of Present Invention)

From the above-described principle of moiré occurrence, in a case where the frequency of each frequency component of the wiring pattern can be set apart from the frequency of each frequency component of the pixel array pattern, it can be seen that a low-frequency moiré visually perceived by human eyes does not occur. In the embodiment of the present invention, the moiré can be reduced by the configuration in which "the repetitive pitches of the predetermined number of wirings are set as equal pitches and the respective pitches of the predetermined number of wirings are set as non-equal pitches".

Figure 19:
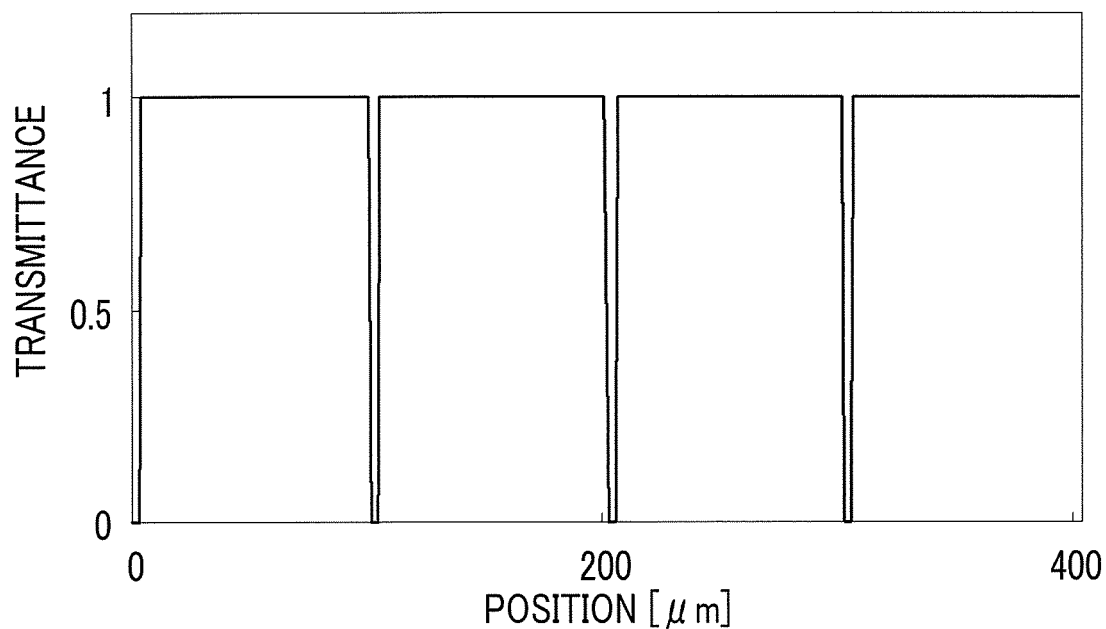
FIG. 19 is a 1-dimensional profile of the transmittance of four wirings of the wiring pattern shown in FIG. 12.
Figure 20:
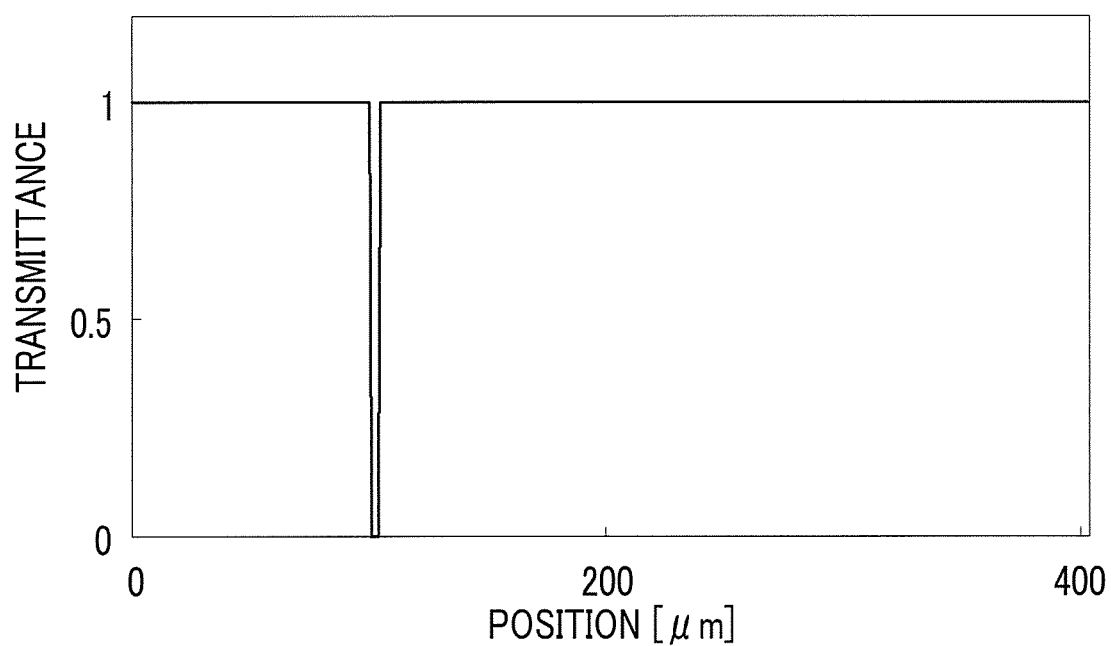
FIG. 20 is a 1-dimensional profile of the transmittance of the second wiring of the four wirings shown in FIG. 19.

The wiring pattern shown in FIG. 12 will be described as a typical example. As the straight line wiring in one direction, that is, the straight line wiring 21d in the right direction or the straight line wiring 21c in the left direction is viewed along the direction of the wiring in the wiring pattern (transmittance pattern of the wiring) shown in FIG. 12, the straight line wiring is as shown in FIG. 19. In FIG. 19, there are four wirings. As might be expected, all the respective pitches of the four wirings are equal pitches, which are 101 µm. Although only four wirings are shown in FIG. 19, there are wirings after this and the pitches thereof are naturally 101 µm. Here, only the second wiring in FIG. 19 is extracted and the extracted portion is shown in FIG. 20. The second wiring is repeated with a pitch of 404 µm for four wirings.

Figure 21:
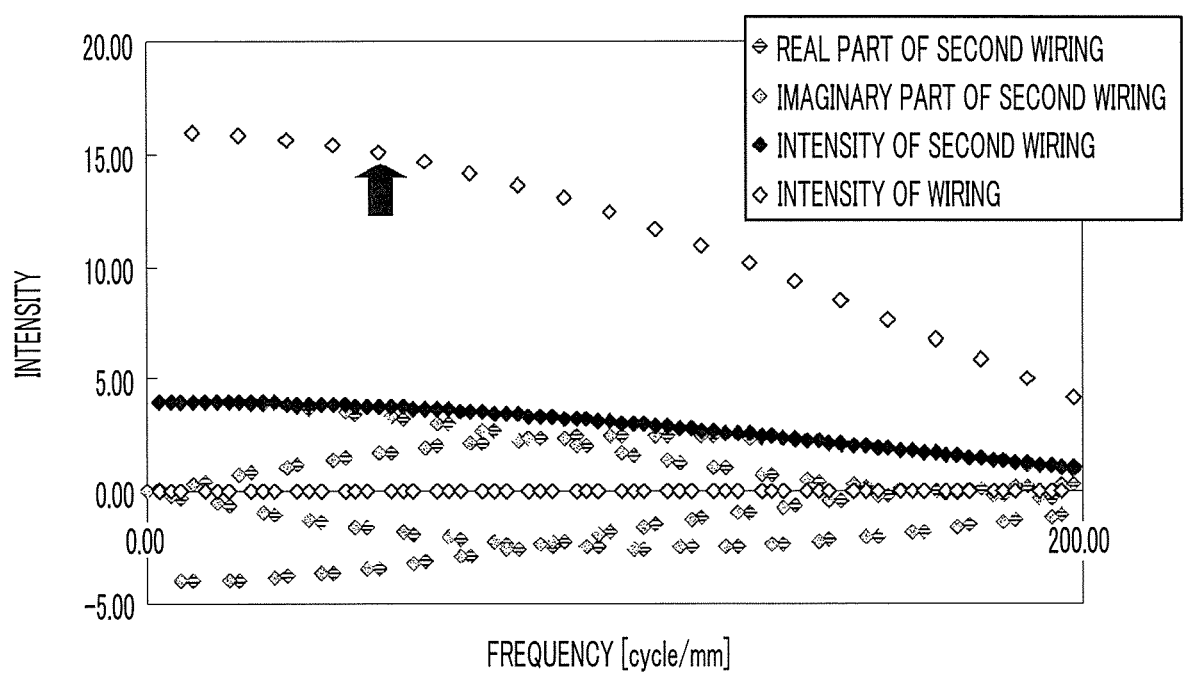
FIG. 21 is a diagram showing a 1-dimensional frequency distribution of the wiring pattern shown in FIG. 19.

Here, FIG. 21 shows a 1-dimensional frequency distribution of the wiring patterns shown in FIGS. 19 and 20. It can be seen from FIG. 21 that the second extracted wiring has four times more (finer) frequency components than the original wiring, and the minimum frequency thereof is lower (¼) than that of the original wiring. Since the pitch of the second extracted wiring is four times longer than that of the original wiring, the frequency components are present at frequencies four times finer, and the minimum frequency thereof is also ¼ times lower. While the second extracted wiring has four times more frequency components than the original wiring, the number of the frequency components of the original wiring is small. The reason for this is that the respective frequency components of the second extracted wiring and the respective frequency components of the other wiring cancel each other. That is, each of the first wiring, the second wiring, the third wiring, and the fourth wiring has four times more frequency components than the original wiring. However, in a case where all the frequency components of those wirings are added, only a component of a specific frequency (a frequency that is an integer multiple of the frequency corresponding to the pitch of the original wiring) is added and can be enhanced to remain, and the components of other frequencies cancel each other and become the frequency components of the original wiring. The addition in the frequency space may be subtraction (addition of a negative value) depending on the phase relationship of the components to be added, and thus the components may cancel each other. The addition in the frequency space is performed by separately adding the real parts and the imaginary parts of the respective components. However, each of the real parts and the imaginary parts may have a negative value depending on the phase (refer to FIG. 21), and thus the parts may cancel each other.

Here, the present inventor has found that the frequency distribution of the wirings can be changed by setting the respective pitches of the predetermined number of wirings to be non-equal pitches while setting the repetitive pitches of the predetermined number of wirings to be equal pitches. This point will be described in the above-described example (example in which the predetermined number is four). The intensity of each frequency component of the first wiring, the third wiring, and the fourth wiring is the same as the intensity of the second wiring indicated by each black dot (rhomboid) in FIG. 21. Even in a case where the position of each wiring is changed (that is, even in a case where the pitch of each wiring is changed), the repetitive pitch of the four lines does not change. Therefore, the intensity of the second wiring is the same as that of the second wiring indicated by the black dots in FIG. 21 without change in intensity of each frequency component. However, in a case where the position of each wiring is changed (in a case where the pitch of each wiring is changed), the values of the real part and the imaginary part of each frequency component change as the phase changes. In a case where the position of the second wiring is changed, the values of the real part and the imaginary part shown in FIG. 21 change. This change is able to change the frequency distribution of the result obtained by adding the frequency components of the first wiring, the second wiring, the third wiring, and the fourth wiring.

Since the component indicated by the black arrow in FIG. 21 is close to the frequency component of the black arrow in the pixel array pattern of FIG. 14, a low-frequency moiré visible to the human eye occurs as shown in FIG. 17.

Therefore, optimization of the positions (pitches) of the first wiring, the second wiring, the third wiring, and the fourth wiring was examined such that the component indicated by the black arrow in FIG. 21 becomes small. The results are shown in FIGS. 22 and 23.

Figure 22:
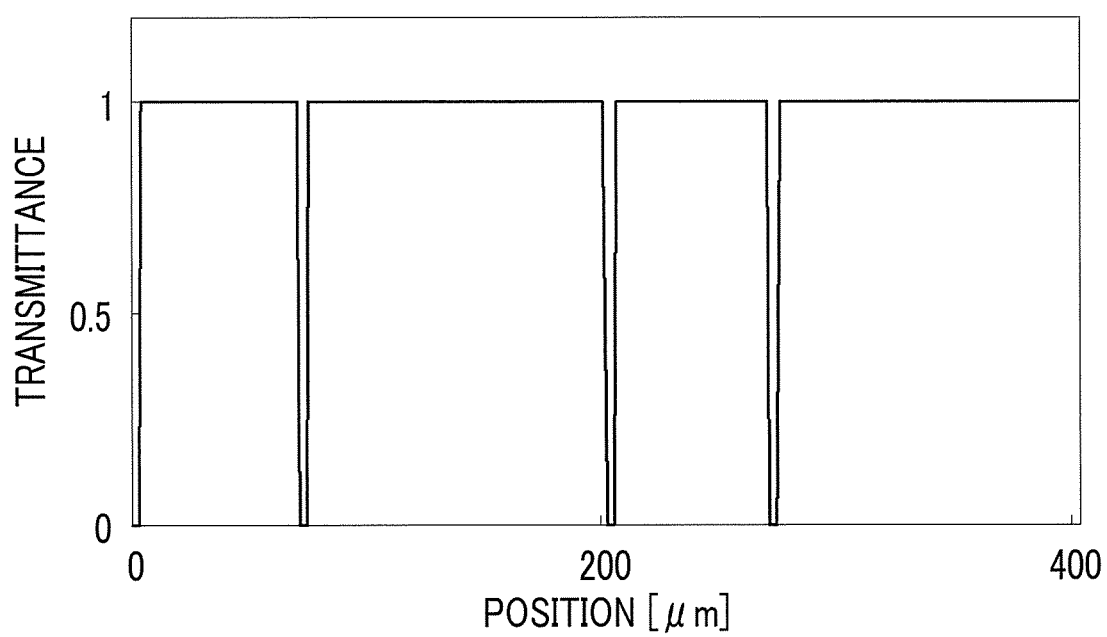
FIG. 22 is a 1-dimensional profile of the transmittance of four wirings, which is the optimization result shown in FIG. 2.
Figure 23:
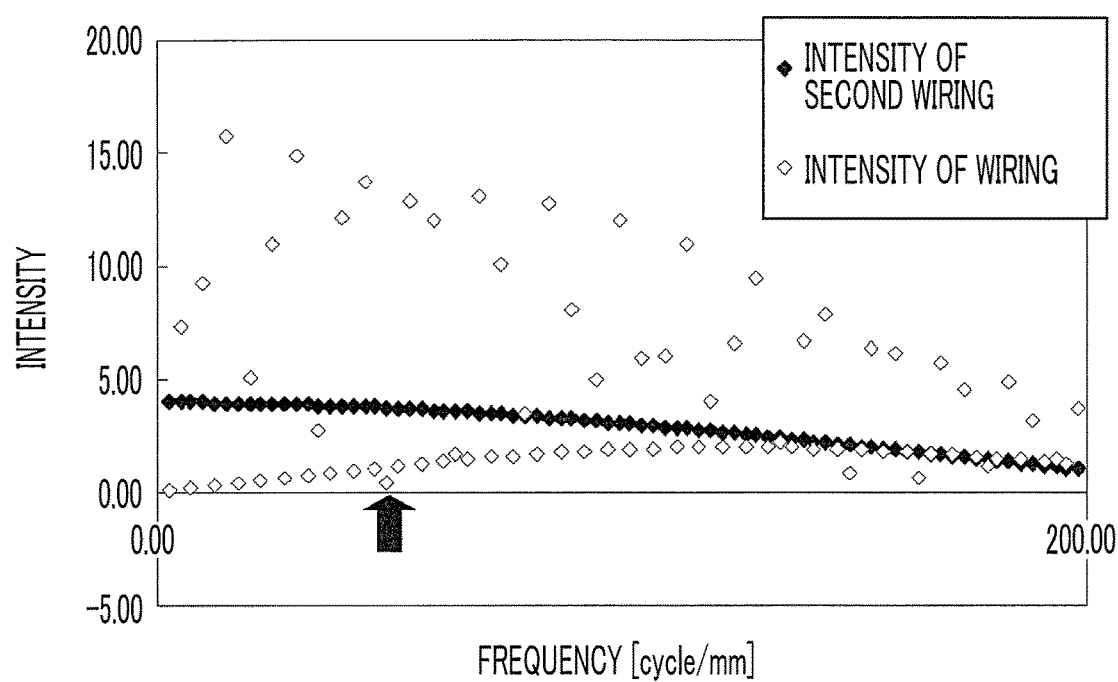
FIG. 23 is a diagram of a 1-dimensional frequency distribution of the wiring pattern shown in FIG. 22.

FIG. 22 is a 1-dimensional profile of the transmittances of the four wirings as an optimization result. FIG. 23 shows a frequency distribution. It can be clearly seen from FIG. 23 that the intensity of the frequency component indicated by the black arrow can be reduced.

Figure 24:
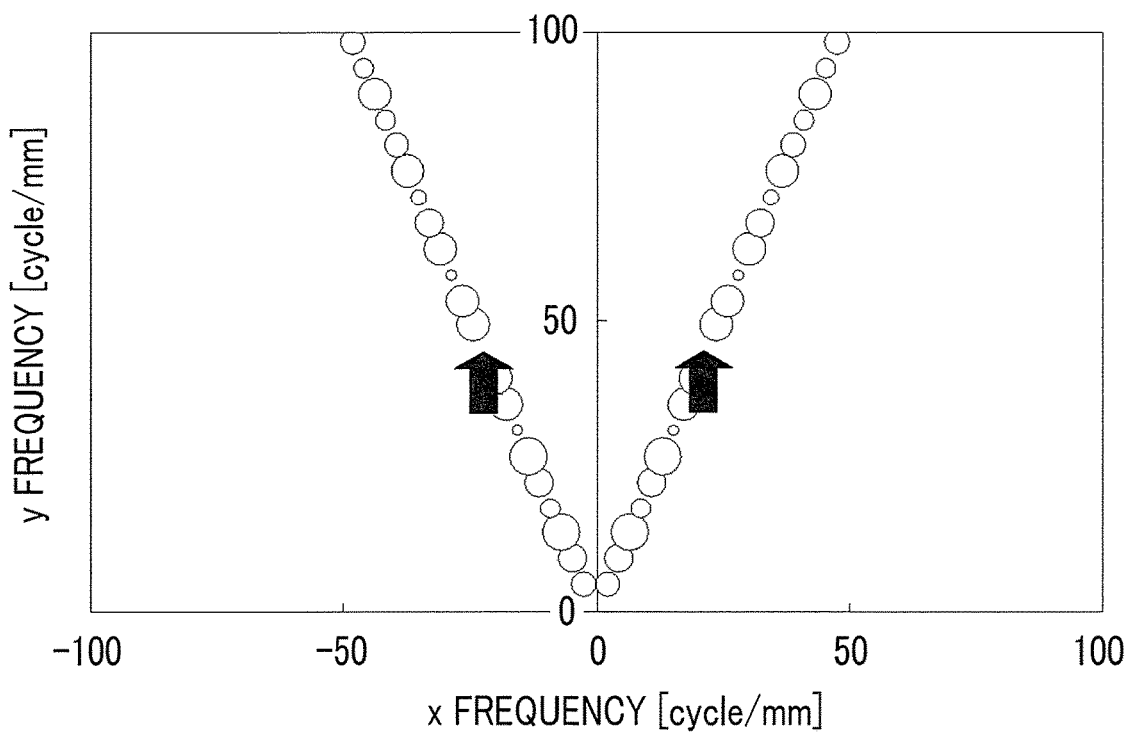
FIG. 24 is a diagram of a 2-dimensional frequency distribution of the wiring pattern shown in FIG. 2.

Further, FIGS. 2 and 3 show the transmittance patterns of the wirings as the optimization result. In the wiring patterns shown in FIGS. 2 and 3, the repetitive pitches of the four wirings are 404 µm, which is the same as those in FIGS. 12 and 13. FIG. 24 is a 2-dimensional frequency distribution of the wiring pattern shown in FIG. 2, where the intensity of each frequency component is indicated by the area of the circle. It can be seen that in the frequency distribution of the pixel array pattern in FIG. 14, the intensity of the component (indicated by the black arrow) close to the component indicated by the black arrow is smaller than that in FIG. 15.

Figure 25:
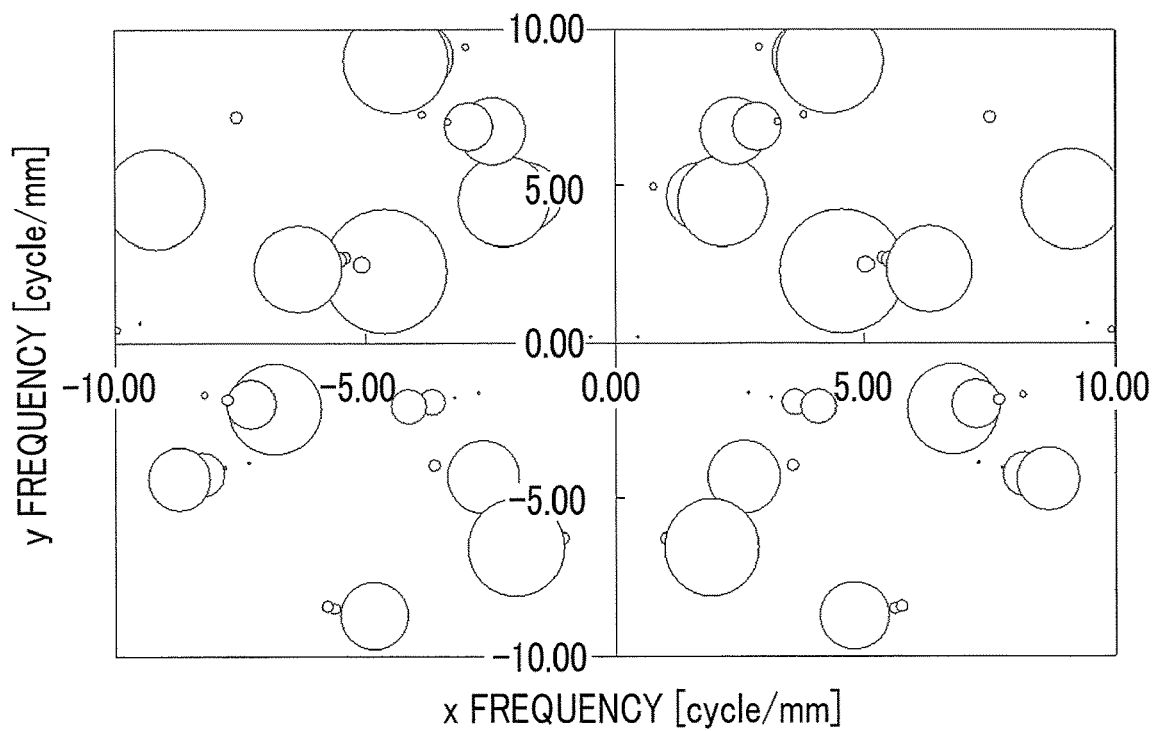
FIG. 25 is a diagram in which moiré components calculated from frequency components of the pixel array pattern shown in FIG. 14 and frequency components of the wiring pattern shown in FIG. 2 are plotted.
Figure 26:
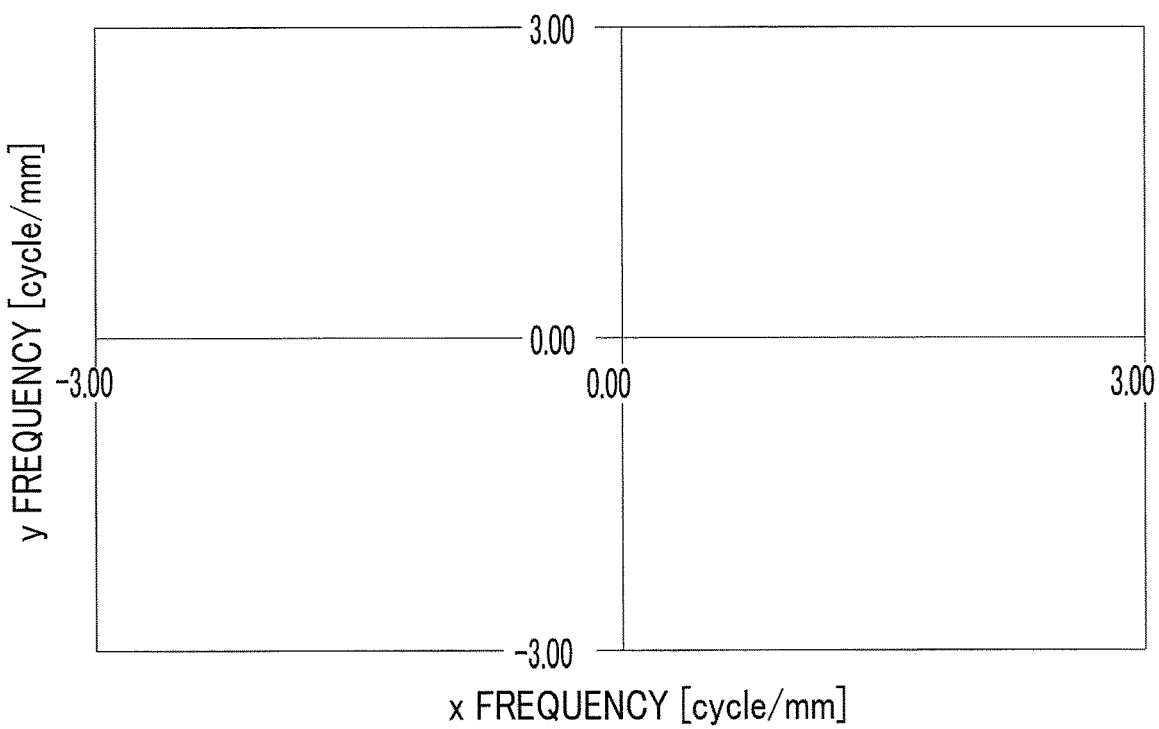
FIG. 26 is a diagram showing a result of multiplying each moiré component shown in FIG. 25 by the sensitivity of the human eye's visual characteristics.

FIG. 25 shows moiré components calculated from the frequency components of the pixel array pattern shown in FIG. 14 and the frequency components of the wiring pattern shown in FIG. 2. FIG. 26 shows a result obtained by multiplying the visual transfer function VTF, which indicates the sensitivity of the human eye's visual response characteristics represented by Expression (1), by moiré components shown in FIG. 25. It can be seen that there is no low-frequency moiré as shown in FIG. 17. It should be noted that in FIGS. 15 and 24, FIGS. 16 and 25, and FIGS. 17 and 26, the magnitudes of intensities respectively indicated by the areas of the circles of components are the same.

Here, as can be seen by comparing FIG. 21 and FIG. 23 and comparing FIG. 15 and FIG. 24, the wiring pattern of the embodiment of the present invention, in which "the repetitive pitches of the predetermined number of wirings are set as equal pitches, and the respective pitches of the predetermined number of wirings are set as non-equal pitches", has a smaller minimum frequency than the equal pitch wiring. For example, in a case where the predetermined number is 4, as shown in FIGS. 22, 2, and 3, the minimum frequency is ¼. The reason can be described as follows. As described above, each of the first to fourth wirings shown in FIG. 21 has four times more frequency components than the original equal pitch wiring, and the minimum frequency thereof is also ¼. In a case where the frequency components of these wirings are added, at equal pitches, only frequencies that are integer multiples of the frequencies corresponding to the pitch of the original wiring (a pitch of ¼ of the first to fourth wirings) are added and can be enhanced to remain, and the components of other frequencies cancel each other.

However, in a case where the pitches of the first to fourth wirings are set to non-equal pitches as in the embodiment of the present invention, the components remain without being canceled. As described above, in the embodiment of the present invention, a low-frequency component of the wiring pattern occurs as compared with the equal pitch wiring. Thus, it should be taken into account that it is necessary to make the wiring pattern not visible. For that purpose, in Expression (7) representing the pattern in which the pixel array pattern and the wiring pattern are overlapped, not only the moiré component of the expression in the fourth row, but also "each frequency component of the wiring pattern multiplied by the average luminance A0 of the pixel array pattern" in the expression in the third row may be evaluated. Specifically, in a case of deriving the moiré component of FIG. 25 from each frequency component of the pixel array pattern of FIG. 14 and each frequency component of the wiring pattern of FIG. 24, a component of the frequency 0 may be included in the frequency distribution of the pixel array pattern (corresponding to A0 in Expression (7)). Each moiré component shown in FIG. 25 is a moiré component derived in such a manner by adding the component of the frequency 0 to the frequency distribution of the pixel array pattern. The moiré components shown below also mean "a moiré component derived by adding a component of the frequency 0 to the frequency distribution of the pixel array pattern" unless otherwise specified.

The principle of moiré reduction according to the embodiment of the present invention will be described once again. First, assuming that the predetermined number of wiring patterns is n, each wiring pattern (herein referred to as a sub-wiring pattern) in which only the first wiring, . . . , and the nth wiring are extracted will be considered. Each sub-wiring pattern has n times finer and more frequency components than the original wiring pattern (4 times in FIG. 21), and includes a frequency component that causes low-frequency moiré visible to the human eye in the vicinity of each frequency component of the pixel array pattern. The respective sub-wiring patterns are overlapped at equal pitches (corresponding to the original wiring pattern), and the respective frequency components can be most canceled out and reduced. Thus, the minimum frequency can be increased. On the other hand, the frequency component, which is included in each sub-wiring pattern and causes moiré, remains (the largest frequency component is indicated by the black arrow in FIG. 21). Therefore, by overlapping the sub-wiring patterns with pitches that cancel out the frequency components included in the respective sub-wiring patterns that cause moiré, the number of frequency components becomes greater than that in the case of overlapping with the equal pitches, and the minimum frequency thereof is lowered, but moiré can be reduced. This is the principle of moiré reduction of the embodiment of the present invention.

The present invention is characterized in the wiring pattern which has the moiré frequency distributions shown in FIGS. 25 and 26 with respect to the moiré frequency distributions of the equal pitch wiring pattern shown in FIGS. 16 and 17 and in which "the predetermined number of repetitive pitches are equal pitches and the predetermined number of respective pitches are non-equal pitches".

The wiring pattern used in the conductive film of the embodiment of the present invention (hereinafter, also referred to as the wiring pattern of the embodiment of the present invention) has a "predetermined number of repetitive pitches at equal intervals", and is characterized in that the sum of moiré s becomes smaller compared to the frequency distribution of the moiré in such a case of the equal pitch wiring patterns shown in FIGS. 16 and 17, as shown in the frequency distribution of moiré in FIGS. 25 and 26.

As described in FIG. 21, in the embodiment of the present invention, the larger the number of non-equal pitches, the lower the minimum frequency. Therefore, there is a concern that the wiring pattern may be visible. Similarly, as can be seen from FIG. 21, in the embodiment of the present invention, as the number of non-equal pitches increases, the frequency components of the sub-wiring patterns become finer. Among the frequency components, many frequency components, which cause low-frequency moiré s visible to the human eye are included therein. Thus, it may be difficult to optimize such pitches that these frequency components cancel each other.

Therefore, it is desirable to reduce the number of non-equal pitches as much as possible. According to an experiment conducted by the present inventor, the number of moiré s that can be reduced by setting the pitches of the predetermined number of wirings to non-equal pitches is 16 or less at most as compared with the equal pitch wiring pattern. Even in a case where the pitches of the 16 or more wirings are set as non-equal pitches, the moiré reduction effect does not change or becomes worse, while the wiring pattern itself is easily visible. In most cases, the effect of reducing moiré is maximized in a case where the number of wirings having non-equal pitch is about 2 to 8, and does not change or becomes worse even in a case where the number of wirings is further increased. Therefore, in order to sufficiently reduce moiré without making the wiring pattern visible, it is desirable that the number of non-equal pitches is 16 or less at most. The examples shown in FIGS. 22 and 23 are examples in which the optimization of the pitches of the four wirings was studied. However, as a result, the repetitive pitches of the two wirings are approximately equal pitches. That is, the examples show that the same moiré reduction effect can be obtained by optimizing the pitches of the two wirings.

Figure 27:
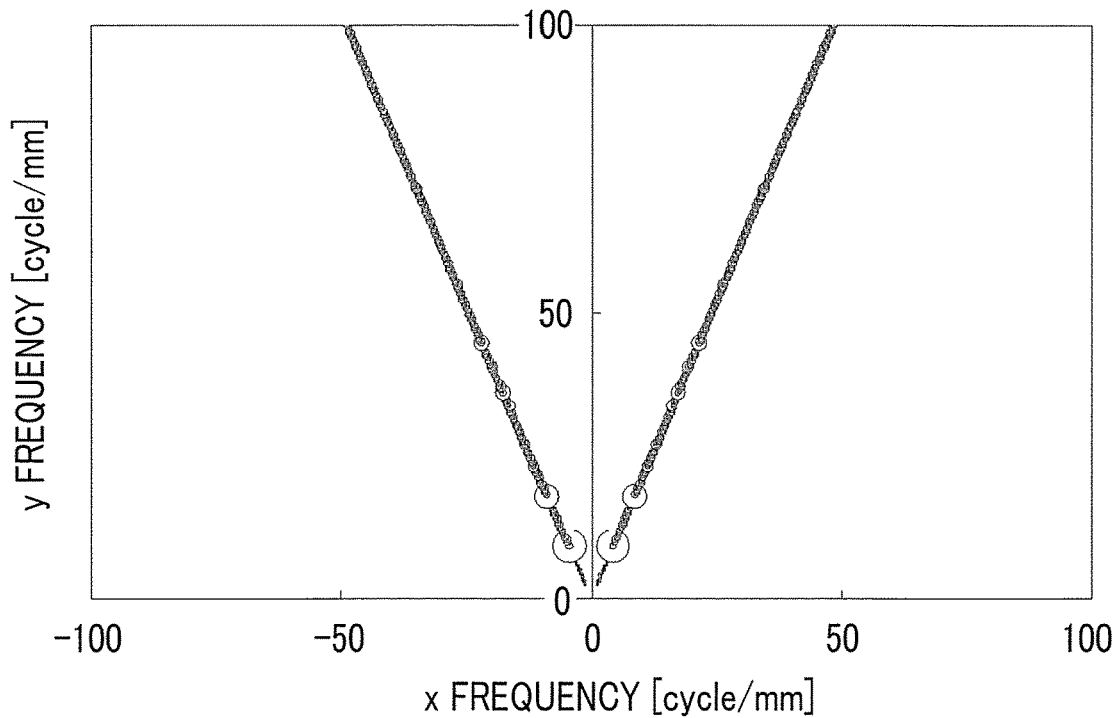
FIG. 27 is a diagram of a 2-dimensional frequency distribution of a wiring pattern in which 512 wirings have non-equal pitches.
Figure 28:
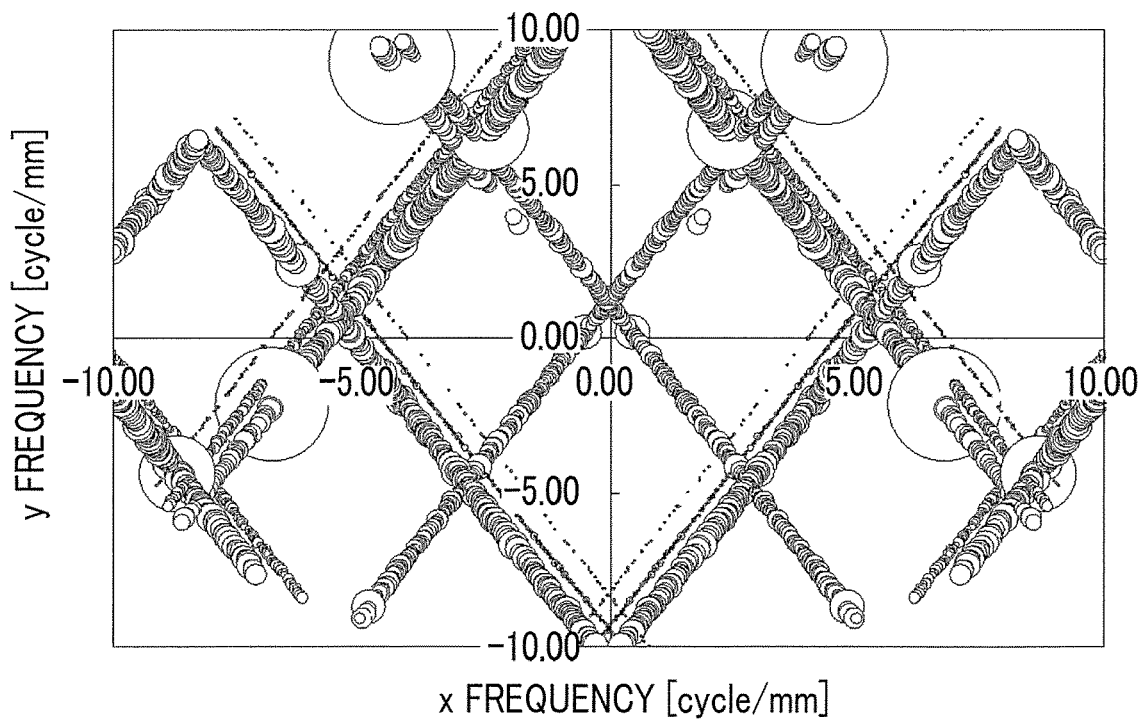
FIG. 28 is a diagram in which each frequency component of the pixel array pattern shown in FIG. 14 and a moiré component calculated from each frequency component of the wiring pattern shown in FIG. 27 are plotted.
Figure 29:
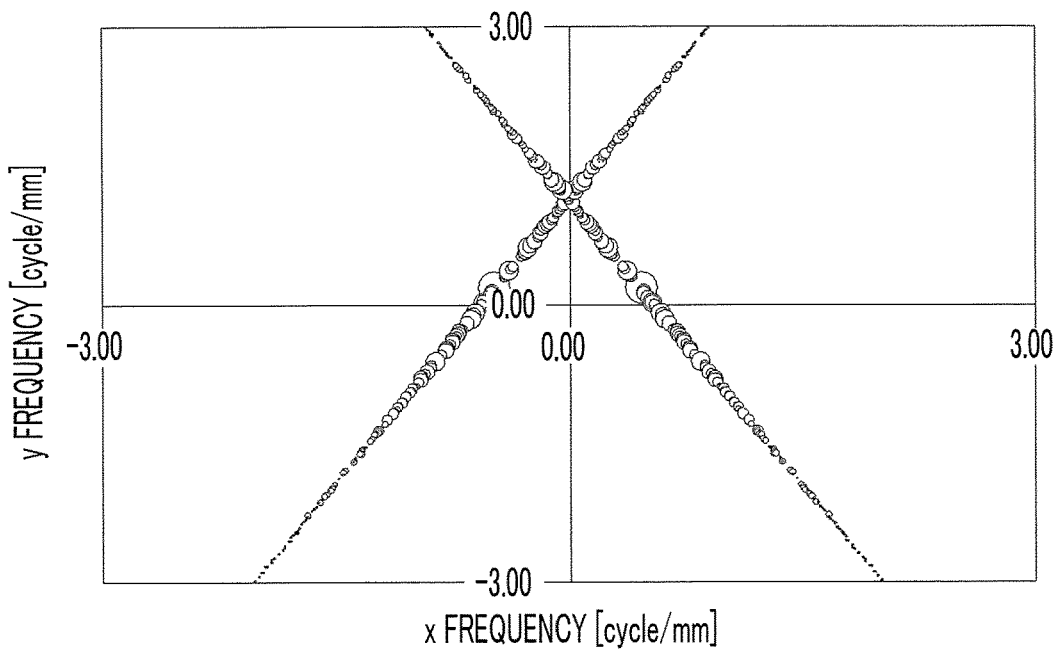
FIG. 29 is a diagram showing a result of multiplying each moiré component shown in FIG. 28 by the sensitivity of the human eye's visual characteristics.

In the prior arts described in JP2013-214545A and JP2016-014929A described above, with respect to the irregularity provided to the wiring pitches, the present invention has a restriction that "the predetermined number of repetitive pitches are equal pitches". Further, as compared with the above-described prior art, the present invention clarifies the following and the principle thereof. As compared with moiré of the equal pitch wiring patterns as shown in FIGS. 16 and 17, it is possible to reduce the sum of moiré s as shown in FIG. 26, by using such wiring patterns. The present invention further describes that "it is desirable to set the number of non-equal pitches to 16 or less in order to sufficiently reduce moiré without making the wiring pattern visible". As a trial, the number of non-equal pitches was increased to 512, and random irregularities of about 16% were provided to the pitches to investigate the moiré component. The results are shown in FIGS. 27 to 29. FIG. 27 is a 2-dimensional frequency distribution of the wiring pattern. FIG. 28 is a frequency distribution of moiré derived from the frequency distribution of the pixel array pattern of FIG. 14 and the frequency distribution of the wiring pattern of FIG. 27. Further, FIG. 29 shows a distribution obtained by multiplication of the visual transfer function VTF shown in Expression (1). Here, FIG. 27 is the same as FIGS. 15 and 24, FIG. 28 is the same as FIGS. 16 and 25, FIG. 29 is the same as FIGS. 17 and 26, in terms of the magnitudes of the intensities indicated by the areas of the circles of the respective components.

It can be seen that there is a clear difference in a case of comparing FIGS. 24 to 26, each of which is the distribution of the embodiment of the present invention, with FIGS. 27 to 29, which is the distribution to which irregularity is assumed to be provided in the above-mentioned prior art. In FIGS. 24 to 26, the intensities of the wiring pattern frequency components (indicated by the black arrows) close to the frequency components of the pixel array pattern are clearly smaller than that of the equal-pitch wiring pattern (refer to FIG. 15). As a result, it can be seen that there is no low-frequency area moiré component (refer to FIGS. 16 and 17) found in the equal pitch wiring pattern. On the other hand, in FIGS. 27 to 29, the frequency component of the wiring pattern spreads finely. As a result, it can be seen that there is no specific low-frequency area moiré component (refer to FIGS. 16 and 17) found in the equal pitch wiring pattern, but a large number of fine moiré components are generated. A large number of these fine moiré components are visible as irregular noise. Compared to the moiré s shown in FIG. 17, the moiré s shown in FIG. 29 have no specific large moiré, but the sum of moiré s is rather large.
(Wiring Pattern in which Wiring Pitch is Different in Each of Two or More Directions)

Next, as an application of the embodiment of the present invention, an example will be described, in which the present invention is applied to "a wiring pattern in which straight line wirings in two or more directions are overlapped and the average wiring pitch is different in each of at least two or more directions".

Therefore, first, "a wiring pattern in which wiring pitches are different in each of two or more directions" will be described.

Figure 30:
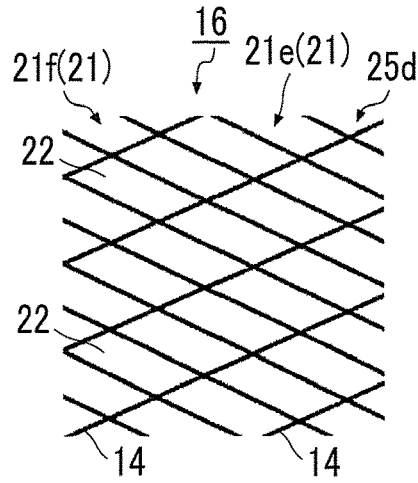
FIG. 30 is a plan view schematically showing an example of a mesh-shaped wiring pattern of a wiring portion of the conductive film shown in FIG. 1.
Figure 31:
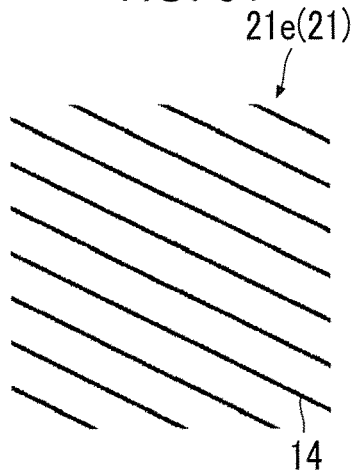
FIG. 31 is a plan view schematically showing an equal pitch wiring pattern in a straight line wiring of the wiring pattern in one direction shown in FIG. 30.
Figure 32:
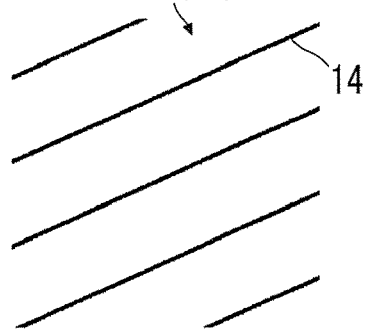
FIG. 32 is a plan view schematically showing a different equal pitch wiring pattern in a straight line wiring of the wiring pattern in another direction shown in FIG. 30.

FIG. 30 shows a wiring pattern 25d in which the wiring pitches in the right direction and the left direction are different. FIG. 31 shows a straight line wiring 21e being composed of a plurality of thin metal wires 14 arranged in parallel in one direction (rightward). FIG. 32 shows a straight line wiring 21f being composed of a plurality of thin metal wires 14 arranged in parallel in another direction (leftward). The wiring pitches of the plurality of thin metal wires 14 of the straight line wiring 21e shown in FIG. 31 are different from the wiring pitches of the plurality of thin metal wires 14 of the straight line wiring 21f shown in FIG. 32. It can be said that the wiring pattern 25d shown in FIG. 30 is a separate-direction non-equal pitch wiring pattern in which the opening portions (cells) 22 having a predetermined shape formed by overlapping the straight line wiring 21e shown in FIG. 31 and the straight line wiring 21f shown in FIG. 32 with wiring pitches thereof different from each other and intersecting the pluralities of thin metal wires 14 with each other are arranged in a mesh shape.

Figure 33:
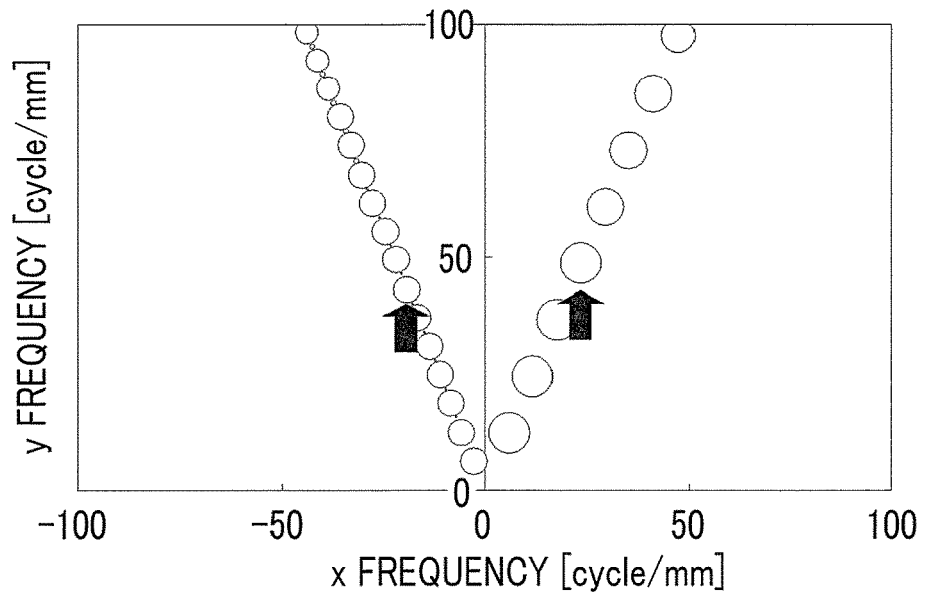
FIG. 33 is a diagram of a 2-dimensional frequency distribution of the wiring pattern shown in FIG. 30.
Figure 34:
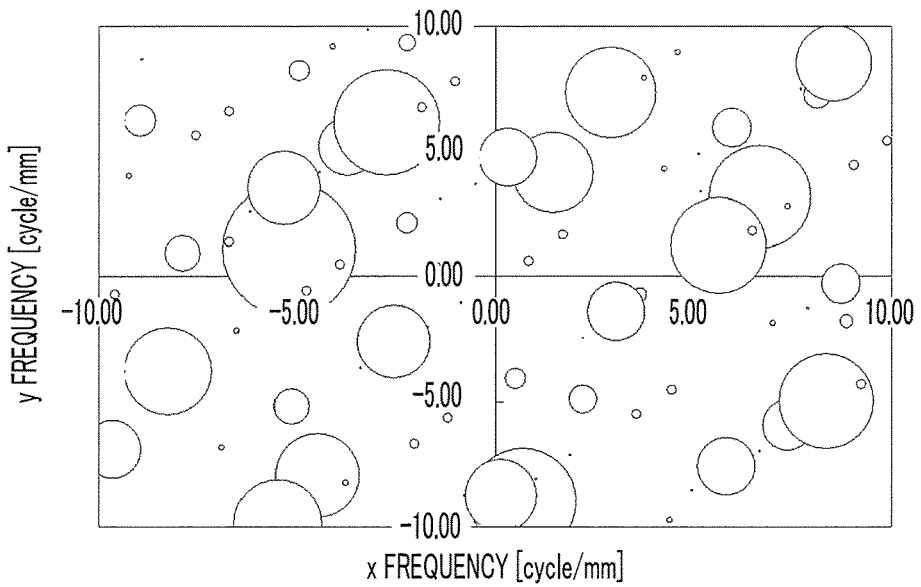
FIG. 34 is a diagram in which moiré components calculated from the frequency components of the pixel array pattern shown in FIG. 14 and each frequency component of the wiring pattern shown in FIG. 30 are plotted.

FIG. 33 is a diagram of a 2-dimensional frequency distribution of the separate-direction non-equal pitch wiring pattern 25d in which the wiring pitches in the right and left directions shown in FIG. 30 are different. FIG. 34 is a diagram showing the frequency distribution of moiré in the separate-direction non-equal pitch wiring pattern 25d shown in FIG. 30, and a diagram in which moiré components calculated from frequency components of the pixel array pattern shown in FIG. 14 and frequency components of the wiring pattern shown in FIG. 33 are plotted.

Figure 35:
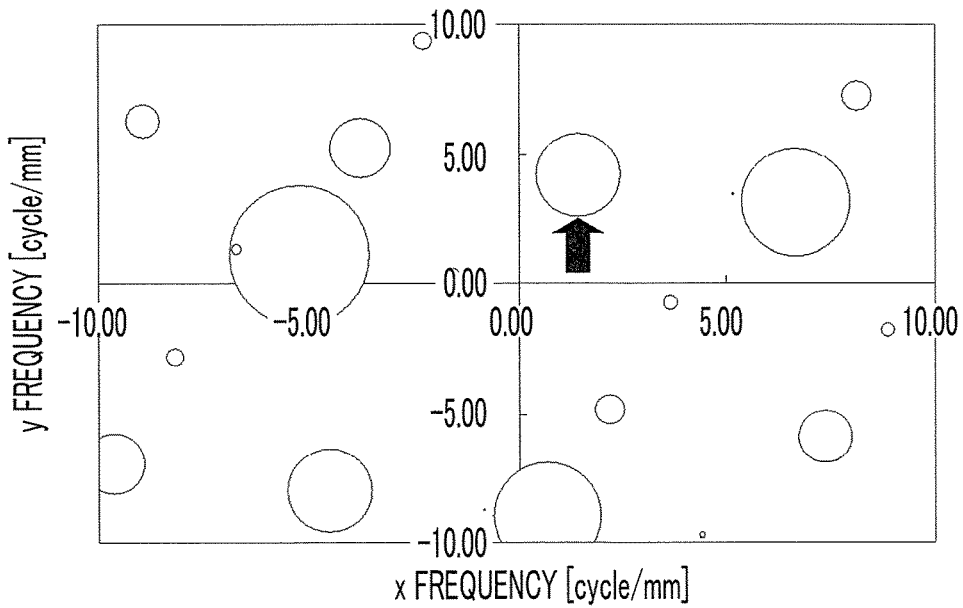
FIG. 35 is a moiré component calculated on the basis of the straight line wiring shown in FIG. 31 among the moiré components shown in FIG. 34.
Figure 36:
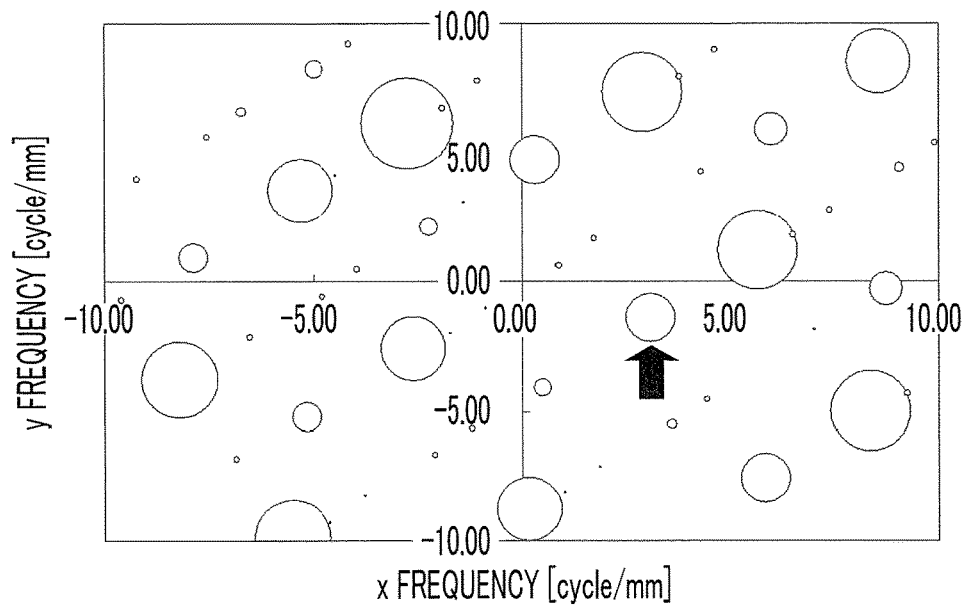
FIG. 36 is a moiré component calculated on the basis of the straight line wiring shown in FIG. 32 among the moiré components shown in FIG. 34.

In addition, FIG. 35 is a diagram of moiré components calculated from the frequency components (first quadrant components) of the wiring pattern (straight line wiring 21e shown in FIG. 31) in the right direction, among the frequency components of the pixel array pattern shown in FIG. 14 and the frequency components of the wiring pattern 25d shown in FIG. 33. That is, FIG. 35 is a diagram of the moiré components calculated on the basis of the straight line wiring 21e shown in FIG. 31, among the moiré components shown in FIG. 34. FIG. 36 is a diagram of moiré components calculated from the frequency components (second quadrant components) of the wiring pattern (straight line wiring 21f shown in FIG. 32) in the left direction, among the frequency components of the pixel array pattern shown in FIG. 14 and the frequency components of the wiring pattern 25d shown in FIG. 33. That is, FIG. 36 is a diagram of the moiré components calculated on the basis of the straight line wiring 21f shown in FIG. 32 among the moiré components shown in FIG. 34.

The wiring pattern 25d shown in FIG. 30 and the wiring pattern 25c shown in FIG. 12 each have the same number of wirings per unit area, that is, the same average transmittance. Here, assuming that the pitch of the rightward straight line wiring is p1 and the pitch of the leftward straight line wiring is p2, in a case where the value of $(1/p1+1/p2)$ is equal, the number of the thin metal wires 14 arranged per unit area is equal. That is, assuming that the pitch of the rightward straight line wiring 21e shown in FIG. 31 in the wiring pattern 25d shown in FIG. 30 is p1, the pitch of the leftward straight line wiring 21f shown in FIG. 32 is p2, and the pitches of the leftward straight line wiring 21c and the rightward straight line wiring 21d shown in FIGS. 6 and 13 in the wiring pattern 25c shown in FIG. 12 are p, $1/p1+1/p2=2/p$ is established.

Further, the frequency distribution of the wiring pattern 25d shown in FIG. 33 and the frequency distribution of the wiring pattern 25c shown in FIG. 15 each have the same magnitudes of intensities indicated by the areas of the circles of the respective components. In addition, the moiré frequency distribution of the wiring pattern 25d shown in FIG.

34 and the moiré frequency distribution of the wiring pattern 25c shown in FIG. 16 each have the same magnitudes of intensities indicated by the areas of the circles of the respective components.

Further, in the wiring pattern 25d shown in FIG. 30, the angle of the rightward wiring pattern (straight line wiring 21e) shown in FIG. 31 is, for example, 26° which is the same as the straight line wirings 21c and 21d of the omnidirectional-equal pitch wiring pattern 25c shown in FIG. 12, but the angle of the leftward wiring pattern (straight line wiring 21f) shown in FIG. 32 is 24°. Further, in the wiring pattern 25d shown in FIG. 30, the wiring pitch of the rightward straight line wiring 21e shown in FIG. 31 is, for example, 74 μm, and the wiring pitch of the leftward straight line wiring 21f shown in FIG. 32 is, for example, 149 μm.

As can be seen by comparing FIGS. 16 and 34, the low-frequency area moiré components (indicated by the black arrows in FIG. 16) found in the moiré frequency distribution (refer to FIG. 16) of the omnidirectional-equal pitch wiring pattern 25c are not present in FIG. 34. In the frequency distribution of the wiring pattern 25d shown in FIG. 33, the frequency components closest to the frequency components of the pixel array pattern indicated by the black arrows in FIG. 14 are indicated by the black arrows. From the frequency distribution of the moiré s shown in FIG. 34 of the wiring pattern 25d shown in FIG. 30, as compared with the low-frequency area moiré components (indicated by the black arrows in FIG. 16) found in the moiré frequency distribution shown in FIG. 16 of the omnidirectional-equal pitch wiring pattern 25c shown in FIG. 12, it can be seen that high-frequency moiré components occur. In a case where each moiré component shown in FIG. 34 is multiplied by the VTF of Expression (1), the result is as shown in FIG. 26, and there is no moiré component having a level that can be indicated by the area of the circle in the graph. That is, it can be seen that the low-frequency area moiré components indicated by the arrows in FIGS. 35 and 36 are eliminated as shown in FIG. 26 in a case of multiplication of the VTF of Expression (1). That is, the moiré evaluation value, which is the sum of moiré components, in the wiring pattern 25d shown in FIG. 30 is smaller than that in the wiring pattern 25c shown in FIG. 12.

Compared to the frequency distribution of the omnidirectional-equal pitch wiring pattern 25c shown in FIG. 15, the pitches of the rightward and leftward wiring patterns (the straight line wirings 21e and 21f) may be changed as shown in FIG. 30. In this case, with respect to the at least the rightward wiring pattern (straight line wiring 21e), the frequencies of the frequency components shown in FIG. 33 are farther than those in the case of equal pitches in all directions (refer to FIG. 15). Therefore, components close to the frequency components of the pixel array pattern shown in FIG. 14 is hardly likely to occur. As a result, low-frequency moiré is hardly likely to occur.

On the other hand, with respect to the leftward wiring pattern (straight line wiring 21f), the frequencies of the frequency components shown in FIG. 33 are closer than those in the case of equal pitches in all directions (refer to FIG. 15), and thus components close to the frequency components of the pixel array pattern shown in FIG. 14 occurs. As a result, it is considered that low-frequency moiré s are likely to occur.

Therefore, the present inventor variously changes the pitch of the rightward and leftward wirings within a range in which (1/p1+1/p2) is not greater than a predetermined value (a range in which the transmittance is allowable), and also changes the angles of the rightward and leftward wirings, thereby obtaining the moiré evaluation value which is the sum of moiré components. Here, since the pixel array pattern shown in FIG. 11 (and the frequency distribution of the pixel array pattern of FIG. 14) is bilaterally symmetric, in a case where the pitches of the rightward and leftward wirings are the same (refer to FIG. 12), moiré is optimized at the same wiring angle. However, in a case where the pitches of the rightward and leftward wirings are different (refer to FIG. 30), moiré is not necessarily optimized at the same angle. Thus, by changing the angles of the rightward and leftward wirings separately in such a manner, the moiré evaluation value, which is the sum of moiré components, was investigated.

As a result, it was found that moiré can be reduced in some cases as compared with the case where the rightward and leftward wirings have equal pitches. In other words, as compared with the case of the same angles and pitches, it was found that the moiré may be reduced by not changing the angles and pitches of the rightward and leftward wiring patterns to the same angles and pitches but changing the angles and pitches separately. It is considered that the degree of moiré reduction is different depending on the pixel array pattern, the allowable range of transmittance, the range of the angle of the wiring, and the like.

(Application Example of Present Invention in Wiring Pattern in which Pitches of Wirings are Different in Two or More Directions)

Next, as an application of the embodiment of the present invention, an example in which the present invention is applied to "a wiring pattern in which average pitches of wirings differ in two or more directions" will be described.

Figure 37:
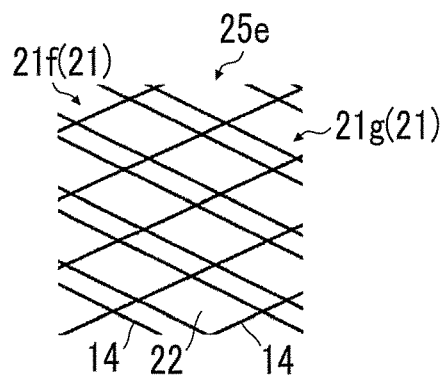
FIG. 37 is a plan view schematically showing another example of a mesh-shaped wiring pattern of a wiring portion of the conductive film shown in FIG. 1.
Figure 38:
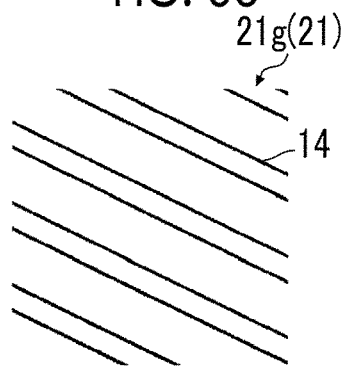
FIG. 38 is a plan view schematically showing a non-equal pitch wiring pattern in the straight line wiring of the wiring pattern in one direction shown in FIG. 37.

FIG. 37 shows a wiring pattern 25e of the third example in which the present invention is applied to "a wiring pattern in which the average pitch of wirings is different in each of two or more directions". In the wiring pattern 25e shown in FIG. 37, as shown in FIG. 38, only the rightward straight line wiring 21g is configured as follows. While the repetitive pitches of the four wirings are set as equal pitches, an average pitch is set to be approximately equal to that of the rightward straight line wiring 21e shown in FIG. 31 (that is, the repetitive pitches of the four wirings are approximately equal to that of the rightward straight line wiring 21e shown in FIG. 31), the respective pitches of the four wirings are set as non-equal pitches. On the other hand, the leftward straight line wiring 21f is the same as that in FIG. 32. The average pitch of the rightward straight line wiring 21g shown in FIG. 38 is different from the average pitch of the leftward straight line wiring 21f shown in FIG. 32. That is, the wiring pattern 25e shown in FIG. 37 is "a wiring pattern in which the repetitive pitches of the predetermined number of wirings are set as equal pitches and the respective pitches of the predetermined number of wirings are set as non-equal pitches", and is "a wiring pattern in which straight line wirings in two or more directions are overlapped, and a wiring pattern in which the average wiring pitch is different in each of at least two or more directions".

Figure 39:
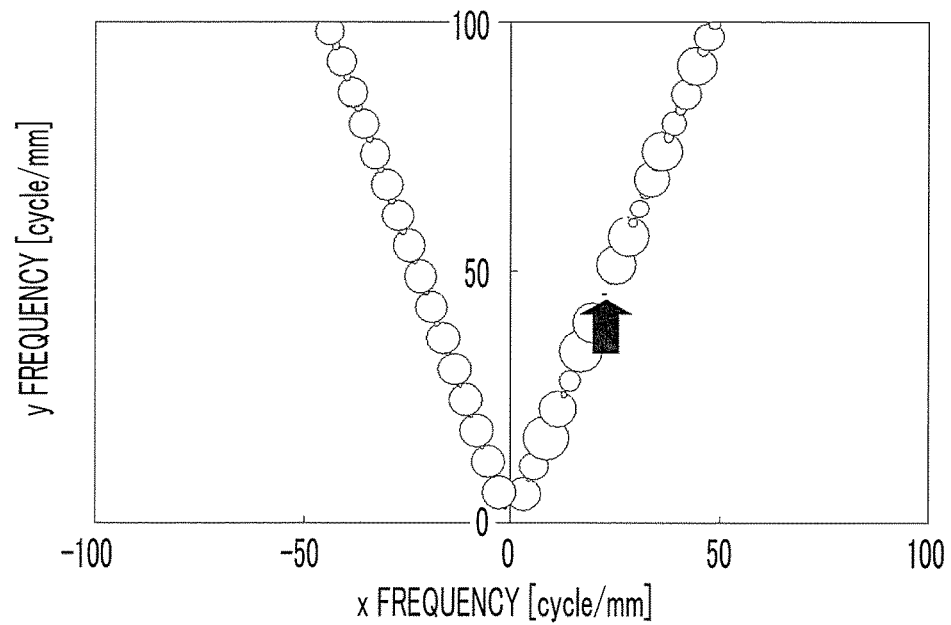
FIG. 39 is a diagram showing a 2-dimensional frequency distribution of the wiring pattern shown in FIG. 37.
Figure 40:
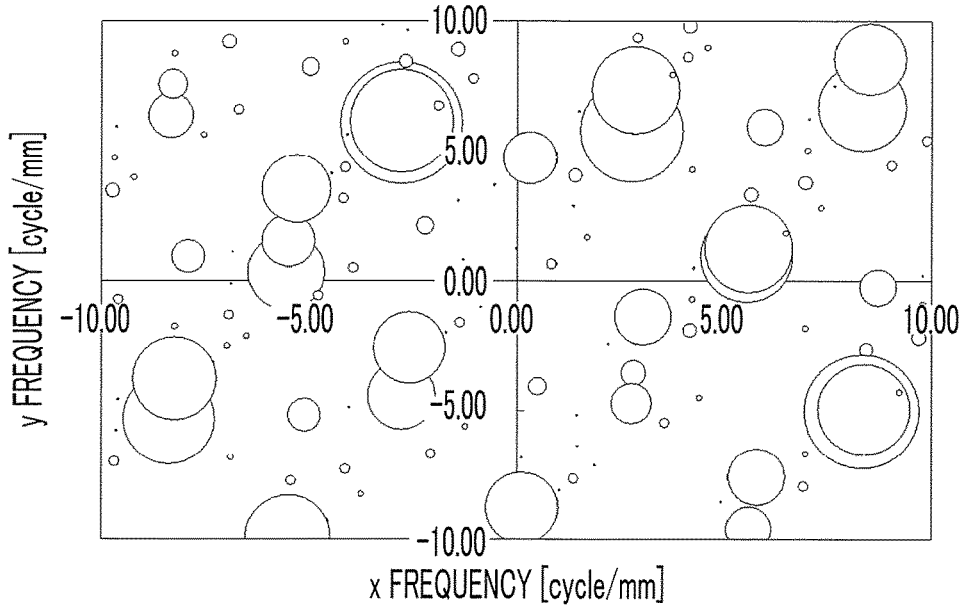
FIG. 40 is a diagram in which moiré components calculated from the frequency components of the pixel array pattern shown in FIG. 14 and each frequency component of the wiring pattern shown in FIG. 39 are plotted.
Figure 41:
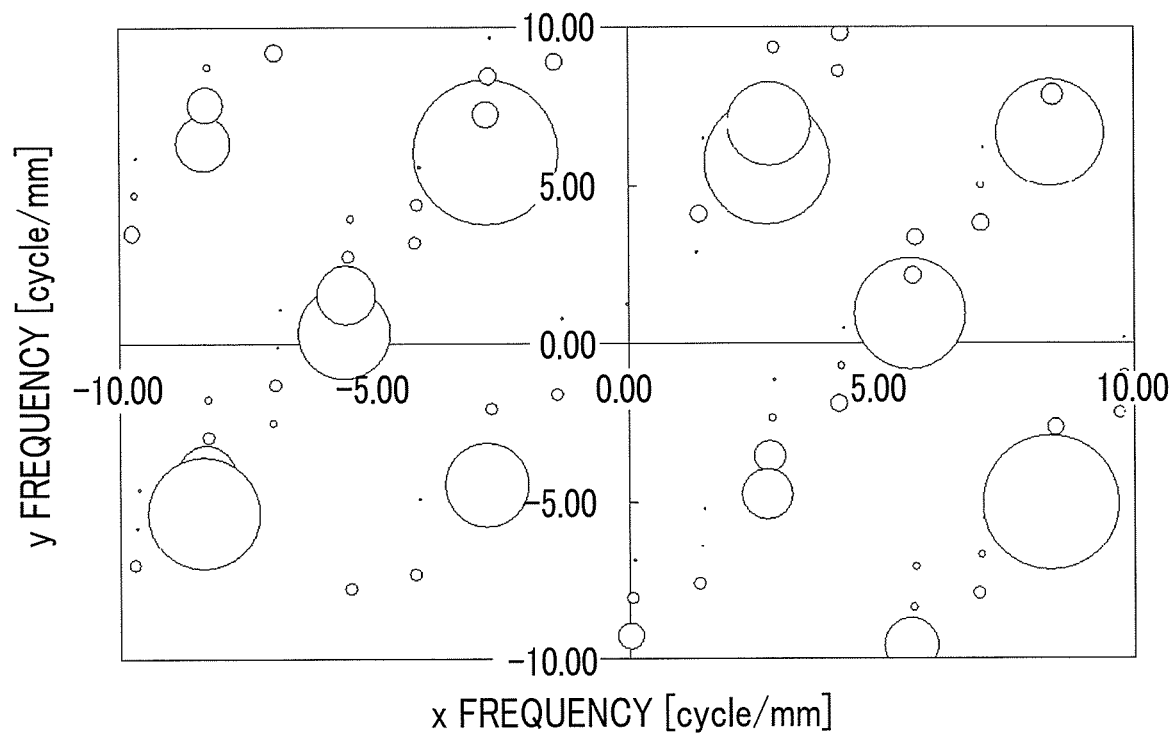
FIG. 41 is a moiré component calculated on the basis of the straight line wiring shown in FIG. 38 among the moiré components shown in FIG. 40.

FIG. 39 is a diagram of a 2-dimensional frequency distribution of the wiring pattern 25e shown in FIG. 37. FIG. 40 is a frequency distribution of moiré of the wiring pattern 25e shown in FIG. 37, and is a diagram in which the moiré components calculated from the frequency components of the pixel array pattern shown in FIG. 14 and the frequency components of the wiring pattern shown in FIG. 39 are plotted. FIG. 41 shows the frequency distribution of the moiré components based on the rightward straight line wiring 21g only. The magnitudes of the intensities indicated by the areas of the circles of the components are the same in the frequency distributions of the wiring patterns shown in FIGS. 39 and 33 and in the moiré frequency distributions shown in FIGS. 40, 41, 34, 35, and 36.

Here, the low-frequency moiré in the moiré frequency distribution based only on the rightward straight line wiring 21*g* (refer to FIG. 38) shown in FIG. 41 is smaller than the low-frequency moiré in the moiré frequency distribution based on only the rightward straight line wiring 21*e* (refer to FIG. 31) shown in FIG. 35.

Figure 42:
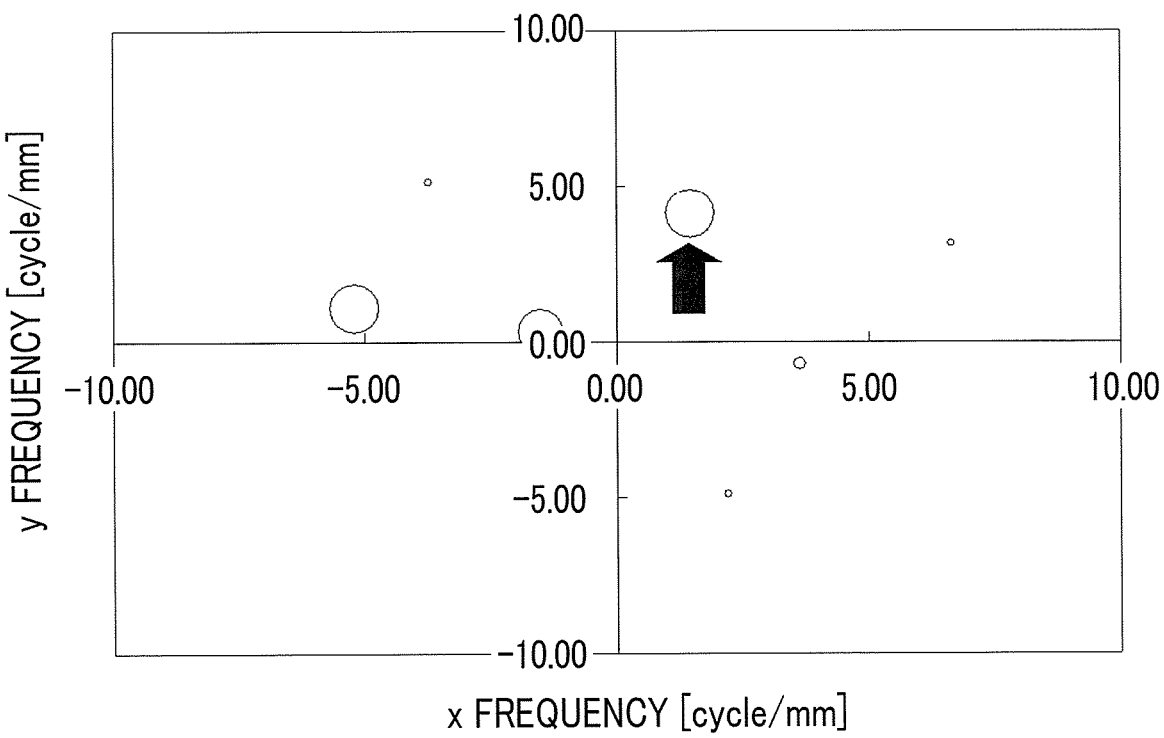
FIG. 42 is a diagram showing a result of multiplying each moiré component shown in FIG. 35 by the sensitivity of the human eye's visual characteristics.
Figure 43:
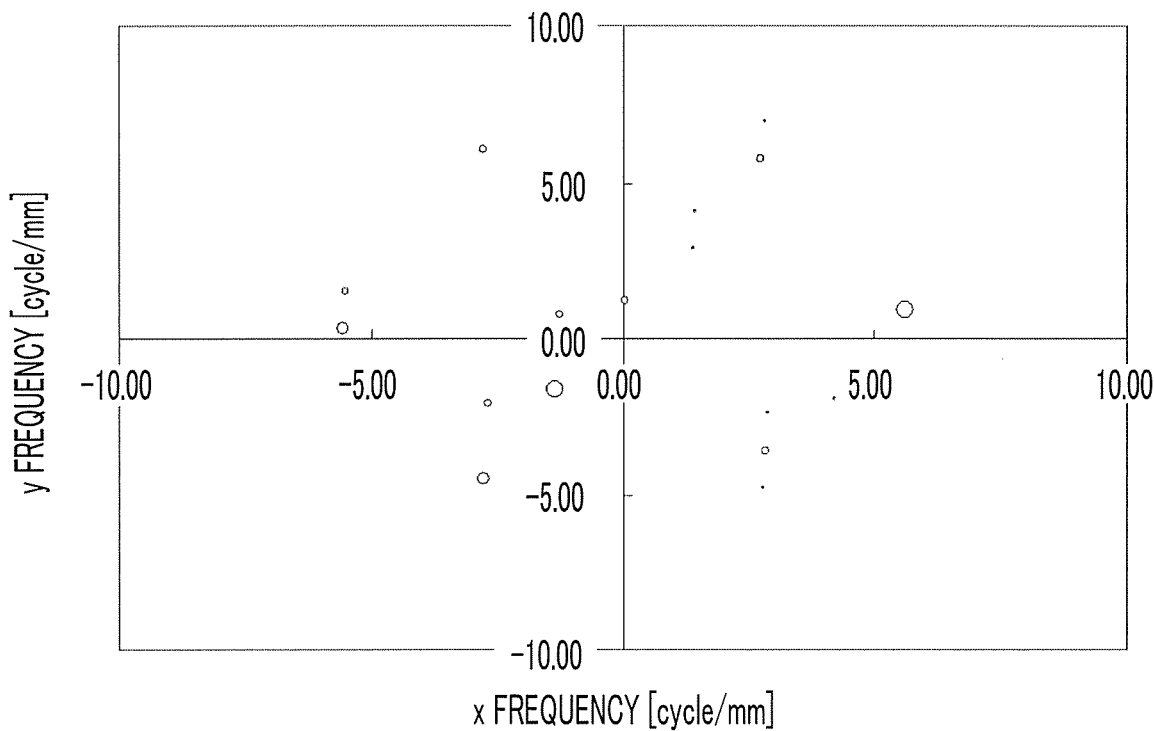
FIG. 43 is a diagram showing a result of multiplying each moiré component shown in FIG. 41 by the sensitivity of the human eye's visual characteristics.

FIG. 42 is a diagram of the moiré frequency distribution obtained by multiplying the moiré component of FIG. 35 by the VTF of Expression (1). FIG. 43 is a diagram of the moiré frequency distribution obtained by multiplying the moiré component of FIG. 41 by the VTF of Expression (1). It can be seen that the sum of moiré components in FIG. 43 is smaller than the sum of moiré components in FIG. 41.

As described above, even in the "wiring pattern in which the average wiring pitch is different in each of two or more directions", by applying "the wiring pattern in which the repetitive pitches of the predetermined number of wirings are set as equal pitches and the respective pitches of the predetermined number of wirings are set as non-equal pitches" in the embodiment of the present invention, moiré can be further reduced. It should be noted that, in FIG. 37, the present invention is applied only to the line wiring pattern in the right direction, but it is apparent that the present invention may be applied to the wiring pattern in the left direction.

However, as described above, in a case where the wiring has a non-equal pitch wiring pattern as in the embodiment of the present invention, a low-frequency component occurs in the frequency of the wiring. Therefore, in a case where the wiring pattern having the non-equal pitch in the direction in which the average wiring pitch is as narrow as possible is applied, there is more room for changing the pitch within the range where the wiring is not visible to the human eye. Accordingly, there is more room for reducing moiré.

In addition, in the case of the wiring pattern 25*e* of the third example shown in FIG. 37, as in the case of the wiring pattern 25*a* shown in FIG. 2, it is considered that moiré is reduced by making four wirings have non-equal pitches. However, as in the case of the wiring pattern 25*a* shown in FIG. 2, as a result, the repetitive pitches of the two wirings are approximately equal pitches. That is, it can be seen that the same moiré reduction effect can be obtained by optimizing the pitches of the two wirings.

(Summary of Characteristics of Wiring Pattern of Embodiment of Present Invention and Method of Producing Wiring Pattern)

The characteristics of the wiring pattern of the embodiment of the present invention will be summarized below, and the method of producing the wiring pattern of the conductive film of the embodiment of the present invention will be described.

To summarize the characteristics of the wiring pattern of the embodiment of the present invention, the wiring pattern of the embodiment of the present invention has the following characteristics.

- A mesh-shaped wiring pattern in which straight line wirings in two or more directions are overlapped, or a mesh-shaped wiring pattern in which straight line wirings in one or more directions and non-straight line wirings in other one or more directions are overlapped.
- For straight line wiring in at least one direction,
- The repetitive pitch of the predetermined number of wirings is equal pitch,
- The respective pitches of the predetermined number of wirings are non-equal pitches.

The wiring pattern of the embodiment of the present invention also has the following characteristics.

- The sum of moiré components (moiré evaluation value) derived from the luminance pattern of the pixel array and the wiring pattern of the non-equal pitch straight line wiring is less than the sum of moiré components of the wiring pattern of the equal pitch straight line wiring with the same average pitch. That is, the moiré evaluation value of the wiring pattern of the non-equal pitch straight line wiring is less than the moiré evaluation values of the wiring patterns of the non-equal pitch straight line wiring and the equal pitch straight line wiring in which the repetitive pitches of the predetermined number of the thin metal wires are equal (hereinafter, the "wiring pattern of the non-equal pitch straight line wiring" is also simply referred to as a "non-equal pitch wiring pattern". Further, the "wiring pattern of the equal pitch straight line wiring" is also simply referred to as an "equal pitch wiring pattern").

Here, the above-mentioned moiré component is a moiré component obtained by applying human eye's visual response characteristics. To act on the human eye's visual response characteristics means to multiply by the visual transfer function VTF (Dooley-Shaw expression) represented by Expression (1). The observation distance d in Expression (1) is any distance in the range of 100 mm to 1000 mm. Here, the observation distance is preferably 300 mm to 800 mm. However, in the example of the embodiment of the present invention, the observation distance was set to 500 mm.

Further, as the method of calculating the sum of moiré components, that is, the moiré evaluation value I, it is preferable to use Expression (2), which is proposed by Quick et al., as an approximation of the stochastic addition model in the past visual sense research.

$$I = (\Sigma (R[i]^x))^{1/x} \tag{2}$$

Here, R[i] indicates the intensity of the i-th frequency component of the moiré, that is, each moiré component after VTF multiplication (refer to FIGS. 17, 26, 29, 42, and 43). The order x is a certain value in the range of 1 to 4, which has been proposed as an order that fits well with the visual experiment results in the past visual sense research. As a typical order, the order x=2 presented by Quick is employed.

Among the moiré components after VTF multiplication (refer to FIGS. 17, 26, 29, 42, and 43), the component having the highest intensity is defined as the main moiré component, the main moiré component based on the non-equal pitch wiring pattern of the embodiment of the present invention is defined as a non-equal pitch main moiré component, and the main moiré component based on the equal pitch wiring pattern having the same average pitch is defined as an equal pitch main moiré component. With such definitions, the wiring pattern of the embodiment of the present invention also has one of the following characteristics.

- The intensity of the non-equal pitch main moiré component is smaller than that of the equal pitch main moiré component.
- The sum of moiré components in the frequency range equal to or less than the frequency of the equal pitch main moiré component is smaller than that of the equal pitch wiring pattern.

Further, the frequency component of the wiring pattern that causes the main moiré component is defined as the main wiring frequency component, the main wiring frequency component of the non-equal pitch wiring pattern of the embodiment of the present invention is defined as the non-equal pitch main wiring frequency component, and the main wiring frequency component of the equal pitch wiring pattern having the same average pitch is defined as the equal pitch main wiring frequency component. With such definitions, the wiring pattern of the embodiment of the present invention also has any of the following characteristics.

The intensity of the non-equal pitch main wiring frequency component is less than that of the equal pitch main wiring frequency component.

The intensity at the frequency of the equal pitch main wiring frequency component is less than that in the equal pitch wiring pattern.

From the characteristic in which "the intensity at the frequency of the equal pitch main wiring frequency component is less than that of the equal pitch wiring pattern" in the embodiment of the present invention, the characteristics relating to the wiring pitch of the embodiment of the present invention is also derived. The characteristics will be specifically described in the examples shown in FIGS. 2 and 12.

Here, in the example shown in FIG. 2, the repetitive pitches of the two wirings are approximately equal, but for the sake of explanation, the repetitive pitches of the four wirings are regarded as the equal pitches. First, the frequency of the main wiring frequency component of the wiring pattern in FIG. 12 is the frequency of the component indicated by the black arrow in FIG. 15. The component indicated by the black arrow in FIG. 15 is the fifth component counted from the side close to the frequency 0. Since the wiring pitch in FIG. 12 is 101 µm, the frequency of the first component in FIG. 15 is approximately 9.9 cycle/mm (=1000 µm/101 µm). The frequency mentioned herein represents the frequency in the wiring direction (the angle to the y direction is 26°). The frequency of the fifth component is 49.5 cycle/mm (=9.9 cycle/mm*5).

In the example shown in FIG. 2 of the embodiment of the present invention, since the intensity at the frequency of 49.5 cycle/mm of this equal pitch main wiring frequency component (the intensity of the component indicated by the black arrow in FIG. 24) is small, the characteristics relating to the wiring pitch are derived.

Figure 44:
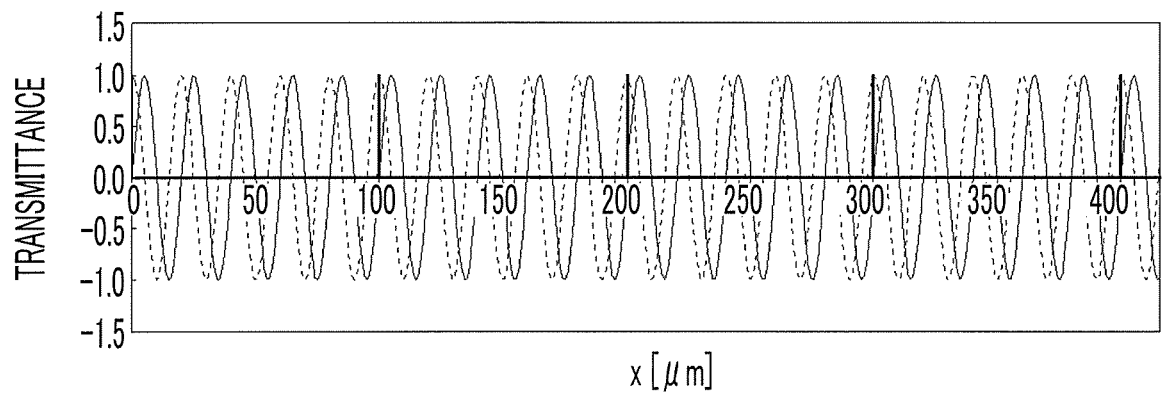
FIG. 44 is a graph showing a 1-dimensional profile of the transmittance pattern of the wiring shown in FIG. 12 and a cosine wave and a sine wave of a main wiring frequency component.
Figure 45:
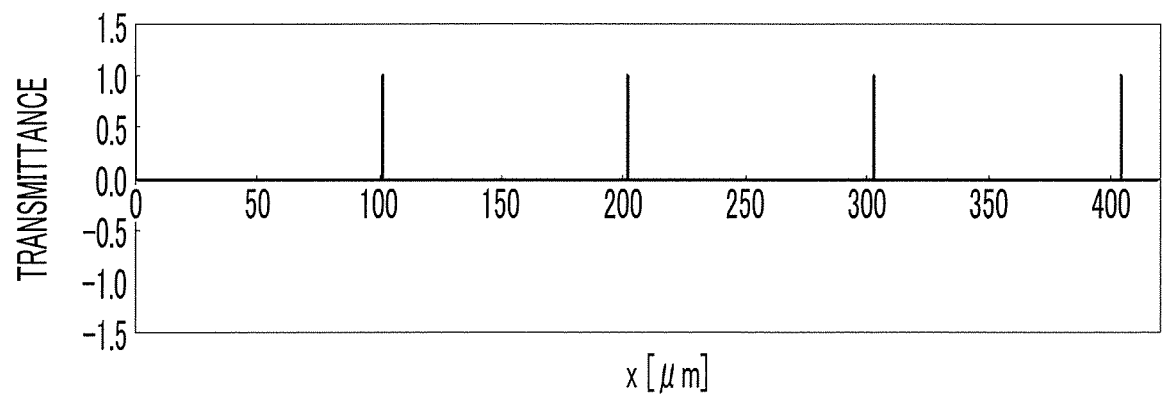
FIG. 45 is a graph showing a profile obtained by multiplying a 1-dimensional profile of the transmittance pattern of the wiring shown in FIG. 44 by a cosine wave.

The thick solid line in FIG. 44 is a 1-dimensional profile of a straight line wiring in one direction, that is, the straight line wiring 21d in the right direction or the straight line wiring 21c in the left direction, as viewed in the wiring direction, in the transmittance pattern of the wiring in FIG. 12. For the sake of explanation, in the profile of this thick solid line, the transmittances 1 and 0 are inverted, that is, the transmittance of a portion without wiring is set to 0 and the transmittance of a portion with wiring is set to 1. In addition, the width of the wiring is represented by an infinitesimal. Assuming that the position of the first wiring is 0 µm, it would appear that, from this wiring, there are second, third, fourth, and fifth wirings at positions 101 µm, 202 µm, 303 µm, and 404 µm at an equal pitch of 101 µm, respectively. FIG. 44 also shows a cos (cosine) wave (dotted line) and a sin (sine) wave (solid line) having a frequency of 49.5 cycle/mm of the main wiring frequency component. The values obtained by multiplying the transmittance profile in FIG. 44 by the cosine wave and the sine wave in FIG. 44 and performing integration therefor with respect to all positions correspond to the real part and the imaginary part of the main wiring frequency component, respectively. The square root of the sum of squares of the real part and the imaginary part is the intensity of the main wiring frequency component. It can be seen from FIG. 44 that all of the first to fifth wirings belong to the section where the cosine wave has a positive value. FIG. 45 shows a profile obtained by multiplying the transmittance profile of the wiring by a cosine wave. All the transmittances of the first to fifth wirings have positive values. It can be seen that the integral value of the transmittance of these wirings is the real part at the frequency of 49.5 cycle/mm of the main wiring frequency component, and this value becomes large. In addition, since the first to fifth wirings in FIG. 44 are all distributed around 0 in the sine wave, the value obtained by multiplying by the sine wave and performing integration therefor becomes small. That is, it can be seen that the imaginary part at the frequency of 49.5 cycle/mm is a value close to 0. That is, here, it can be seen that the intensity of the main wiring frequency component is determined by the real part and has a large value.

Figure 46:
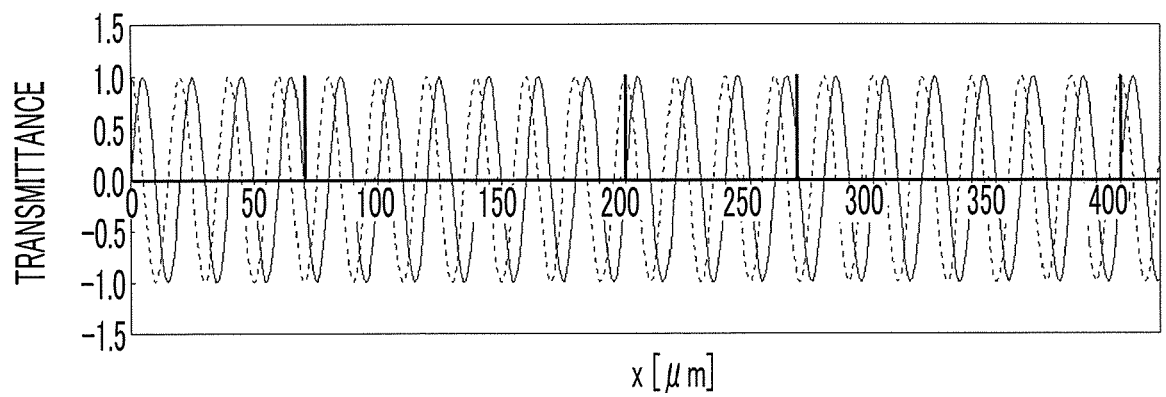
FIG. 46 is a graph showing a 1-dimensional profile of the mesh-shaped wiring pattern (transmittance pattern of the wiring) shown in FIG. 2 and a cosine wave and a sine wave of a main wiring frequency component.
Figure 47:
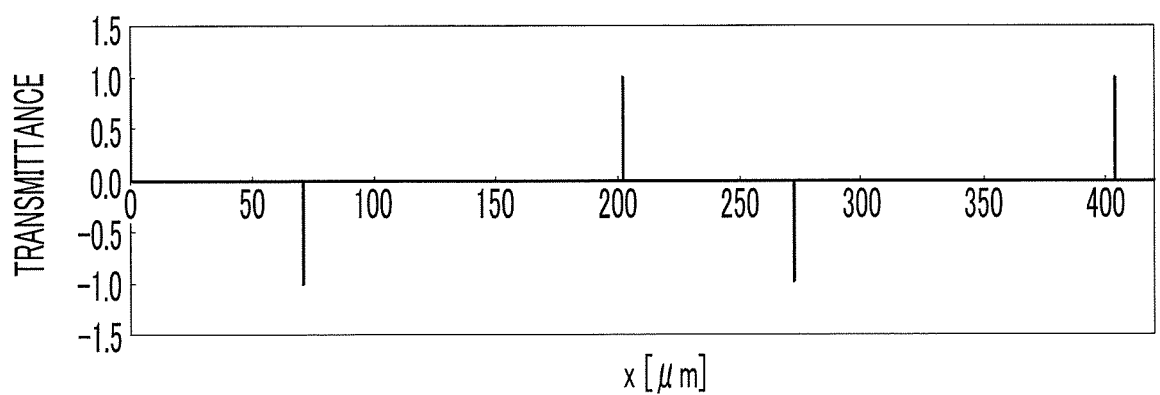
FIG. 47 is a graph showing a profile obtained by multiplying the 1-dimensional profile of the transmittance pattern of the wiring shown in FIG. 46 by a cosine wave.

Next, in FIG. 46, in the transmittance pattern of the wiring shown in FIG. 2, the thick solid line indicates the 1-dimensional profile of the transmittance pattern of the straight line wiring in one direction, that is, the straight line wiring 21a in the right direction or the straight line wiring 21b in the left direction. FIG. 46 is different from FIG. 44 only in the transmittance profile, and is the same as FIG. 44 in other respects. In FIG. 46, assuming that the position of the first wiring is 0 µm, there are second, third and fourth wirings at positions 71 µm, 202 µm and 272 µm from this wiring, respectively. Here, since the repetitive pitches of the four wirings are equal pitches of 404 µm (=101 µm*4), the position of the fifth wiring is 404 µm. Further, since the four wirings are repeated at an equal pitch of 404 µm, all the frequency components forming this wiring pattern are repeated at a pitch of 404 µm. Thus, here, it suffices to focus on only the first to fourth wirings in the section of 404 µm (the fifth wiring is the repetition of the first wiring, the sixth wiring is the repetition of the second wiring, . . . ). It can be seen from FIG. 46 that the first and third wirings belong to the section where the cosine wave has a positive value, and the second and fourth wirings belong to the section where the cosine wave has a negative value. FIG. 47 shows a profile obtained by multiplying the transmittance profile of FIG. 46 by a cosine wave. It can be seen from FIG. 47 that the transmittances of the first and third wirings are positive values and the transmittances of the second and fourth wirings are negative values. From this, it can be seen that the real part at the frequency of 49.5 cycle/mm of the equal pitch main wiring frequency component obtained by integrating these values becomes a small value. Here, since the first to fourth wirings in FIG. 46 are all distributed around 0 of the sine wave, the value obtained by multiplying by the sine wave and performing integration therefor becomes small. That is, it can be seen that the imaginary part at the frequency of 49.5 cycle/mm is a value close to 0. That is, here, it can be seen that the intensity of the main wiring frequency component is determined by the real part and has a small value.

The above configuration is similarly shown by comparing the wiring pattern of the straight line wiring 21e in the right direction of FIG. 31 with the wiring pattern of the straight line wiring 21g in the right direction of FIG. 38. First, the frequency of the main wiring frequency component of the wiring pattern of the straight line wiring 21e in the right direction of FIG. 31 is the frequency of the component indicated by the black arrow in FIG. 33. The component indicated by the black arrow in FIG. 33 is the fourth component counted from the side close to frequency 0. In a case where the wiring pitch of the straight line wiring 21e shown in FIG. 31 is 79 µm, the frequency of the first component in FIG. 33 is 1000 μm/79 μm 12.66 cycle/mm, and the frequency of the fourth component is 12.66 cycle/mm*4≈50.6 cycle/mm.

Figure 48:
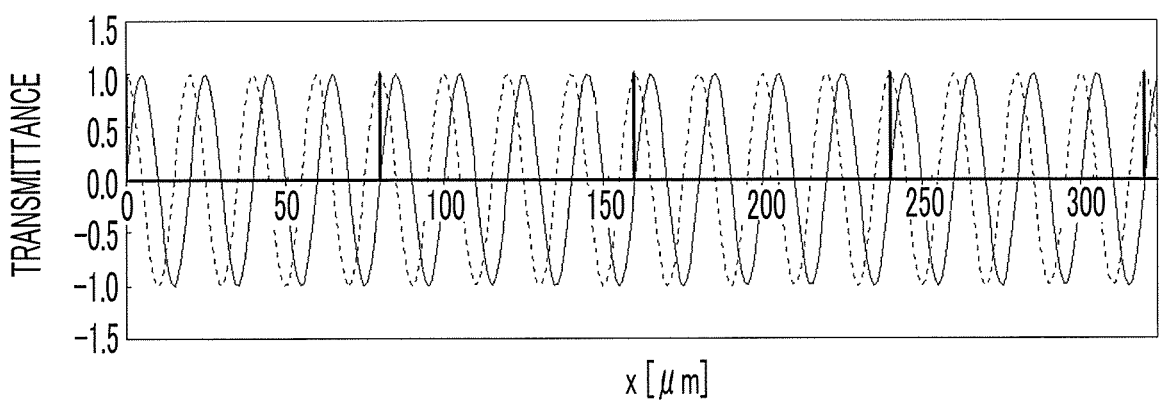
FIG. 48 is a graph showing a 1-dimensional profile of an equal pitch wiring pattern (transmittance pattern of the wiring) shown in FIG. 31 and a cosine wave and a sine wave of a main wiring frequency component.
Figure 49:
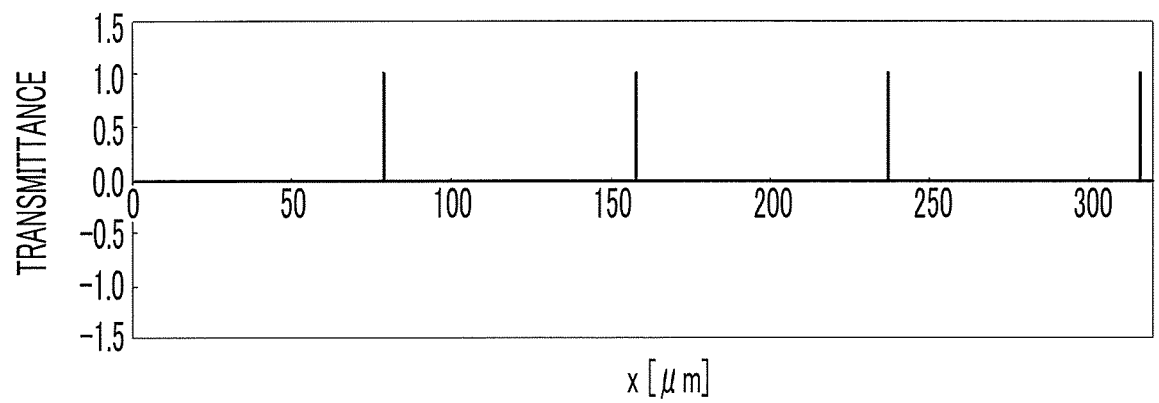
FIG. 49 is a graph showing a profile obtained by multiplying a 1-dimensional profile of the transmittance pattern of the wiring shown in FIG. 48 by a cosine wave.

FIG. 48 shows the cosine wave (dotted line) and sine wave (solid line) of the frequency of the main wiring frequency component. Further, in FIG. 48, the thick solid line indicates the transmittance profile (1 and 0 are inverted) of the wiring pattern of the straight line wiring 21e in the right direction shown in FIG. 31. Assuming that the position of the first wiring is set to 0 μm, it would appear that there are second, third, fourth, and fifth wirings at positions 79 μm, 158 μm, 237 μm, and 316 μm at an equal pitch of 79 μm from this wiring, respectively. FIG. 49 shows a profile obtained by multiplying a wiring transmittance profile by a cosine wave.

Figure 50:
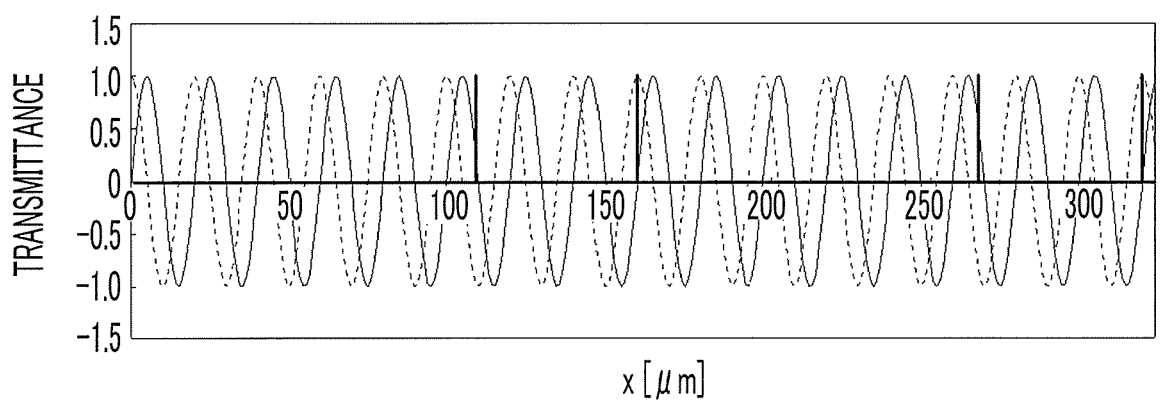
FIG. 50 is a graph showing a 1-dimensional profile of the non-equal pitch wiring pattern (transmittance pattern of the wiring) shown in FIG. 38 and a cosine wave and a sine wave of a main wiring frequency component.

The thick solid line in FIG. 50 indicates the transmittance profile of the wiring pattern of the straight line wiring 21g in the right direction shown in FIG. 38. FIG. 50 is different from FIG. 48 only in the transmittance profile, and is the same as FIG. 48 in other respects. In FIG. 50, assuming that the position of the first wiring is 0 μm, there are second, third, and fourth wirings at positions 108 μm, 158 μm, and 265 μm from this wiring, respectively. Here, since the repetitive pitches of the four wirings are equal pitches of 79 μm*4=316 μm, the position of the fifth wiring is 316 μm. It can be seen from FIG. 50 that the first and third wirings belong to the section where the cosine wave has a positive value, and the second and fourth wirings belong to the section where the cosine wave has a negative value.

Figure 51:
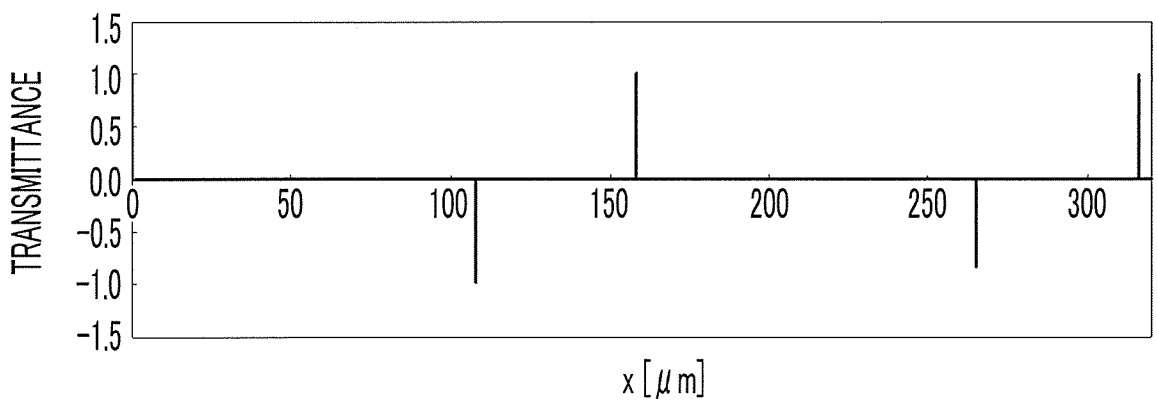
FIG. 51 is a graph showing a profile obtained by multiplying a 1-dimensional profile of the transmittance pattern of the wiring shown in FIG. 50 by a cosine wave.

FIG. 51 shows a profile obtained by multiplying the transmittance profile of FIG. 50 by a cosine wave. It can be seen from FIG. 51 that the transmittances of the first and third wirings are positive values and the transmittances of the second and fourth wirings are negative values. From this, it can be seen that the real part at the frequency of 50.6 cycle/mm of the equal pitch main wiring frequency component obtained by integrating these values becomes a small value. Here, since the first to fourth wirings in FIG. 50 are all distributed around 0 in the sine wave, the value obtained by multiplying by the sine wave and performing integration therefor becomes small. That is, it can be seen that the imaginary part at the frequency of 50.6 cycle/mm is a value close to 0. That is, here, it can be seen that the intensity of the main wiring frequency component is determined by the real part and has a small value.

From the above description, the characteristics of the wiring pitch of the embodiment of the present invention are summarized. In the examples of FIGS. 44 to 47 and 48 to 51, in the case of the equal pitches belong to a section where the cosine wave of the frequency of the main wiring frequency component in which all the pitches of the first, second, third, and fourth wirings from the first wiring are equal pitches has a positive value. On the other hand, in the case of the non-equal pitches of the embodiment of the present invention, the number of (first and third) non-equal pitches belonging to the section where the cosine wave has a positive value is equal to the number of (second and fourth) non-equal pitches belonging to a section where the cosine wave has a negative value. Here, in the example of FIGS. 44 and 48, all the four wirings may be wirings of which the pitches belong to the section where the cosine wave has a positive value but are not equal pitches and belong to the section where the cosine wave has a negative value in a case where the irregularity is provided to the pitches. In other words, the first wiring constantly belongs to the section in which the cosine wave has a positive value (since the pitch is 0), but the other wirings are made to be irregular. Thereby, each pitch thereof may change by an amount corresponding to a phase larger than ±π/2 from the pitch of the equal pitch wiring and may belong to the section where the cosine wave has a negative value.

However, even in a case where the pitches are simply made to be irregular, there is a bias in the number of wirings belonging to the positive value section in the cosine wave and the number of wirings belonging to the negative value section in the cosine wave. Therefore, as a result of multiplying by the cosine wave and performing integration therefor, there is a positive/negative bias in the transmittances of the wirings after the cosine wave multiplication, and the transmittances are not canceled sufficiently. As a result, the absolute value of the real part at the frequency of the equal pitch main wiring frequency component is a larger value than the absolute value thereof in the embodiment of the present invention.

That is, as in the embodiment of the present invention, in order to sufficiently reduce the intensity at the frequency of the equal pitch main wiring frequency component, it is necessary to optimize the pitch such that the number of wirings belonging to the positive value section in the cosine wave is approximately equal to the number of wirings belonging to the negative value section in the cosine wave. In the embodiment of the present invention, as a result of studying the optimization of the wiring pitch such that "the intensity at the frequency of the equal pitch main wiring frequency component is less than that of the equal pitch wiring pattern", a difference between the number belonging to the positive value section in the cosine wave and the number belonging to the negative value section in the cosine wave is ±1 or less.

On the other hand, even in a case where the number belonging to the positive value section in the cosine wave and the number belonging to the negative value section in the cosine wave are approximately set to be equal to each other, the intensity at the frequency of the equal pitch main wiring frequency component may not be made to be sufficiently small. That is, since the intensity at the frequency of the equal pitch main wiring frequency component is the square root of the sum of squares of the real part and the imaginary part, it is necessary to reduce not only the real part but also the imaginary part. That is, it is necessary for the number belonging to the positive value section and the number belonging to the negative value section in not only the cosine wave (corresponding to the real part) but also the sine wave (corresponding to the imaginary part) to be approximately equal. However, as in the examples of FIGS. 46 to 47 and FIGS. 50 to 51, in a case where the pitch of each wiring is in the section having a small value around 0 in the sine wave, the contribution of the imaginary number to the intensity is small. Therefore, even in a case where there is a bias in the number belonging to the positive value section in the sine wave and the number belonging to the negative value section in the sine wave, the effect of increasing the intensity is small.

In summary, as in the embodiment of the present invention, in order to sufficiently reduce the intensity at the frequency of the equal pitch main wiring frequency component, it is necessary to make approximately equal (±1 or less) the number of wirings belonging to the positive value section and the number of wirings belonging to the negative value section in at least one wave (which has a larger contribution to the intensity) of the cosine wave or the sine wave of the frequency of the equal pitch main wiring frequency component.

In a case where the position of the first wiring is 0, a positive value section in the cosine wave is given by $(N-0.25)*T<x<(N+0.25)*T$, and a negative value section in the cosine wave is given by $(N+0.25)*T<x<(N+0.75)*T$. On the other hand, the positive value section of the sine wave is given by $N*T<x<(N+0.5)*T$, and the negative value section in the sine wave is $(N+0.5)*T<x<(N+1.0)*T$. Here, N represents an integer of 0, 1, . . . T represents the period of the equal pitch main wiring frequency component, and has a relationship of 1000/F (μm), where F (cycle/mm) is the frequency of the equal pitch main wiring frequency component.

Therefore, it can be said that the wiring of the embodiment of the present invention has the following characteristics.

In a case where the predetermined number of wirings is n and each wiring is wiring 1, wiring 2, . . . , wiring n, the pitch p of each wiring with the wiring 1 set as the origin satisfies at least one of Conditions 1 or 2.

Condition 1: The difference between the number of thin metal wires belonging to the section where the pitch p is $(N-0.25)*T<p<(N+0.25)*T$ and the number of thin metal wires belonging to the section where the pitch p is $(N+0.25)*T<p<(N+0\ 0.75)*T$ is equal to or less than 1.

Condition 2: The difference between the number of thin metal wires belonging to the section where the pitch p is $N*T<p<(N+0.5)*T$ and the number of thin metal wires belonging to the section where the pitch p is $(N+0.5)*T<p<(N+1.0)*T$ is equal to or less than 1.

Here, T is the period of the main wiring frequency component of the equal pitch wiring having the same average pitch, and is given by 1000/F (μm) (1/F (mm)), where F (cycle/mm) is the frequency of the equal pitch main wiring frequency component. N is an integer of 0, 1, . . . , and is an integer of (n*PA/T) or less where PA is the average pitch.

Condition 1 of the above characteristic indicates the characteristic that "the number of wirings belonging to the positive value section and the number of wirings belonging to the negative value section in the cosine wave are approximately equal".

Condition 2 of the above characteristic indicates the characteristic that "the number of wirings belonging to the positive value section and the number of wirings belonging to the negative value section in the sine wave are approximately equal".

In order to determine the above characteristics, in a case of counting the number of wirings belonging to the positive or negative value section in the cosine wave or the sine wave, each wiring located around 0 of the cosine wave or the sine wave should be removed because the wiring causes a counting error. Therefore, the above characteristics can be redefined as follows.

In a case where the predetermined number of wirings is n and each wiring is wiring 1, wiring 2, . . . , wiring n, the pitch p of each wiring with the wiring 1 set as the origin satisfies at least one of Conditions 1 or 2.

Condition 1: a difference between the number of thin metal wires where the pitch p belongs to an interval of $(N-d)*T<p<(N+d)*T$ and the number of thin metal wires where the pitch p belongs to an interval of $(N+0.5-d)*T<p<(N+0.5+d)*T$ is equal to or less than 1.

Condition 2: a difference between the number of thin metal wires where the pitch p belongs to an interval of $(N+0.25-d)*T<p<(N+0.25+d)*T$ and the number of thin metal wires where the pitch p belongs to an interval of $(N+0.75-d)*T<p<(N+0.75+d)*T$ is equal to or less than 1.

Here, T is the period of the main wiring frequency component of the equal pitch wiring having the same average pitch, and is given by 1000/F (μm) (1/F (mm)), where F (cycle/mm) is the frequency of the equal pitch main wiring frequency component. That is, The period is given by 1/F, where F is the frequency of the frequency component of the equal pitch wiring pattern, which causes the frequency component of moiré that contributes most to the moiré in the equal pitch wiring pattern. Alternatively, T is a period given by 1/F where F is the frequency of the frequency component of the wiring pattern of the thin metal wires causing a frequency component of the moiré that contributes most to the moiré in the wiring pattern being composed of only thin metal wires of any of the thin metal wire 1, the thin metal wire 2, . . . , and the thin metal wire n.

N is an integer of 0, 1, . . . (0 or a positive integer), and is an integer of (n*PA/T) or less, where PA is the pitch (average pitch) of the equal pitch wiring pattern.

Further, d is a certain value in the range of 0.025 to 0.25.

The above d indicates the range of the section centered on the maximum or minimum position of the cosine wave or sine wave. In a case where d is 0.25, d indicates the entire range of the section where the cosine wave or sine wave has a positive value or a negative value. In a case where d is 0.025, d indicates a range of ⅟₁₀ of the section in which the cosine wave or sine wave has a positive value or a negative value. The smaller the value of d, the more only the wirings that make a large contribution to the magnitude of the real part or the imaginary part are counted.

As already described in the section "Principle of Moiré Reduction According to Embodiment of Present invention", each wiring pattern obtained by extracting only the first wiring, . . . , the n-th wiring with a predetermined number of wirings as n is defined as a sub-wiring pattern. In such a manner, the wiring pattern of the embodiment of the present invention is wiring patterns overlapped at a pitch where the frequency components that cause moiré s included in the respective sub-wiring patterns are mutually canceled out. That is, the largest moiré component visible to the human eye in a case where the sub-wiring pattern is overlapped on the pixel array pattern (the moiré component having the highest intensity after VTF multiplication) is defined as the sub-main moiré component. In a case where the frequency component of the sub-wiring pattern that causes the sub-main moiré component is defined as the sub-main frequency component, the wiring of the embodiment of the present invention has exactly the same characteristics as described above, where T is the period of the sub-main wiring frequency component. In other words, the pitch of the pitch of the wiring pattern of the embodiment of the present invention is a pitch where the frequency components causing moiré included in the sub-wiring pattern are mutually canceled out. Therefore, at least the sub-main wiring frequency components causing the largest moiré are canceled with a pitch that satisfies the above characteristics. Here, since the frequency component of the sub-wiring pattern is present at a frequency that is n times finer while including the frequency of the frequency component of the equal pitch wiring pattern. Therefore, the sub-main wiring frequency component and the equal pitch main wiring frequency component do not necessarily coincide with each other. However, the frequency components coincide with each other in the example of FIG. 15 (example of FIG. 21) and the example of FIG. 33.

As described above, the present invention has a restriction that the wiring pitches in JP2013-214545A and JP2016-014929A are irregular and that "the predetermined number of repetitive pitches are equal pitches". As shown in FIG. 27 to FIG. 29 already presented, in a case where the number of non-equal pitches is increased, the frequency component of the wiring pattern spreads finely. As a result, a large number of fine moiré components (visible as irregular noise) occur. As described above, according to the findings of the present inventor, the wiring pattern is not visible, and in order to sufficiently reduce moiré, it is desirable to set the number of non-equal pitches to 16 or less at most. As one of the reasons why the moiré reduction effect does not change or worsen even in a case where the predetermined number is increased, as described above, the present inventor considers the following reason. Since a large number of moiré components are generated, no matter how the wiring pitch is optimized, it is difficult to remove all of the large number of moiré components from the low frequency range visible to the human eye (to keep all of the frequency components of the large number of wiring patterns away from the frequency components of the pixel array pattern).

In the embodiment of the present invention, there is no description in the prior patent that it is necessary to make the predetermined number of repetitive pitches as equal pitches and that the predetermined number is preferably 16 or less. It can also be said that this restriction is a characteristic of the embodiment of the present invention.

Whether or not the wiring pattern has the characteristics of the embodiment of the present invention can be easily specified from the light emission luminance pattern of the pixel array and the transmittance pattern of the wiring. It may be determined whether or not the following requirements are satisfied: the wiring pattern is a "mesh-shaped wiring pattern in which straight line wirings in two or more directions are overlapped, or a mesh-shaped wiring pattern in which straight line wirings in one or more directions and non-straight line wirings in other one or more directions are overlapped"; and "a straight line wiring in at least one direction has the repetitive pitches of the predetermined number of wirings as equal pitches and the respective pitches of the predetermined number of wirings as non-equal pitches". Further, it may be determined whether or not the above characteristics are satisfied by "distribution of the frequency components of the wiring pattern of the non-equal pitch straight line wiring", or "distribution of the moiré components derived from the pixel array pattern and the wiring pattern of the non-equal pitch straight line wiring", or "the pitch of the non-equal pitch straight line wiring".

Hereinafter, an implementation method for deriving the wiring pattern of the embodiment of the present invention will be described.

The present invention is defined by the characteristics of the frequency distributions shown in FIGS. 24, 25, and 26, as compared to the frequency distributions of the equal pitch wiring pattern shown in FIGS. 15, 16, and 17, and defined by the characteristics of the pitch shown in FIG. 46 or 47 as compared with the pitch shown in FIG. 44 or 45 of the equal pitch wiring pattern, regardless of a method of obtaining a wiring pattern having these characteristic frequency distributions and/or pitches. For example, in a case where the predetermined number is set to four, the frequency distribution of the pixel array pattern of FIG. 14 is derived, and the distributions of FIGS. 15, 16 and 17 in the case of equal pitches are derived, four of them are derived. Thereafter, the pitches of the four wirings are variously changed by trial and error, and the frequency distributions shown in FIGS. 24, 25, and 26 are derived such that whether or not the moiré is reduced is evaluated as compared with the case of the equal pitch. In a case where the moiré is reduced, the selection may be repeated to obtain an optimum wiring pattern. Whether or not moiré can be reduced can be determined from the above-mentioned distributions as follows.

Referring to FIG. 14, by comparing FIG. 15 and FIG. 24, the main wiring frequency component having the largest moiré component with the pixel array pattern is specified, and it is evaluated whether the component becomes small.

Comparing FIG. 16 and FIG. 25, it is evaluated whether various moiré components including the main moiré component having the highest intensity have become small in the low frequency range visible to the human eye, for example, in the frequency range of 5 cycle/mm or less.

Comparing FIG. 17 and FIG. 26, it is evaluated whether various moiré components including the main moiré component and visible to the human eye become small.

As described above, it is possible for a person to obtain an optimum wiring pattern by trial and error by deriving the distributions shown in FIGS. 14, 15, 16, 17, 24, 25, and 26. At that time, as shown in FIGS. 46 and 47, focusing on the relationship between the cosine wave of the main wiring frequency component and the sine wave and the pitch, the pitch may be adjusted such that the number of wirings, of which the transmittances multiplied by the cosine wave or the sine wave are positive or negative, is equal. The relationship diagrams of the cosine wave, the sine wave, and the pitch as shown in FIGS. 46 and 47 can be created not only for the main wiring frequency component but also for various wiring frequency components that cause moiré.

Further, as described above, by setting the wiring pitches as non-equal pitches as in the embodiment of the present invention, a frequency component lower than that of the equal pitch wiring occurs. Therefore, there is a concern that the wiring pattern may be visible. Therefore, regarding the low-frequency component generated by setting the wiring pitches as non-equal pitches, for example, in a case where the predetermined number is 4, also at ¼, 2/4, and ¾ of the minimum frequency of the original equal pitch wiring, the relationship diagrams of the cosine wave, the sine wave, and the pitch as shown in FIGS. 46 and 47 may be created. Among the frequency components of the wiring, regarding the frequency components that cause moiré and the low-frequency components that affect visibility of the wiring, the relationship diagrams of the cosine wave, the sine wave, and the pitch as shown in FIGS. 46 and 47 are created. Thereby, it is possible to adjust the pitch such that each frequency component does not become large while looking at the diagrams.

Regarding the main wiring frequency component, it is desirable to adjust the pitch such that the number of wirings, of which the transmittances multiplied by the cosine wave or the sine wave are positive or negative, is as equal as possible. However, regarding other moiré and frequency components that make a small contribution to the wiring visibility, the number of wirings, of which the transmittances multiplied by the cosine wave or the sine wave are positive or negative, does not necessarily become equal. Thus, the number may be set to be small in a less effective range.

As described above, it is possible for a person to obtain the optimum wiring pattern by trial and error by using the distributions shown in FIGS. 14, 15, 16, 17, 24, 25, and 26, and the diagrams shown in FIGS. 46 and 47. On the other hand, it is also possible to automatically obtain the optimum wiring pattern.

Hereinafter, the producing method of the wiring pattern of the conductive film of the embodiment of the present invention for obtaining an optimum wiring pattern automatically will be described. That is, the method of automatically optimizing the wiring pattern of the conductive film of the embodiment of the present invention will be described.

Figure 52:
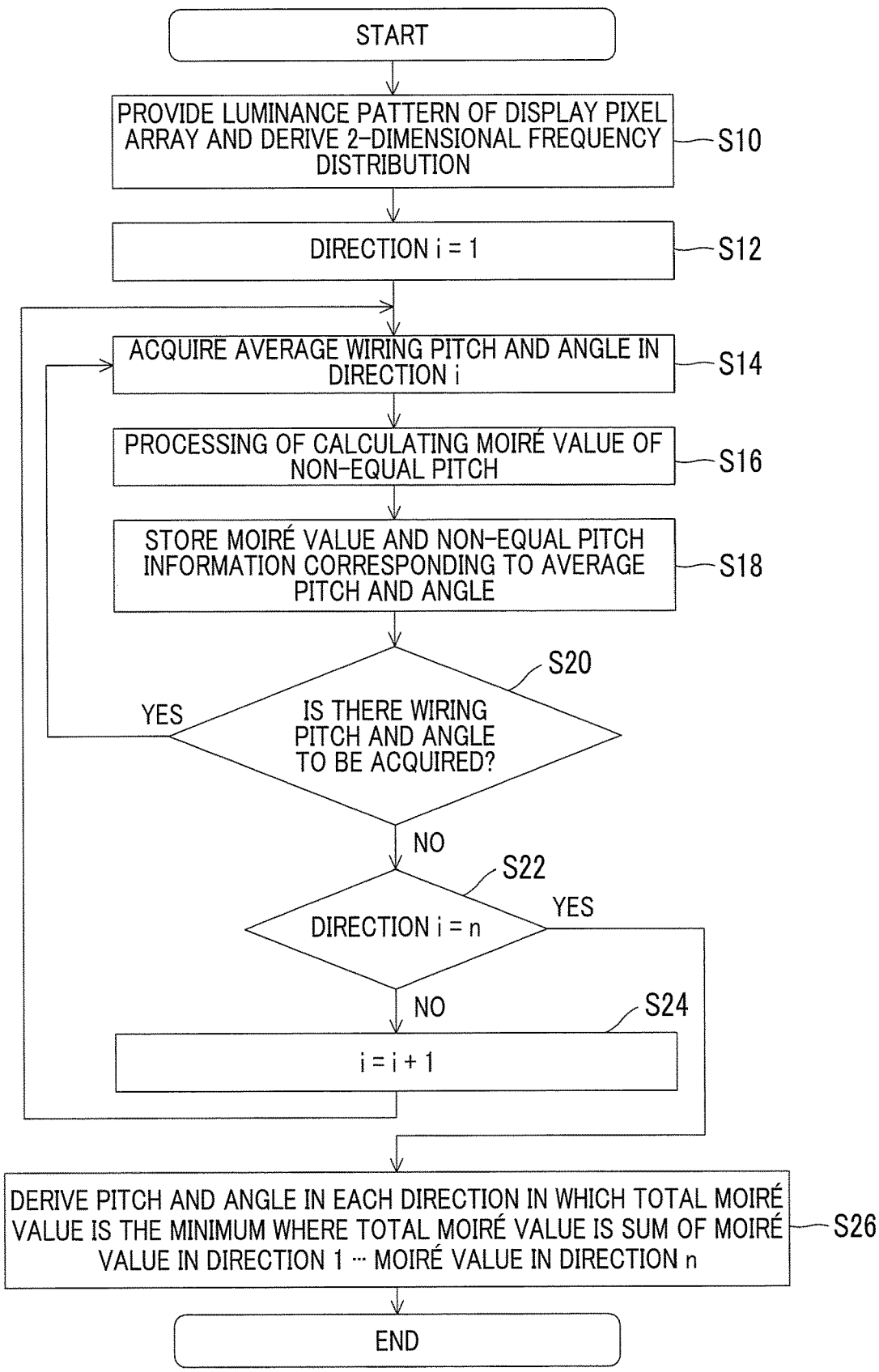
FIG. 52 is a flowchart showing an example of a method of producing a wiring pattern of the conductive film according to the embodiment of the present invention.

FIG. 52 shows a flow of a method of producing a wiring pattern of a conductive film of the embodiment of the present invention.

In addition, hereinafter, description will be given on the premise that the line wirings in all directions to be overlapped as the wiring pattern of the conductive film of the embodiment of the present invention are straight line wirings. However, the line wiring to be overlapped also may include a non-straight line wiring. In such a case, the wiring pattern may be created by deriving the pitch and the angle at which the total moiré value is the minimum for the straight line wiring in each direction excluding the non-straight line wiring in accordance with the flow of FIG. 52. In this case, it is possible to obtain at least an optimum wiring pattern having less moiré than the equal pitch wiring pattern for the straight line wiring in each direction excluding the non-straight line wiring.

First, in Step S10, the luminance pattern of the pixel array of the display is provided in advance. The luminance pattern of the pixel array may be image data captured by a microscope or the like, or may be created by performing convolution of the digital data of the pixel array pattern and an appropriate blurring function. The blurring function is preferably determined on the basis of the degree of blurring of the luminance pattern of the pixel array of the image having captured the display image on the display.

In addition, as might expected, it is desirable that the luminance pattern of the pixel array provided herein reproduces the luminance pattern in a case where this pixel array actually emits light. In other words, in a case of using image data captured by a microscope or the like as the luminance pattern of the pixel array, or in a case of determining the blurring function of the luminance pattern of the pixel array from the image captured by the microscope, it is desirable that the effect of blurring caused by the imaging system such as the microscope is small. In other words, it is desirable to perform imaging through a system capable of capturing images sufficiently including and not reducing the high-frequency component of the luminance pattern in a case where this pixel array actually emits light. In a case where the high-frequency component of the luminance pattern of the pixel array is reduced due to blurring caused by the imaging system in the captured image, it is desirable that the image data that compensates for the reduction is used as the luminance pattern of the pixel array or the blurring function is determined from the compensated image data.

Further, in Step S10, it is preferable to derive the 2-dimensional frequency distribution in advance.

Next, in Step S12, the direction i is set to 1 (i=1).

Next, in Step S14, the average wiring pitch and angle in the direction i of the wiring pattern of the conductive film are acquired.

Next, in Step S16, the moiré value of the non-equal pitch wiring pattern is calculated by the method described below.

Next, in Step S18, the calculated moiré value and non-equal pitch information are stored in a memory or the like in association with the average wiring pitch and angle by the method described below.

Next, in Step S20, it is determined whether or not there is an average wiring pitch and angle in the direction i to be acquired.

In a case where there is an average wiring pitch and angle in the direction i to be acquired (YES), the processing returns to Step S14, the average wiring pitch and angle in the required direction i is acquired, and steps S14 to S20 are repeated. This loop means a loop in which the average wiring pitch and angle are variously changed.

On the other hand, in a case where there is no average wiring pitch and angle in the direction i to be acquired (NO), the processing proceeds to Step S22.

In Step S22, it is determined whether the direction i is n (i=n) (whether the direction i remains).

In a case where the direction i is not n (i≠n) (NO), the direction i is set to i+1 (i=i+1) in Step S24, the processing returns to Step S14, and steps S14 to S20 are repeated.

In a case where the direction i is n (i=n) (YES), the processing proceeds to Step S26. Next, in Step S26, the sum of the moiré value in the direction 1, the moiré value in the direction 2, . . . , and the moiré value in the direction n is set as the total moiré value (moiré evaluation value), and the pitch and angle in each direction i, in which the total moiré value is minimized, are derived.

Thus, the method of producing a wiring pattern of the conductive film of the embodiment of the present invention is completed.

Here, a linear sum may be used as a method of calculating the sum of moiré values in the direction 1, the direction 2, . . . , and the direction n. That is, the sum may be calculated by the following expression.

Moiré Value in Direction 1+Moiré Value in Direction 2+ . . . +Moiré Value in Direction n However, in the non-equal pitch moiré calculation processing, in a case where the moiré value is calculated by the stochastic addition described later, it is desirable that the sum thereof is also calculated by the stochastic addition. That is, it is desirable to calculate the sum by the following expression.

$$((\text{Moiré Value in Direction 1})^x + (\text{Moiré Value in Direction 2})^x + \ldots + (\text{Moiré Value in Direction } n)^x)^{1/x}$$

Here, the order x is set to the same value as the order of stochastic addition in the non-equal pitch moiré value calculation processing.

Further, in a case where it is desirable to simply derive the combination having the minimum moiré value in the combination of the wiring pitches and angles in all the directions of direction 1, . . . , and direction n, the wiring pitch and the angle, at which the moiré value becomes the minimum in each loop in direction 1, . . . , and direction n, may be simply derived (it is not necessary for the moiré value to be stored in association with the wiring pitch and the angle). However, in a case where it is necessary to limit the wiring pitch and the angle to only the combination that satisfies a certain condition, as shown in FIG. 52, the moiré value is temporarily stored in association with the wiring pitch and the angle in each direction, and the wiring pitch and the angle is limited to only the combination satisfying the condition among the combinations of the wiring pitch and the angle in each direction at the last. With such a limitation, the combination having the minimum total moiré value is derived. For example, in a case where it is desirable to limit the number of wirings per unit area from the viewpoint of wiring transmittance, assuming that the average pitch of wirings in the direction 1 is p1, the average pitch of wirings in the direction 2 is p2, . . . , and the average pitch of wirings in the direction n is pn, a total moiré value is calculated with a limitation using only a combination in which 1/p1+1/p2+ . . . +1/pn is equal to or less than a predetermined value.

Thereby, a combination in which the total moiré value becomes the minimum is derived.

Further, the angular range in the direction 1, the direction 2, ..., and the direction n is set to 0 to 180° (the angle formed with the x direction) such that the respective angular ranges do not overlap (do not include the same direction). In a case where there are four directions, for example, the angular range in the direction 1 is set to 0 degrees or more and less than 45 degrees, the angular range in the direction 2 is set to 45 degrees or more and less than 90 degrees, the angular range in the direction 3 is set to 90 degrees or more and 135 degrees or less, and the angular range in the direction 4 is set to more than 135 degrees and 180 degrees or less. In a case where there are two directions, the angular range in the direction 1 is set to 0 degrees or more and less than 90 degrees, and the angular range in the direction 2 is set to 90 degrees or more and 180 degrees or less. Here, in a case where the pixel array pattern is bilaterally symmetric as shown in FIG. 11, the 2-dimensional frequency distribution of the pixel array pattern is also bilaterally symmetric as shown in FIG. 14. Thus, in a case where the moiré value at the bilateral symmetry angle and the non-equal pitch information have already been derived, the information may be diverted to the other bilateral symmetry angle. For example, in a case where there are two directions, the moiré value and the non-equal pitch information are derived for each angle and the average pitch of the angular range of 0 degree or more and less than 90 degrees in the direction 1, and thereafter the information may be diverted to a symmetry angle in an angular range of more than 90 degrees and 180 degrees or less in the direction 2.

Further, in a case where it is desirable to simply derive the combination having the minimum moiré value in the combination of the wiring pitch and the angle in all the direction 1, the direction 2, ..., and the direction n (in a case where it is necessary to limit the combination on a certain condition about the wiring pitch and the angle), the angular range in the direction 1, the direction 2, ..., and the direction n may be bilaterally symmetric. In this case, the wiring pitch and angle at which the moiré value becomes the minimum in the bilaterally symmetric direction are derived. Then, the information may be diverted to the other bilaterally symmetric direction (the angle is converted to a bilateral symmetry angle). For example, in the case of two directions, the wiring pitch and the angle at which the moiré value becomes the minimum in the angular range of 0 degree or more and less than 90 degrees in the direction 1 are derived, and then the wiring pitch and the angle (bilateral symmetry angle) is a wiring pitch and an angle at which the moiré value becomes the minimum even in the angular range of more than 90 degrees and 180 degrees or less in the direction 2.

Although it takes a long time to search, the angular range of 0 to 180 degrees in all of the direction 1, the direction 2, ..., and the direction n may be searched for (the angular range to be searched for in each direction may be widened and overlap each other). By allowing overlapping in such a manner and searching for a wide angular range, it is possible to reduce the moiré value as compared to avoiding overlapping. The reason for this is that there may be a plurality of angles in which the moiré value becomes small in a specific angular range. For example, in the angular range of 0 to 180 degrees, in a case where there is an angle with the smallest moiré value in the angular range of 0 degrees or more and less than 45 degrees and there is also an angle with the second smallest moiré value, the angle of the wiring pattern in the direction 1 is set to an angle having the smallest moiré value in the angular range of 0 degree or more and less than 45 degrees, and the angle of the wiring pattern in the direction 2 is set to an angle having the second smallest moiré value in the angular range of 0 degree or more and less than 45 degrees. In such a manner, it is possible to reduce the moiré value as compared with the case where the angle of the wiring pattern in the direction 2 is searched for in an angular range different from the angular range of 0 degree or more and less than 45 degrees. However, in the case of allowing overlapping in such a manner and searching in a wide angular range, finally, it is necessary to pay attention such that the angles of the direction 1, the direction 2, ..., and the direction n are not the same when a combination of the wiring pitches and angles in the direction 1, the direction 2, ..., and the direction n in which the total moiré value becomes the minimum is derived.

Further, among the direction 1, the direction 2, ..., and the direction n, the direction in which the wiring pitch and the angle are changed may be limited. In a case where there are four directions, for example, the angle in the direction 2 is fixed to 67.5 degrees, the angle in the direction 3 is fixed to 112.5 degrees, and the wiring pitches in both the directions 2 and 3 are fixed to a predetermined value, and the wiring pitches and the angles only in the directions 1 and 4 are changed, thereby deriving the combination in which the moiré value becomes the minimum.

Further, it is not necessary to perform the "non-equal pitch moiré value calculation processing" for the direction not including the non-equal pitch, and the moiré value may be calculated for the specified wiring pitch and angle. The method of calculating the moiré value is as described above, but will be briefly described once again. First, a transmittance pattern of the wiring is created at a specified wiring pitch and angle, and a 2-dimensional frequency distribution is derived. Next, the moiré component is derived from the 2-dimensional frequency distribution of the luminance pattern of the pixel array and the 2-dimensional frequency distribution of the transmittance pattern of the wiring. Finally, after each moiré component is multiplied by VTF, the sum is calculated to be set as a moiré value.

In the following description, three types of implementation methods will be described for the calculation processing of the moiré value of the non-equal pitch wiring pattern (Step S16 in FIG. 52).

(Implementation Method 1 of Moiré Value Calculation Processing for Non-Equal Pitch Wiring Pattern)

Figure 53:
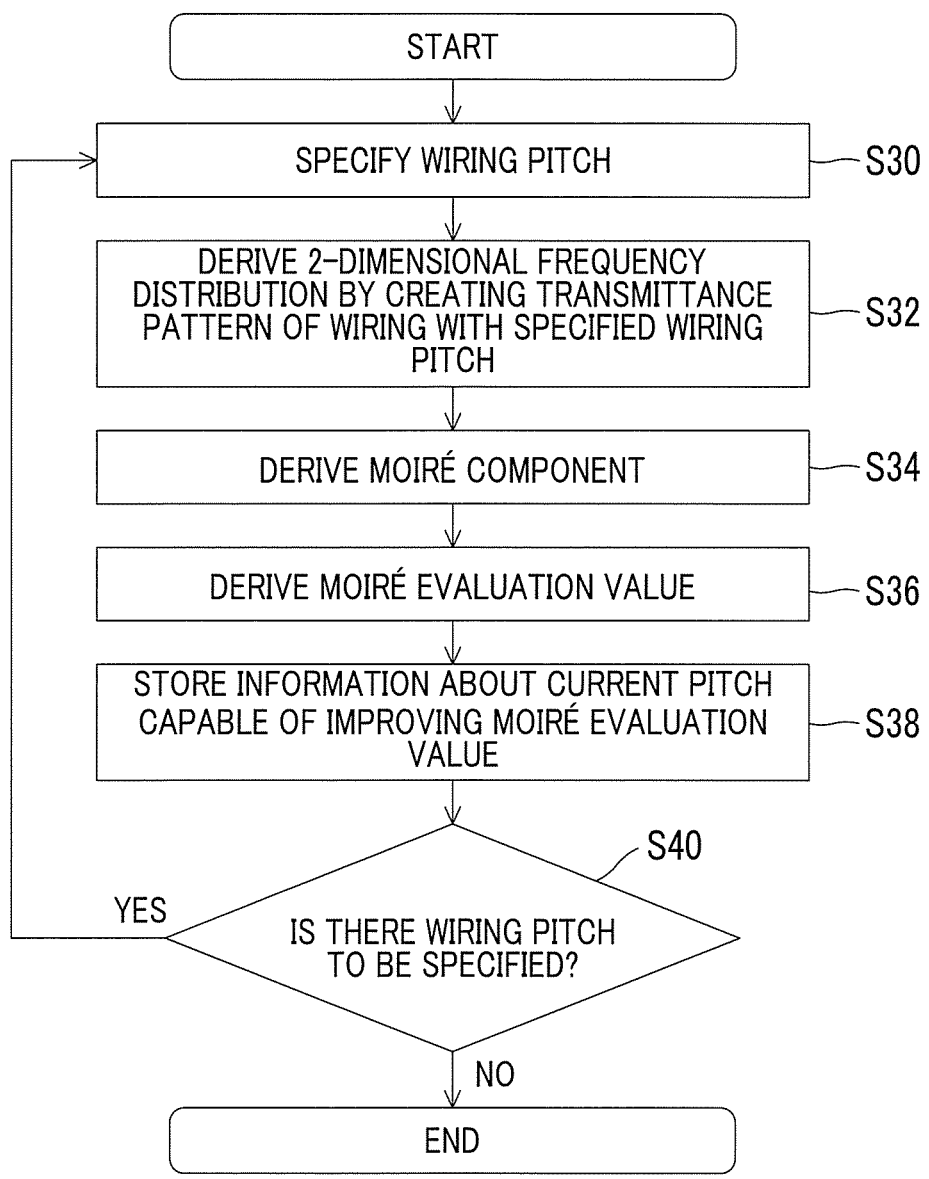
FIG. 53 is a flowchart showing an example of a moiré value calculation processing method of the non-equal pitch wiring pattern according to the embodiment of the present invention.

FIG. 53 shows a flow of Implementation Method 1 of the moiré value calculation processing for the non-equal pitch wiring pattern in the embodiment of the present invention.

In this method, information about a predetermined number of wiring pitches of non-equal pitches is provided in advance, and all the pitches are evaluated.

First, in Step S30, the information about the predetermined number of wiring pitches of non-equal pitches is provided in advance, and the information about the predetermined number of wiring pitches of non-equal pitches is acquired and specified.

Next, in Step S32, the transmittance pattern of the wiring is created at the specified wiring pitch, and the 2-dimensional frequency distribution is derived.

Next, in Step S34, the moiré component is derived using the 2-dimensional frequency distribution of the pixel array pattern and the 2-dimensional frequency distribution of the wiring pattern.

Next, in Step S36, a moiré evaluation value is derived from the moiré component.

Next, in Step S38, in a case where the moiré evaluation value is improved from the stored moiré evaluation value, the improved pitch information is stored.

Next, in Step S40, in the information about the predetermined number of wiring pitches of non-equal pitches provided in advance, in a case where the information about the predetermined number of wiring pitches of non-equal pitches at which the moiré evaluation values are not obtained remains and there is information about the wiring pitches of the predetermined number of non-equal pitches to be specified (YES), the processing returns to Step S30, and steps S30 to S38 are repeated.

In contrast, in a case where there is no information about the predetermined number of wiring pitches of non-equal pitches to be specified (NO), the implementation method 1 of the moiré value calculation processing of the non-equal pitch wiring pattern ends.

The information about the wiring pitches of non-equal pitches (information about non-equal pitches) is easily obtained through a method of giving a random number in a predetermined range to the equal pitch.

In the flow of FIG. 52, the average wiring pitch is changed variously. Therefore, in order to be able to reuse the same non-equal pitch information for each average wiring pitch, it is preferable to provide the non-equal pitch information as information about the ratios of the non-equal pitches to the average pitch. For example, in a case where the predetermined number is 4, the following information is used.

−0.055154472, 1.009144324, 2.087233728, 3.073827362
0.048012206, 0.980814732, 1.931622256, 3.008651204
0.043818677, 0.915255691, 1.956276096, 2.940351965
. . .

The above information is the pitch information in which the pitches of the four wirings from the first wiring are 0, 1, 2, and 3, respectively, and random numbers in the range of −0.1 to +0.1 are given to the pitches. The above information is composed of information about combinations of pitches of the predetermined number of the first to fourth wirings. The greater the number of combinations, the more moiré can be evaluated in non-equal pitch combinations, and the higher the probability of finding a pitch combination with smaller moiré (however, the search time becomes longer). As described above, by providing the pitches as the ratio information, the pitches can be reused for an optional average pitch. For example, at an average pitch of 200 μm, it is possible to obtain a non-equal pitch combination of "−11 μm, 202 μm, 417 μm, and 615 μm" based on pitch information "−0.055154472, 1.009144324, 2.087233728, and 3.073827362".

Further, here, as the non-equal pitch combination, the average pitch is multiplied by the pitch information of the ratio, and then the first decimal place is rounded off.

The method of deriving the moiré component and the method of deriving the moiré evaluation value are as described above. As a moiré evaluation value, a method of deriving the sum of the intensities of the respective moiré components after VTF multiplication will be described later.
(Implementation Method 2 of Moiré Value Calculation Processing for Non-Equal Pitch Wiring Pattern)

Figure 54:
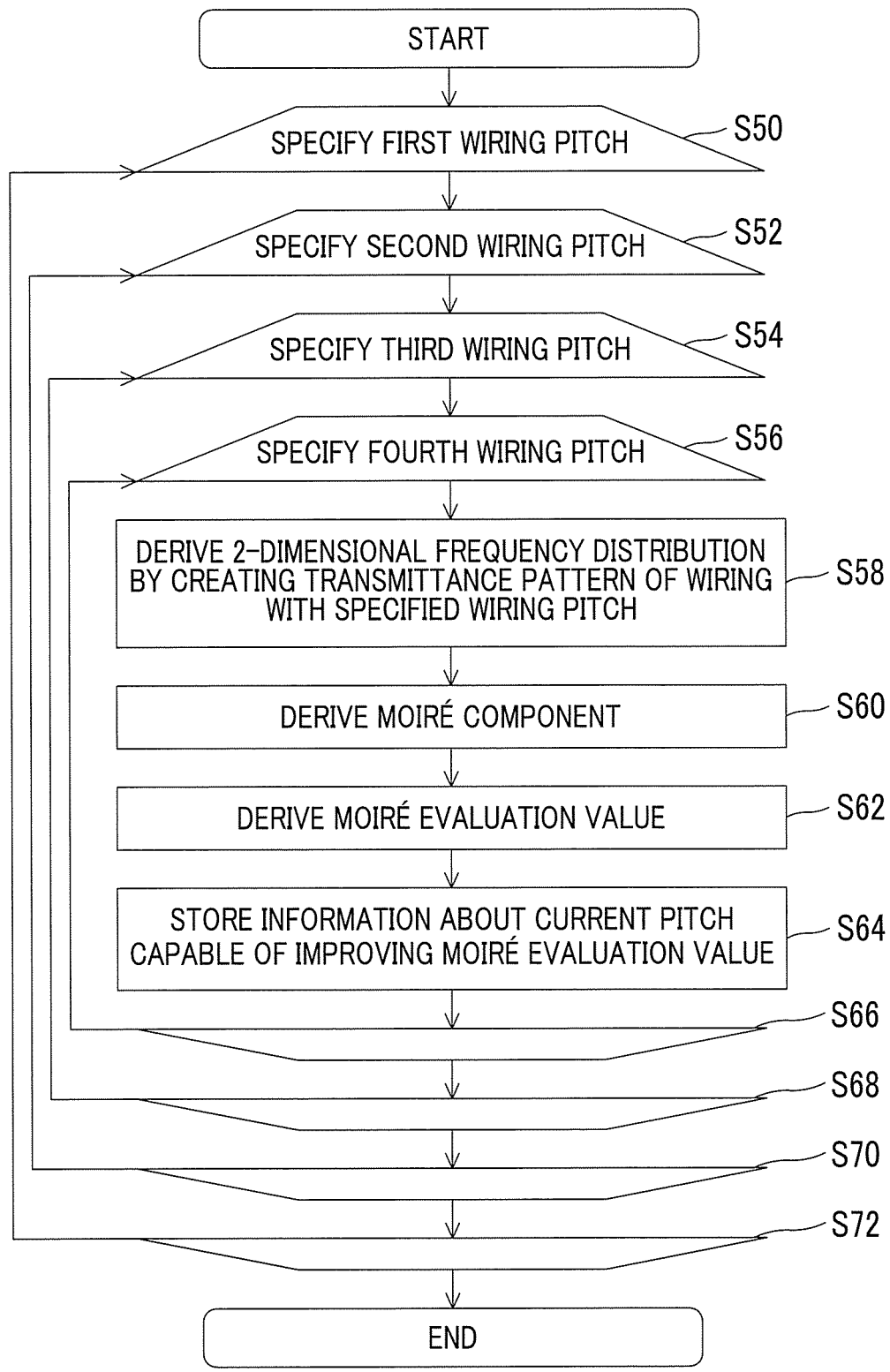
FIG. 54 is a flowchart showing another example of the moiré value calculation processing method of the non-equal pitch wiring pattern according to the embodiment of the present invention.

FIG. 54 shows a flow of Implementation Method 2 of the moiré value calculation processing for the non-equal pitch wiring pattern in the embodiment of the present invention.

In this method, the predetermined number is 4, and the moiré is evaluated by changing the pitch by a predetermined minute value within a predetermined range of values added to and subtracted from the pitch of the equal pitch wiring for each wiring.

First, in Step S50, as for the first wiring pitch, a predetermined minute value is provided in advance within the predetermined range of values added to and subtracted from the pitch of the equal pitch wiring, and the first wiring pitch is sequentially specified.

Next, in Step S52, as for the second wiring pitch, a predetermined minute value is provided in advance within the predetermined range of values added to and subtracted from the pitch of the equal pitch wiring, and the second wiring pitch is sequentially specified.

Next, in Step S54, as for the third wiring pitch, a predetermined minute value is provided in advance within the predetermined range of values added to and subtracted from the pitch of the equal pitch wiring, and the third wiring pitch is sequentially specified.

Next, in Step S56, as for the fourth wiring pitch, a predetermined minute value is provided in advance within the predetermined range of values added to and subtracted from the pitch of the equal pitch wiring, and the fourth wiring pitch is sequentially specified.

Next, in Step S58, the transmittance pattern of the wiring is created at the specified first, second, third, and fourth wiring pitches, and the 2-dimensional frequency distribution is derived.

Next, in Step S60, the moiré component is derived using the 2-dimensional frequency distribution of the pixel array pattern and the 2-dimensional frequency distribution of the wiring pattern.

Next, in Step S62, a moiré evaluation value is derived from the moiré component.

Next, in Step S64, in a case where the moiré evaluation value is improved from the stored moiré evaluation value, the improved pitch information is stored.

Next, in Step S66, in a case where the fourth wiring pitch to be specified remains, the predetermined minute value provided in advance is added to or subtracted from the current fourth wiring pitch, and thereby a new fourth wiring pitch to be specified is provided. The processing returns to Step S56, and steps S56 to S64 are repeated.

In a case where the fourth wiring pitch to be specified does not remain in Step S66, the processing proceeds to Step S68.

Next, in Step S68, in a case where the third wiring pitch to be specified remains, the predetermined minute value provided in advance is added to or subtracted from the current third wiring pitch, and thereby a new third wiring pitch to be specified is provided. The processing returns to Step S54, and steps S54 to S66 are repeated.

In a case where the third wiring pitch to be specified does not remain in Step S68, the processing proceeds to Step S70.

Next, in Step S70, in a case where the second wiring pitch to be specified remains, the predetermined minute value provided in advance is added to or subtracted from the current second wiring pitch, and thereby a new second wiring pitch to be specified is provided. The processing returns to Step S52, and steps S52 to S68 are repeated.

In a case where the second wiring pitch to be specified does not remain in Step S70, the processing proceeds to Step S72.

Next, in Step S72, in a case where the first wiring pitch to be specified remains, the predetermined minute value provided in advance is added to or subtracted from the current first wiring pitch, and thereby a new first wiring pitch to be specified is provided. The processing returns to Step S50, and steps S50 to S70 are repeated.

In Step S72, in a case where the first wiring pitch to be specified does not remain, Implementation Method 2 of the moiré value calculation processing for the non-equal pitch wiring pattern ends.

Since there are combinations in which the predetermined number of pitches are the same, it is desirable to omit the combinations in order to shorten the optimization time. Pitch information in which the same pitch combinations are omitted may be provided in advance, and may be optimized by Implementation Method 1 of the moiré value calculation processing of the non-equal pitch wiring pattern.

In Implementation Method 2 shown in FIG. 54, it is possible to perform an exhaustive search as compared with Implementation Method 1 shown in FIG. 53, but there is a disadvantage in that it takes a long time to search.

(Implementation Method 3 of Moiré Value Calculation Processing for Non-Equal Pitch Wiring Pattern)

Figure 55:
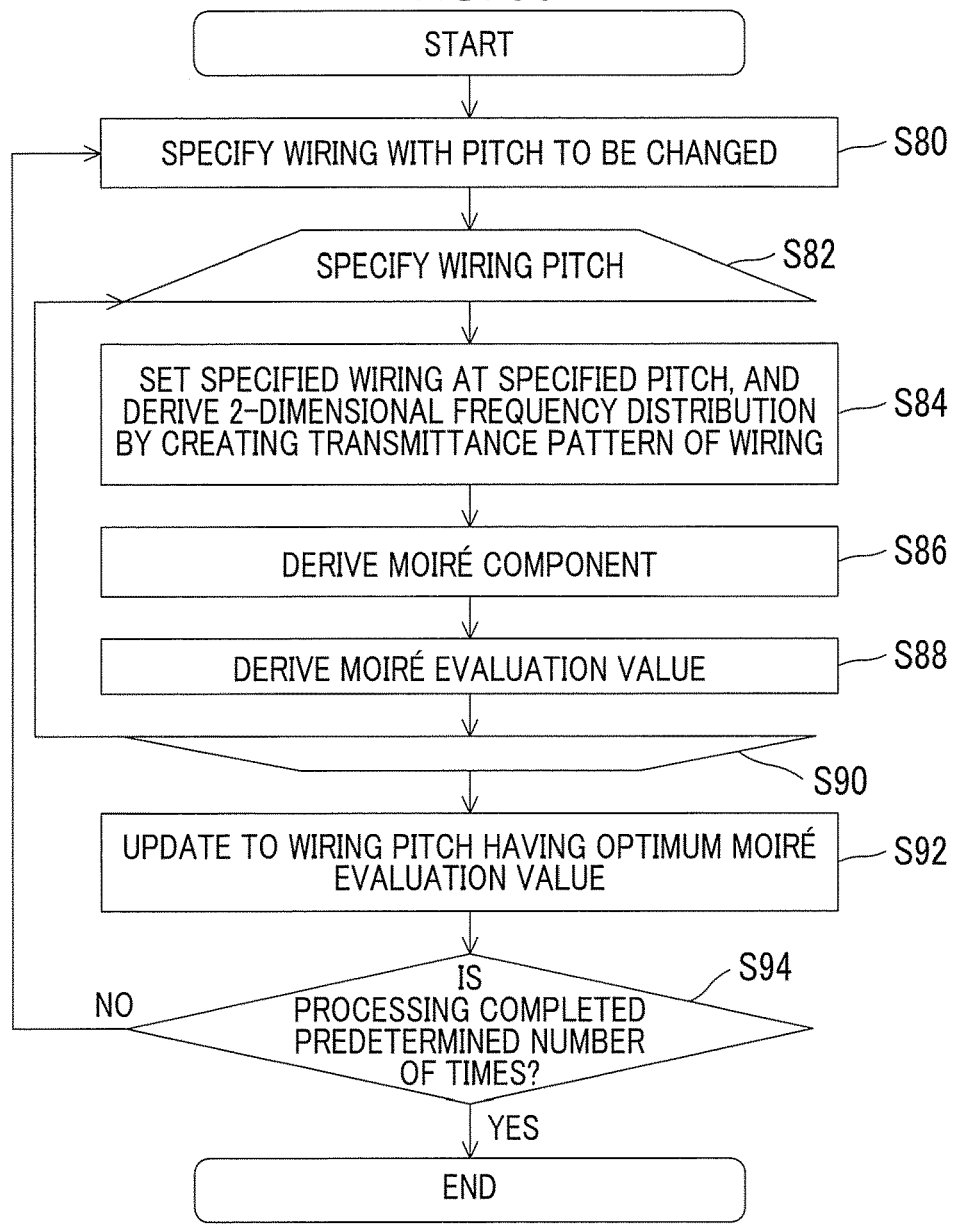
FIG. 55 is a flowchart showing another example of the moiré value calculation processing method of the non-equal pitch wiring pattern according to the embodiment of the present invention.

FIG. 55 shows a flow of Implementation Method 3 of the moiré value calculation processing for the non-equal pitch wiring pattern in the embodiment of the present invention.

This method is a method in which the search is repeated a predetermined number of times.

First, in Step S80, the wirings, of which the wiring pitches of the non-equal pitches will be changed, are specified. First, the first wiring may be specified, or the wiring in another order may be specified.

Next, in Step S82, the information about the wiring pitch is provided in advance, and the information about the wiring pitch is acquired and specified.

Next, in Step S84, the specified wiring is set at the specified wiring pitch, a transmittance pattern of the wiring is created, and a 2-dimensional frequency distribution is derived.

Next, in Step S86, the moiré component is derived using the 2-dimensional frequency distribution of the pixel array pattern and the 2-dimensional frequency distribution of the wiring pattern.

Next, in Step S88, a moiré evaluation value is derived from the moiré component.

Next, in Step S90, in the information about the wiring pitch provided in advance, in a case where information about the wiring pitch at which the moiré evaluation value is not obtained remains and there is information about the wiring pitch to be specified, the processing returns to S82, and steps S82 to S88 are repeated.

On the other hand, in a case where there is no information about the wiring pitch to be specified, the processing proceeds to Step S92.

In Step S92, the moiré evaluation value is updated at the optimum wiring pitch.

Next, in Step S94, it is determined whether changing the wiring pitch is completed a predetermined number of times.

In a case where the predetermined number of times of changing is not completed (NO), the processing returns to Step S80, and steps S80 to S92 are repeated.

In a case where the predetermined number of times of changing is completed (YES), Implementation Method 3 of the moiré value calculation processing for the non-equal pitch wiring pattern ends.

In the method shown in FIG. 55, in a case where the predetermined number is 4, the search is repeated a predetermined number of times in the order of the first wiring→the second wiring→the third wiring→the fourth wiring→the first wiring→ . . . . The order may be from first to fourth, or may be selected to be random.

Regarding the specified wiring, the moiré evaluation value is derived by increasing or decreasing the wiring pitch from the current pitch by ±by a predetermined amount. Simply, assuming that the current pitch is set to p, the evaluation may be performed by using the pitches of p+a, p, and p−a. The moiré evaluation value for the pitch p among the pitches has already been derived, and thus it is not necessary to derive the moiré evaluation value again. The moiré evaluation value is updated at the optimum pitch for the specified wiring.

The method shown in FIG. 55 requires less search time than the method shown in FIG. 54. Further, the method shown in FIG. 55 can be searched more finely than the method shown in FIG. 53. However, there is a disadvantage in that the method tends to result in a local solution.

The above-described method of producing a wiring pattern of the conductive film of the embodiment of the present invention shown in FIGS. 52 to 55 relates to a wiring pattern of a wiring portion which is carried out regardless of the presence or absence of a transparent substrate of the conductive film. Therefore, it can be said that the method may be a method of producing a wiring pattern of a conductive member having at least a wiring portion although the transparent substrate is not specified. That is, it can be said that FIGS. 52 to 55 show the flow of the method of producing the conductive member and the wiring pattern of the conductive film of the embodiment of the present invention.

(Points to Consider for Implementation)

JP2016-014929A discloses a method of determining a wiring pattern of which the moiré evaluation value is equal to or less than a threshold value by providing irregularities to the pitches of rhomboid-shaped wirings. However, the method has a problem. The problem is "excluding a moiré component having a small intensity by using a threshold value".

In this method, in addition to the "wiring pattern having a small amount of low-frequency area moiré components visible to the human eye" that is originally desired, a wiring pattern having a large amount of moiré components equal to or less than the threshold value is also selected.

Originally, in a case where irregularity is provided to the wiring pitch, the frequency components of the wiring pattern increase, but in this case, the sum of the intensities of the frequency components of the wiring pattern inevitably increases. The reason for this is that since the square sum of the transmittance of the wiring pattern does not change regardless of whether or not irregularity is provided to the wiring pitch, according to Parseval's theorem, the sum of powers (the square of intensities) of the frequency components of the 2-dimensional frequency distribution of the wiring pattern does not change. The fact that the number of frequency components increases without changing the sum of powers (the square of intensities) means that the sum of intensities increases. The increase in sum of intensities of the wiring patterns also means the increase in sum of intensities of the moiré components. That is, as a result of the increase in number of frequency components of the wiring pattern, the moiré component is inevitably increased, and the sum of the intensities (multiplication values of the frequency components of the pixel array pattern and the frequency components of the wiring pattern) also increases.

As a result, the sum of the intensities of the moiré components after being multiplied by VTF tends to increase. Under such a tendency, in a case where a wiring pattern to which irregularity is provided and of which the low moiré evaluation value (sum of intensities of moiré components after VTF multiplication) is low is selected, it is considered that a wiring pattern having a large number of moiré components of which the intensities are equal to or less than a threshold value tends to be selected (moiré components that are equal to or less than the threshold value are excluded from the evaluation value). In other words, even in a case where the search is performed by providing irregularity, it is considered that a wiring pattern having the following characteristic tends to be selected. Reduction in moiré evaluation value caused by "increasing the moiré components that are equal to or less than the threshold value" is greater than reduction in moiré evaluation value caused by "shifting the frequency of each moiré component to the high frequency side from the low frequency range visible to the human eye".

The present inventor had set the threshold value of the intensity of the moiré component as in the method of JP2016-014929A and searched for the wiring pattern of the embodiment of the present invention by the implementation method, and the above wiring pattern was derived. In such a wiring pattern, a large number of moiré components are distributed around the threshold value or less. In a case where the moiré evaluation value is derived by lowering the threshold value a little, the moiré evaluation value is rather worse than that of an equal pitch wiring pattern. Thus, the wiring pattern is not a desirable pattern. However, in a case where the moiré components of low intensity are not excluded by using the threshold value, in the non-equal pitch wiring pattern like the wiring pattern of the embodiment of the present invention, more frequency components having small intensities than the equal pitch wiring pattern inevitably occur. Therefore, as described above, the moiré evaluation value tends to increase, and a sufficiently optimum wiring pattern cannot be selected.

Here, in the past visual sense research, an experimental result showing that "visibility of a pattern in which a plurality of frequencies is overlapped is not a linear sum of visibilities of the frequencies but a non-linear sum" is obtained. Therefore, in the embodiment of the present invention, the wiring pattern is set to have non-equal pitches and the frequency components are increased more than frequency components of the equal pitches. Even in this case, as a method of obtaining the evaluation value from each moiré component such that an accurate moiré evaluation value can be derived and a sufficiently optimum wiring pattern can be derived, there is a method of "deriving a non-linear sum of the intensities of the moiré components", instead of "deriving the sum (linear sum) of intensities by excluding the moiré components having small intensities through the threshold value" and "deriving the sum (linear sum) of intensities without the threshold value". In the past visual sense research, generally the following two types of models have been proposed and these methods are used.

After converting the intensities of the moiré components through a non-linear function (assuming a conversion function (transducer function) from luminance contrast to psychological contrast), the sum (linear sum) thereof is derived as the moiré evaluation value. Here, since various conversion expressions such as the expression proposed by Hamerly et al. or Wilson et al. have been proposed as a non-linear conversion function (transducer function), any one of these expressions is used for conversion.

Alternatively, the stochastic addition values of the intensities of the moiré components are derived as the moiré evaluation values. Here, the moiré evaluation value I is derived using Expression (2), which is proposed by Quick et al., as a stochastic addition expression.

$$I=(\Sigma(R[i])^x)^{1/x} \qquad (2)$$

Here, R[i] represents the intensity of the i-th frequency component of the moiré, that is, each moiré component after VTF multiplication.

The stochastic addition order x employs a certain value in the range of 1 to 4, which has been proposed as an order that fits well with the visual experiment results in the past visual sense research. Here, in a case where the order x is 1, Expression (2) means that the sum (linear sum) of the intensities of the moiré components is derived as the moiré evaluation value. In this case, as described above, similarly to the wiring pattern of the embodiment of the present invention, the moiré evaluation value of the non-equal pitch wiring pattern tends to increase more than the equal pitch wiring pattern. Therefore, it is difficult to select a sufficiently optimum wiring pattern. However, even in this case, since it is possible to select the non-equal pitch wiring pattern with at least less moiré than the equal pitch wiring pattern, the value 1 is also employed as the order x. As the typical order x, the value 2 presented by Quick is employed.

As already described, in a case where the pitches of the wiring pattern are set as non-equal pitches, visibility of the wiring pattern itself tends to be worse than that of the equal pitch (the low-frequency component which is not present in the equal pitch occurs as the frequency component of the wiring pattern). Therefore, it is desirable to evaluate not only moiré but also visibility of the wiring pattern itself.

In Expression (7), not only each moiré component represented by the expression on the fourth row, but also the frequency component of the wiring pattern represented by the expression on the third row is incorporated into the moiré evaluation value. Thereby, the components can be easily evaluated. Specifically, the frequency 0 (corresponding to A0 in Expression (7)) may be included in the frequency distribution of the pixel array pattern shown in FIG. 14. As a result, in a case of deriving each moiré component shown in FIG. 16 (or FIG. 25) on the basis of each frequency component of the pixel array pattern of FIG. 14 and each frequency component of the wiring pattern shown in FIG. 15 (or FIG. 24), each component represented by the expression on the third row of Expression (7) is derived as a moiré component with the frequency 0 (corresponding to A0 of Expression (7)) of the pixel array pattern, and then can be incorporated into the sum value (moiré evaluation value) derived by multiplying by the VTF.

The non-equal pitch wiring pattern of the embodiment of the present invention may be a non-equal pitch only in one direction or a non-equal pitch in all directions in a wiring pattern in which straight line wirings in two or more directions are overlapped.

The non-equal pitch wiring pattern of the embodiment of the present invention is preferably a wiring pattern in which straight line wirings in two directions are overlapped. The reason for this is that there is an upper limit on the number of wirings per unit area in order to secure the transmittance. In a case where the number of wirings per unit area has an upper limit, the number of wirings in one direction can be increased in a case where the number of wiring patterns is small. As a result, the wiring pitch can be narrowed. The narrower the wiring pitch, the more difficult occurrence of moiré. Specifically, in a case where the wiring pitch is narrower, the frequency of each component in the frequency distribution is farther away. Therefore, a component close to each frequency component of the pixel array pattern is less likely to occur, and low-frequency moiré is less likely to occur. In addition, the narrower the wiring pitch, the more advantageous it is to reduce moiré due to the non-equal pitch wiring pattern of the embodiment of the present invention.

In the non-equal pitch wiring pattern of the embodiment of the present invention, a low-frequency component occurs as compared with the equal pitch wiring pattern. However, the narrower the wiring pitch, the higher the minimum frequency. Therefore, even in a case where the low-frequency component occurs, the influence on visibility of the wiring pattern is small. That is, it is possible to more freely optimize the pitch and reduce moiré within a range that does not affect visibility of the wiring pattern. As described above, the smaller the direction of the wiring pattern, the better the moiré and visibility of the wiring pattern. However, at least two directions are necessary to prevent the conductive film from losing a function as a touch sensor. That is, in order to maintain the sensor function even in a case where the wiring is disconnected, it is necessary to have a pattern in which wirings in at least two directions are overlapped and have intersections and a plurality of paths (current paths) to the electrodes. Therefore, a wiring pattern in which straight line wirings in two directions are overlapped is desirable.

In a case where the wiring pattern has a 2-layer structure, the positions (phases) of the wiring patterns of the two layers may shift during oblique observation. In this case, the front observation may be performed as the frequency distribution of the wiring patterns shown in FIGS. 15 and 24. In addition, the frequency distribution in the case of observing from an oblique optional direction may also be derived, similarly, the moiré component may be derived and multiplied by VTF, the moiré evaluation value may be derived, and a non-equal pitch wiring pattern, of which the worst value of the moiré evaluation value is better than the equal pitch wiring pattern, may be derived.

In a case where the wiring pattern has a 2-layer structure, the wiring pattern may be a non-equal pitch wiring pattern of which the moiré evaluation value in a case of observation from at least one direction including not only front observation but also oblique observation from an optional direction is smaller than that of the equal pitch wiring pattern. Then, the wiring pattern has the characteristics of the embodiment of the present invention. Similarly, in a case of observation from at least one direction including not only front observation but also oblique observation from any direction, the wiring pattern may be a non-equal pitch wiring pattern in which "distribution of the frequency components of the wiring pattern", "distribution of moiré components derived from the pixel array pattern and the wiring pattern", or "the pitch of the wiring pattern" satisfies the characteristics of the above-described wiring pattern of the embodiment of the present invention. Then, the wiring pattern has the characteristics of the embodiment of the present invention.

In the case of OELD, there are displays with different pixel array patterns (for example, pen-tile array) for at least two colors of RGB. In the case of such a display, since the 2-dimensional frequency distributions of the pixel array patterns are different for at least two colors of R, G, and B, moiré s are also different. In the case of such a display, it is necessary to provide a wiring pattern that reduces all R, G, and B moiré s. In this case, the frequency distribution of the pixel array pattern shown in FIG. 14 may be derived for each color of R, G, B, the moiré component may be derived for each color of R, G, B from the frequency distributions of the pixel array patterns and the frequency distribution of the wiring pattern and the moiré evaluation value may be derived through multiplication of the VTF, and the non-equal pitch wiring pattern of which the worst value of the moiré evaluation value is better than the equal pitch wiring pattern may be derived. Even in a case where the pixel array patterns of R, G, and B are different, the wiring pattern has characteristics of the embodiment of the present invention as long as the wiring pattern is a non-equal pitch wiring pattern having a moiré evaluation value smaller than the equal pitch wiring pattern for any one of R, G, and B. Similarly, for any one of R, G, and B, the wiring pattern may be a non-equal pitch wiring pattern in which "distribution of the frequency components of the wiring pattern", "distribution of moiré components derived from the pixel array pattern and the wiring pattern", or "the pitch of the wiring pattern" satisfies the characteristics of the above-described wiring pattern of the embodiment of the present invention. Then, the wiring pattern has the characteristics of the embodiment of the present invention.

Figure 56:
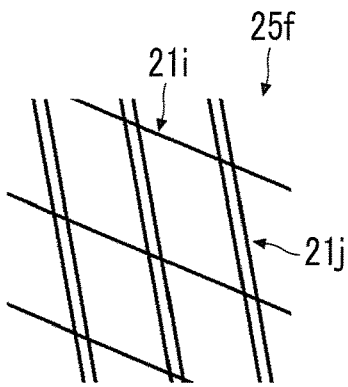
FIG. 56 is a plan view schematically showing another example of the mesh-shaped wiring pattern of the wiring portion of the conductive film shown in FIG. 1.

In a wiring pattern in which straight line wirings are overlapped in two directions as shown in FIGS. 2, 5, 30, and 37, the inclination angles of the straight line wirings 21$i$ and 21$j$ in the two directions may be different, as shown in FIG. 56, from the bilaterally symmetric pixel array pattern as shown in FIG. 11. That is, as shown in FIG. 56, the wiring pattern of the embodiment of the present invention may be a bilaterally asymmetric wiring pattern 25$f$ in which straight line wirings 21$i$ and 21$j$ in two directions having different inclination angles are overlapped. Here, the bilaterally symmetric pixel array pattern can be defined by "bilateral symmetry of at least the positions of the respective pixels". Further, the pattern can also be defined by "the bilateral symmetry additionally including bilateral symmetry of the shape and size of each pixel".

In the embodiment of the present invention, as shown in FIG. 56, the reason why the wiring pattern may be more preferably bilaterally asymmetric is as follows. "In a case where the average pitches of the straight line wirings in two directions are different, the directions (angles) in which the moiré s of the straight line wirings are the optimum are not necessarily the same". In addition, "the closer the angle formed by the straight line wirings in the two directions to the right angle (90 degrees), the higher the accuracy of 2-dimensional contact position detection using a touch sensor".

FIG. 56 shows an example of a wiring pattern having a favorable total moiré value, which is derived after the number of wirings per unit area is limited in terms of the transmittance of the wiring in accordance with the flow of the method of producing the wiring pattern of the conductive film of the embodiment of the present invention shown in FIG. 52, relative to the bilaterally symmetric pixel array pattern shown in FIG. 11. In such an example, since the average pitches of the straight line wirings in the two directions are different, the directions (angles) in which the moiré values are favorable are different in the respective straight line wirings. Further, in such an example, the straight line wirings in the two directions are both directed to the right. It is needless to say that the present invention includes such an example in which the straight line wirings in the two directions are both directed to the right or left.

By the way, in a wiring pattern in which straight line wirings are overlapped in two directions, the closer the angle formed between the two directions to the right angle (90 degrees), the higher the accuracy of 2-dimensional contact position detection using a touch sensor. Further, in a case where there are two or more wiring layers, for example, in a case of observing from an oblique direction, there may be deviation in the position of the wiring pattern of each layer. Then, the pitch of the straight line wiring may change due to this deviation, but in this case, the degree of change in pitch of the straight line wiring differs depending on the direction of the deviation of the wiring pattern of each layer and the direction of the straight line wiring. In a case where the angle formed by the deviation direction and the direction of the straight line wiring is the right angle (90 degrees), the pitch does not change, and in a case where the deviation direction and the direction of the straight line wiring are the same, the change in pitch becomes the maximum. From this fact, even in a case where the position of the wiring pattern of each layer more deviates as the angle formed by the straight line wirings in the two directions becomes closer to the right angle (90 degrees), the wiring in which the straight line wirings in the two directions are overlapped does not depend on the deviation direction. The change in total pitch of the wiring pattern is small. Therefore, occurrence of moiré due to the change in pitch of the wiring pattern and/or reduction in visibility of the wiring pattern are small. Further, in the technology of optimizing the pitch of the wiring pattern from the viewpoint of moiré visibility as in the embodiment of the present invention, it is particularly effective that the angle formed by the straight line wirings in the two directions is close to the right angle (90 degrees). From the above, the angle formed by the straight line wirings in the two directions is not particularly limited, but is preferably in the range of 40° to 140° (90°±50°), more preferably in the range of 60° to 120° (90°±30°), and still more preferably in the range of 75° to 105° (90°±15°).

The average pitch of the straight line wiring is not particularly limited, but is preferably 30 μm to 600 μm. The reason for this is that in a case where the average pitch is narrow, the transmittance is low, and in contrast, in a case where the average pitch is wide, the thin metal wires are easily noticeable and visibility is deteriorated. It is preferable that the average pitch is within the above range such that the transmittance is in an allowable range and visibility of the thin metal wires is low.

The present invention is characterized in a non-equal pitch wiring pattern. In the pattern, in a straight line wiring in at least one direction, the repetitive pitches of the predetermined number of the thin metal wires are equal pitches, and the pitches of at least two thin metal wires among the respective pitches of the predetermined number of thin metal wires are non-equal pitches. In this case, as described above, by setting the pitches of the thin metal wires to non-equal pitches, the minimum frequency of the wiring pattern becomes lower than that in the case of equal pitch. Thus, it should be taken into account that it is necessary to make the wiring pattern not visible. Therefore, the average pitch is preferably 300 μm or less, more preferably 200 μm or less, still more preferably 150 μm or less, in order to sufficiently optimize the pitch and reduce moiré within a range that does not affect visibility of the wiring pattern.

The present invention is characterized in that the line wiring (line wiring in one direction) being composed of a plurality of thin metal wires arranged in parallel in one direction is a straight line wiring. However, in the embodiment of the present invention, the thin metal wire does not have to be a perfect straight line, and may be bent as long as the line is within a predetermined range. The straight line wiring in the embodiment of the present invention can be defined as follows.

In the embodiment of the present invention, in the 2-dimensional frequency distribution of the transmittances of the line wiring in one direction, in a case where the frequency components of the line wiring are concentrated only in a specific direction, the line wiring can be regarded as a straight line wiring. Specifically, in the 2-dimensional frequency distribution of the transmittances of the line wiring, a ratio of the sum of intensities of the frequency components, from which the zero frequency component is excluded, in the angular range of −10 degrees or more to +10 degrees or less centered on a certain specific direction to the sum of the intensities of all frequency components (from which the zero frequency component is excluded) may be equal to or greater than a predetermined ratio. In this case, the line wiring can be regarded as a straight line wiring. Here, the predetermined ratio is 30%, more preferably 45%, and still more preferably 55%. In addition, the certain specific direction indicates both a direction of any angle of optional angles in the angular range of 0 degree or more and less than 360 degrees and a direction of an angle different from that angle by 180 degrees. In other words, the sum of the intensities of the frequency components in the angular range of −10 degrees or more to +10 degrees or less centered on a certain specific direction also includes the intensities of the frequency components having the conjugate relation (the frequency components in a direction different by 180 degrees (the opposite direction)).

Figure 57:
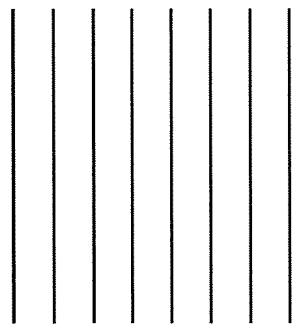
FIG. 57 is a plan view schematically showing an example of the line wiring of the wiring portion of the conductive film.
Figure 58:
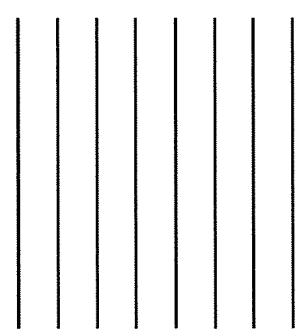
FIG. 58 is a plan view schematically showing another example of the line wiring of the wiring portion of the conductive film.
Figure 60:
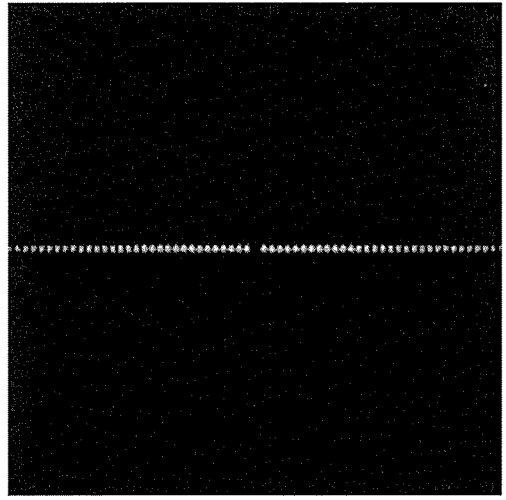
FIG. 60 is a diagram of a 2-dimensional frequency distribution of the wiring pattern shown in FIG. 57.
Figure 61:
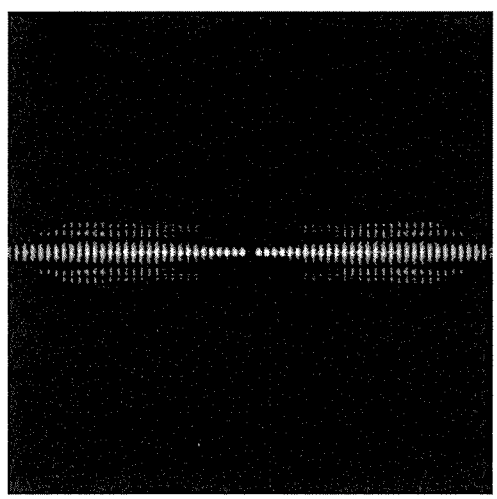
FIG. 61 is a diagram of a 2-dimensional frequency distribution of the wiring pattern shown in FIG. 58.
Figure 62:
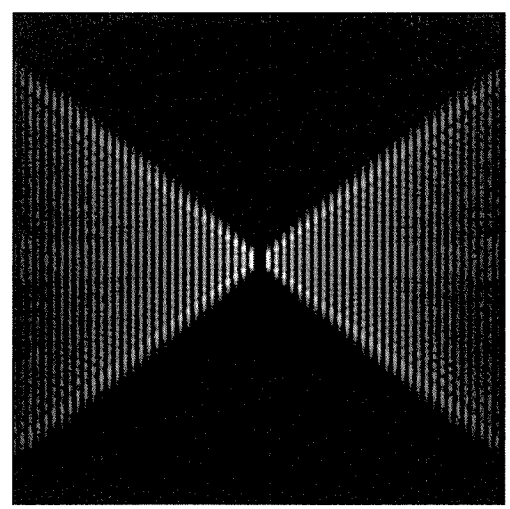
FIG. 62 is a diagram of a 2-dimensional frequency distribution of the wiring pattern shown in FIG. 59.

Here, as examples of the line wiring, line wirings shown in FIGS. 57 to 59 are shown. Further, FIGS. 60 to 62 show 2-dimensional frequency distributions of the transmittances of the line wirings shown in FIGS. 57 to 59, respectively. In addition, in the frequency distribution, the intensity scale is appropriately adjusted in order to make the intensities easily visible. Further, the zero frequency component is removed. The line wiring 23a shown in FIG. 57 is a straight line wiring in which perfect straight lines are arranged in the horizontal direction, and the frequency distribution shown in FIG. 60 is also concentrated only in the horizontal direction. In contrast, in the line wiring 23c shown in FIG. 59, the lines forming the wiring each have a cosine wave shape, and the frequency distribution shown in FIG. 62 spreads not only in the horizontal direction but also in the peripheral direction. Thus, the line wiring 23c can not be regarded as the straight line wiring. On the other hand, in the line wiring 23b shown in FIG. 58, although the lines forming the wiring each have a slight cosine wave shape, the frequency distribution shown in FIG. 61 is mostly concentrated in the horizontal direction. Therefore, the line wiring 23b can be regarded as a straight line wiring.

Figure 63:
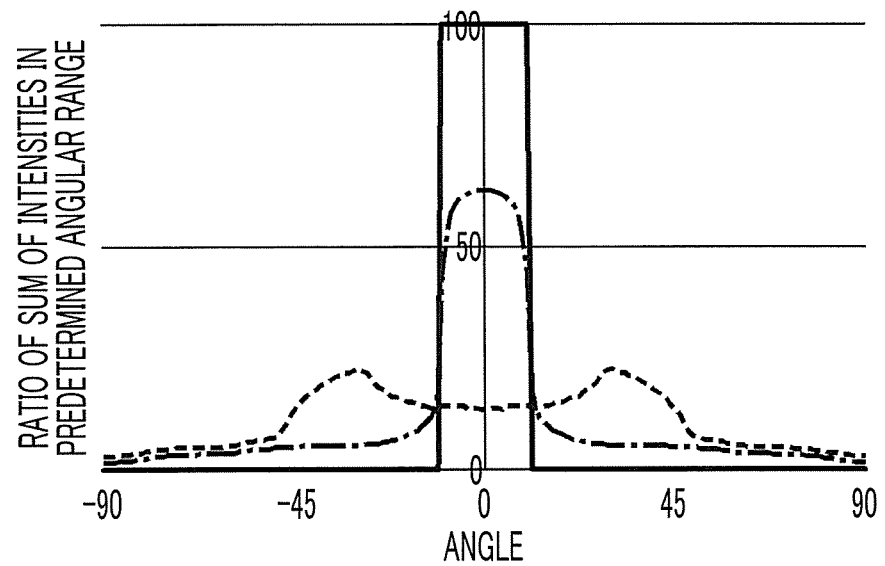
FIG. 63 is a graph showing the ratio of the sum of intensities of frequency components to the sum of intensities of all frequency components in a predetermined angular range in the 2-dimensional frequency distribution of the wiring patterns shown in FIGS. 60 to 62.

FIG. 63 is a graph showing a ratio of the sum of the intensities of frequency components (from which the zero frequency component is excluded) in the angular range of −10 degrees to +10 degrees centered on each direction from −90 degrees to +90 degrees (and in addition, a direction different from each direction by 180 degrees (opposite direction)) in a case where the horizontal direction is set as an angle of 0 degree to the sum of the intensities of all frequency components (from which the zero frequency component is excluded), in the 2-dimensional frequency distribution of the transmittances of the line wiring. In FIG. 63, the solid line indicates a graph of the ratio of intensities of the frequency components of the line wiring 23a shown in FIG. 57, the chain line indicates a graph of the ratio of intensities of the frequency components of the line wiring 23b shown in FIG. 58, and the dotted line indicates a graph of the ratio of intensities of frequency components of the line wiring 23c shown in FIG. 59. As can be seen from the ratio of the sum of intensities of frequency components in the angular range of −10 degrees or more and +10 degrees or less centered on the horizontal direction as a specific direction, that is, the direction of the angle of 0 degree (and in addition, the direction of the angle of 180 degrees), in the case of the line wiring 23a shown in FIG. 57, the ratio is naturally 100%, and the line wiring 23a can be regarded as a straight line wiring. In the case of the line wiring 23b shown in FIG. 58, the ratio is 55% or more, and the line wiring 23b can also be regarded as a straight line wiring. On the other hand, in the case of the line wiring 23c shown in FIG. 59, it can be seen that the ratio is less than 30% and the line wiring 23c cannot be regarded as a straight line wiring.

The dummy electrode portion such as the dummy electrode portion 26 of the conductive film 11 described above is provided so as to be electrically insulated (disconnected) from the first electrode portions 17a, between the adjacent first electrode portions 17a, in the first wiring portion 16a like the non-conductive pattern described in WO2013/094729A. In addition, the dummy electrode portion is provided so as to be electrically insulated (disconnected) from the second electrode portions 17b, between the adjacent second electrode portions 17b, in the second wiring portion 16b. However, the present invention is not limited to this.

Figure 66:
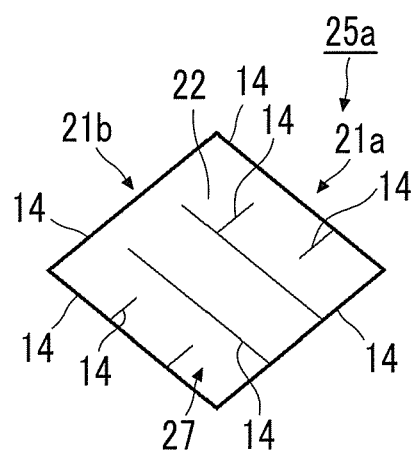
FIG. 66 is a plan view schematically showing an example of an in-electrode dummy pattern portion in one opening portion of the mesh-shaped wiring pattern of the embodiment of the present invention.

In a case where the pitch of the at least one straight line wiring 21a of the first electrode portion 17a and/or the second electrode portion 17b is wide, as shown in FIG. 66, in one opening portion 22 of the mesh-shaped wiring pattern 25a, the in-electrode dummy pattern portion 27 may be formed by extending new thin metal wires 14 in parallel with the thin metal wires 14 of the one straight line wiring 21a such that the tip is not connected to any of the thin metal wires 14, that is, the wiring is disconnected (broken) or stopped in the middle, from one thin metal wire 14 of the straight line wiring 21b in the other direction to be overlapped to the other thin metal wire 14, or reversely from the other thin metal wire 14 to the one thin metal wire 14, between the thin metal wires 14 of one straight line wiring 21a. On the contrary, the in-electrode dummy pattern portion 27 may be formed by extending new thin metal wires 14 in parallel with the thin metal wires 14 of the one straight line wiring 21b such that the tip is not connected to any of the thin metal wires 14, that is, the wiring is disconnected (broken) or stopped in the middle, from one thin metal wire 14 of the other straight line wiring 21a to the other thin metal wire 14, or reversely from the other thin metal wire 14 to the one thin metal wire 14, between the thin metal wires 14 of one straight line wiring 21b. The in-electrode dummy pattern portion 27 may be formed by further branching from the thin metal wires 14 forming the in-electrode dummy pattern portion 27 in parallel with the thin metal wires 14 of the straight line wirings 21 in the other direction. Needless to say, the distal ends of the branched thin metal wires 14 are disconnected (broken) or stopped in the middle, and are not connected to any thin metal wires 14. Needless to say, the example shown in FIG. 66 shows the in-electrode dummy pattern portion 27 formed in only one opening portion of the mesh-shaped wiring pattern, but similarly the in-electrode dummy pattern portion 27 may be formed in the other opening portions.

By forming the in-electrode dummy pattern portion 27 in such a manner, the following effects are obtained. In general, in a case where the pitches of the thin metal wires of the electrode portion are narrowed, the parasitic capacitance of the electrode increases. As a result, the accuracy of detecting the touch position decreases. On the other hand, in a case where the pitches of the thin metal wires are widened in order to improve the detection sensitivity, the thin metal wires tend to be conspicuous and visibility deteriorates. In addition, moiré due to interference between the pixel array pattern and the wiring pattern of the thin metal wires of the electrode portion is likely to occur. Therefore, the pitches of the thin metal wires in the electrode portion are widened and the parasitic capacitance of the electrode is reduced to improve the touch position detection accuracy. On the other hand, by forming the in-electrode dummy pattern portion, the pitches of the combination of the thin metal wires in the electrode portion and the thin metal wires in the in-electrode dummy pattern portion are narrowed. As a result, visibility of the thin metal wires can be lowered, and moiré can be made less likely to occur.

In the case of forming the in-electrode dummy pattern portion as described above, in the embodiment of the present invention, a combined wiring pattern includes a non-equal pitch wiring pattern optimized in terms of visibility of moiré. The combined wiring pattern is formed by overlapping a wiring pattern, which is formed by the combination of the thin metal wires of the electrode portion and the thin metal wires of the in-electrode dummy pattern portion, and in a case where there are a plurality of wiring layers, wiring patterns in the wiring layers. As a result, the combined wiring pattern improves the visibility of the moiré due to the interference with the display. For example, in the case of the conductive film 11 according to the second embodiment of the present invention shown in FIG. 7, a combined wiring pattern includes a non-equal pitch wiring pattern optimized in terms of visibility of moiré. The combined wiring pattern is formed by overlapping a wiring pattern, which is formed by the combination of the thin metal wires of the first electrode portion 17a in one wiring layer 28a of the two wiring layers 28a and 28b and the thin metal wires of the in-electrode dummy pattern portion, and a wiring pattern which is formed by the combination of the wiring pattern of the dummy electrode portion 26 and the combination of the thin metal wire of the second electrode portion 17b and the thin metal wires of the in-electrode dummy pattern portion in the other wiring layer 28b. As a result, the combined wiring pattern improves the visibility of the moiré due to the interference with the display.

As another form of the dummy electrode portion, there is a form of the sub non-conductive pattern described in WO2013/094729A.

The conductive film of the embodiment of the present invention is a conductive film provided on a display unit of a display device. The conductive film has a transparent substrate and a wiring portion formed on at least one surface of the transparent substrate and composed of a plurality of thin metal wires. The wiring portion has a mesh-shaped wiring pattern in which line wirings being composed of a plurality of thin metal wires arranged in parallel in one direction are overlapped in two or more directions. The line wiring includes a straight line wiring of which a plurality of thin metal wires are linear in at least one direction. The mesh-shaped wiring pattern is overlapped on the pixel array pattern of the display unit, and is a non-equal pitch wiring pattern in which repetitive pitches of the predetermined number of the thin metal wires are equal pitches and at least two thin metal wires among respective pitches of a predetermined number of the thin metal wires are non-equal pitches, in the straight line wiring in at least one direction.

The conductive film of the embodiment of the present invention is a conductive film provided on a display unit of a display device. The conductive film has a transparent substrate and a wiring portion formed on at least one surface of the transparent substrate and being composed of a plurality of thin metal wires. The wiring portion has a wiring pattern in which straight line wirings being composed of a plurality of thin metal wires arranged in parallel in one direction are overlapped in two or more directions. The wiring pattern may be overlapped on the pixel array pattern of the display unit, and may be a non-equal pitch wiring pattern in which repetitive pitches of the predetermined number of the thin metal wires are equal pitches and at least two thin metal wires among respective pitches of a predetermined number of the thin metal wires are non-equal pitches, in the straight line wiring in at least one direction.

According to the embodiment of the present invention, there is provided a method of producing a wiring pattern of a conductive film which is provided on a display unit of a display device and has a transparent substrate and a wiring portion that is formed on at least one surface of the transparent substrate and composed of a plurality of thin metal wires, where the wiring portion has a wiring pattern in which straight line wirings each being composed of a plurality of thin metal wires arranged in parallel in one direction are overlapped in two or more directions. The wiring pattern is overlapped on a pixel array pattern of the display unit, and the straight line wiring in at least one direction has a non-equal pitch wiring pattern in which repetitive pitches of a predetermined number of the thin metal wires are equal pitches and the respective pitches of the predetermined number of the thin metal wires are non-equal pitches. A luminance or a transmittance of the pixel array pattern is obtained. Transmittances of respective wiring patterns of the non-equal pitch wiring pattern and an equal pitch wiring pattern, in which repetitive pitches of the predetermined number of the thin metal wires are equal to those of the non-equal pitch wiring pattern, are obtained. A 2-dimensional Fourier frequency distribution of the transmittances of the wiring patterns is derived. A 2-dimensional Fourier frequency distribution of the luminance or the transmittance of the pixel array pattern is derived. Respective frequency components of moiré is calculated from frequency components of the 2-dimensional Fourier frequency distribution of the transmittances of the non-equal pitch wiring pattern and the equal pitch wiring pattern and frequency components of the 2-dimensional Fourier frequency distribution of the luminance or the transmittance of the pixel array pattern. In addition, human's visual response characteristics are applied to the calculated respective frequency components of the moiré so as to obtain a moiré evaluation value, which is a sum of intensities of the respective frequency components. In addition, the non-equal pitch wiring pattern is produced in a state where the obtained moiré evaluation value in the non-equal pitch wiring pattern is less than a moiré evaluation value in the equal pitch wiring pattern.

As described above, the conductive member and the conductive film according to the embodiment of the present invention, the display device comprising the conductive film, the touch panel, the method of producing the wiring pattern of the conductive member, and the method of producing the wiring patterns of the conductive film have been described in various embodiments and examples. However, it is apparent that the present invention is not limited to the embodiments and the examples and may be improved and/or modified in various forms without departing from the scope of the embodiment of the present invention.

EXPLANATION OF REFERENCES 10, 11, 11A: conductive film
12, 12a, 12b: transparent base
14: thin wire made of metal (thin metal wire)
16, 16a, 16b: wiring portion
17, 17a, 17b: electrode portion
18, 18a, 18b: adhesive layer
20, 20a, 20b: protective layer
21, 21a, 21b, 21c, 21d, 21e, 21f, 21g, 21i, 21j: straight line wiring
22, 22a, 22b, 22c, 22d: opening portion
23a, 23b, 23c: line wiring
24: wiring pattern
24a: first (upper side) wiring pattern
24b: second (lower side) wiring pattern
25: wiring pattern
25a, 25b, 25e, 25f: wiring patterns including non-equal pitch wiring patterns
25c: equal pitch wiring pattern
25d: wiring pattern having different wiring pitches in two directions
26, 26a: dummy electrode portion
27: in-electrode dummy pattern portion
28, 28a, 28b: wiring layer
30, 30a: display unit
32, 32r, 32g, 32b: pixel
34: black matrix (BM)
36: region
38: pixel array pattern
40: display device
42: input side
44: touch panel
46: housing
48: cover member
50: cable
52: flexible substrate
54: detection control unit
56: adhesive layer
58: contact body

What is claimed is:

1. A conductive member provided on a display unit of a display device, comprising a wiring portion which is composed of a plurality of thin metal wires,
    wherein the wiring portion has a mesh-shaped wiring pattern in which line wirings each being composed of a plurality of thin metal wires arranged in parallel in one direction are overlapped in two or more directions,
    wherein the line wiring in at least one direction is a straight line wiring in which the plurality of thin metal wires are straight lines,
    wherein the straight line wiring in at least one direction has a non-equal pitch wiring pattern in which repetitive pitches of a predetermined number of the thin metal wires are equal and at least two pitches of the respective pitches of the predetermined number of the thin metal wires are different,
    wherein the mesh-shaped wiring pattern is overlapped on a pixel array pattern of the display unit,
    wherein a moiré evaluation value in the non-equal pitch wiring pattern is less than a moiré evaluation value in an equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, and
    wherein the moiré evaluation value is a sum of intensities of frequency components of moiré obtained by applying human's visual response characteristics to frequency components of the moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

2. The conductive member according to claim 1, wherein the visual response characteristics are given by a visual transfer function VTF represented by Expression (1):

$k \leq \log(0.238/0.138)/0.1,$ $VTF=1,$ $k > \log(0.238/0.138)/0.1,$ $VTF = 5.05 e^{-0.138k}(1-e^{0.1k})$ (1), and $k = \pi du/180,$ where log is a natural logarithm, k is a spatial frequency defined by solid angle (cycle/deg), u is a spatial frequency defined by length (cycle/mm), and d is an observation distance (mm) within a range of 100 mm to 1000 mm.

3. The conductive member according to claim 2, wherein the observation distance d in the visual response characteristics is a certain distance in a range from 300 mm to 800 mm.

4. The conductive member according to claim 1, wherein assuming that the moiré evaluation value is I, the moiré evaluation value I is derived from an intensity of each frequency component of the moiré by Expression (2):

$I = (\Sigma (R[i])^x)^{1/x}$ (2), where R[i] is an intensity of an i-th frequency component of moiré, and the order x is a certain value in a range of 1 to 4.

5. The conductive member according to claim 4, wherein the order x is 2.

6. The conductive member according to claim 1, wherein the moiré evaluation value is derived by a non-linear sum of the intensities of the frequency components of the moiré.

7. The conductive member according to claim 1, wherein the moiré evaluation value also includes frequency components of the moiré calculated from a frequency of 0 of the pixel array pattern and the frequency components of the wiring pattern.

8. The conductive member according to claim 1, wherein the pixel array pattern is a black matrix pattern.

9. The conductive member according to claim 1,
wherein the wiring portion has the mesh-shaped wiring pattern in which the line wirings are overlapped in two directions and all the plurality of thin metal wires are straight lines,
wherein the mesh-shaped wiring pattern in which the line wirings are overlapped in two directions is a bilaterally asymmetric wiring pattern.

10. The conductive member according to claim 1,
wherein the wiring portion has the mesh-shaped wiring pattern in which the line wirings are overlapped in two directions and all the plurality of thin metal wires are straight lines,
wherein an angle formed by the line wirings in the two directions is in a range of 40 degrees to 140 degrees.

11. A display device comprising:
a display unit having a predetermined pixel array pattern; and
the conductive member according to claim 1, which is provided on the display unit.

12. The display device according to claim 11, wherein the display unit is an organic EL display (OELD), and the pixel array patterns of at least two colors of red (R), green (G), and blue (B) are different.

13. A touch panel using the conductive member according to claim 1.

14. A conductive member provided on a display unit of a display device, comprising a wiring portion which is composed of a plurality of thin metal wires,
wherein the wiring portion has a mesh-shaped wiring pattern in which line wirings each being composed of a plurality of thin metal wires arranged in parallel in one direction are overlapped in two or more directions,
wherein the line wiring in at least one direction is a straight line wiring in which the plurality of thin metal wires are straight lines,
wherein the straight line wiring in at least one direction has a non-equal pitch wiring pattern in which repetitive pitches of a predetermined number of the thin metal wires are equal and at least two pitches of the respective pitches of the predetermined number of the thin metal wires are different,
wherein the mesh-shaped wiring pattern is overlapped on a pixel array pattern of the display unit, and
wherein the conductive member further has at least one of the following configurations (1) to (8):
(1) an intensity of a frequency component of the moiré that contributes most to the moiré in the non-equal pitch wiring pattern is less than an intensity of a frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal;
(2) a frequency of the frequency component of the moiré that contributes most to the moiré in the non-equal pitch wiring pattern is greater than a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal;
(3) at or below a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, the moiré evaluation value in the non-equal pitch wiring pattern is less than the moiré evaluation value in the equal pitch wiring pattern, and
wherein the moiré evaluation value is a sum of intensities of frequency components of moiré obtained by applying human's visual response characteristics to frequency components of the moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern;

(4) at a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the moiré in the non-equal pitch wiring pattern is less than an intensity of the frequency component of the moiré in the equal pitch wiring pattern;

(5) an intensity of the frequency component of the non-equal pitch wiring pattern as a cause of the frequency component of the moiré that contributes most to the moiré in the non-equal pitch wiring pattern is less than an intensity of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal;

(6) at a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the non-equal pitch wiring pattern is less than an intensity of the frequency component of the equal pitch wiring pattern;

(7) assuming that the predetermined number is n and the thin metal wires are thin metal wires 1, 2, . . . , and n in the non-equal pitch wiring pattern, a pitch p of each thin metal wire from the thin metal wire 1 satisfies at least one of Condition 1 or Condition 2:

Condition 1: a difference between the number of thin metal wires where the pitch p belongs to an interval of $(N-d)*T<p<(N+d)*T$ and the number of thin metal wires where the pitch p belongs to an interval of $(N+0.5-d)*T<p<(N+0.5+d)*T$ is equal to or less than 1; and Condition 2: a difference between the number of thin metal wires where the pitch p belongs to an interval of $(N+0.25-d)*T<p<(N+0.25+d)*T$ and the number of thin metal wires where the pitch p belongs to an interval of $(N+0.75-d)*T<p<(N+0.75+d)*T$ is equal to or less than 1, where T is a period given by 1/F in which F is a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, N is 0 or a positive integer and is equal to or less than an integer of $(n*PA/T)$ in which PA is a pitch of the equal pitch wiring pattern, and d is a certain value in a range of 0.025 to 0.25; and (8) assuming that the predetermined number is n and the thin metal wires are thin metal wires 1, 2, . . . , and n in the non-equal pitch wiring pattern, a pitch p of each thin metal wire from the thin metal wire 1 satisfies at least one of Condition 1 or Condition 2:

Condition 1: a difference between the number of thin metal wires where the pitch p belongs to an interval of $(N-d)*T<p<(N+d)*T$ and the number of thin metal wires where the pitch p belongs to an interval of $(N+0.5-d)*T<p<(N+0.5+d)*T$ is equal to or less than 1; and Condition 2: a difference between the number of thin metal wires where the pitch p belongs to an interval of $(N+0.25-d)*T<p<(N+0.25+d)*T$ and the number of thin metal wires where the pitch p belongs to an interval of $(N+0.75-d)*T<p<(N+0.75+d)*T$ is equal to or less than 1, where T is a period given by 1/F in which F is a frequency of the frequency component of the wiring pattern of the thin metal wires as a cause of the frequency component of the moiré that contributes most to the moiré in the wiring pattern formed only of any of thin metal wires 1, 2, . . . , and n, N is 0 or a positive integer and is equal to or less than an integer of $(n*PA/T)$ in which PA is a pitch of the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, and d is a certain value in a range of 0.025 to 0.25.

15. A conductive member, comprising a wiring portion which is composed of a plurality of thin metal wires,
wherein the wiring portion has a mesh-shaped wiring pattern in which line wirings each being composed of a plurality of thin metal wires arranged in parallel in one direction are overlapped in two or more directions,
wherein the line wiring in at least one direction is a straight line wiring in which the plurality of thin metal wires are straight lines,
wherein the straight line wiring in at least one direction has a non-equal pitch wiring pattern in which repetitive pitches of a predetermined number of the thin metal wires are equal and at least two pitches of the respective pitches of the predetermined number of the thin metal wires are different, and
wherein the wiring portion has a wiring pattern in which an average pitch of the line wiring in at least one direction among the line wirings in two or more directions is different from an average pitch of the line wiring in at least one different direction.

16. The conductive member according to claim 15, wherein among the line wirings in two or more directions, a wiring pattern of a line wiring in a direction in which the average pitch is the narrowest is the non-equal pitch wiring pattern.

17. A conductive member, comprising a wiring portion which is composed of a plurality of thin metal wires,
wherein the wiring portion has a mesh-shaped wiring pattern in which line wirings each being composed of a plurality of thin metal wires arranged in parallel in one direction are overlapped in two or more directions,
wherein the line wiring in at least two direction is a straight line wiring in which the plurality of thin metal wires are straight lines,
wherein an angle formed by the line wirings in the two directions is in a range of 60 degrees to 120 degrees, wherein the line wiring in at least one direction is a straight line wiring in which the plurality of thin metal wires are straight lines, and wherein the straight line wiring in at least one direction has a non-equal pitch wiring pattern in which repetitive pitches of a predetermined number of the thin metal wires are equal and at least two pitches of the respective pitches of the predetermined number of the thin metal wires are different.

18. The conductive member according to claim 17, wherein an average pitch of the line wiring in at least one direction among the line wirings overlapped in the two or more directions is in a range of 30 μm to 600 μm.

19. The conductive member according to claim 18, wherein the average pitch is equal to or less than 300 μm.

20. A method of producing a wiring pattern of a conductive member which is provided on a display unit of a display device and has a wiring portion that is composed of a plurality of thin metal wires, where the wiring portion has a mesh-shaped wiring pattern in which line wirings each being composed of a plurality of thin metal wires arranged in parallel in one direction are overlapped in two or more directions, in which the line wiring in at least one direction is a straight line wiring in which the plurality of thin metal wires are straight lines, and the mesh-shaped wiring pattern is overlapped on a pixel array pattern of the display unit, and the straight line wiring in at least one direction has a non-equal pitch wiring pattern in which repetitive pitches of a predetermined number of the thin metal wires are equal and at least two pitches of the respective pitches of the predetermined number of the thin metal wires are different, the method comprising:

acquiring a luminance or a transmittance of the pixel array pattern;

acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal;

deriving a 2-dimensional Fourier frequency distribution of the transmittances of the respective wiring patterns of the non-equal pitch wiring pattern and the equal pitch wiring pattern;

deriving a 2-dimensional Fourier frequency distribution of the luminance or the transmittance of the pixel array pattern;

calculating respective frequency components of moiré from frequency components of the 2-dimensional Fourier frequency distribution of the transmittances of the non-equal pitch wiring pattern and the equal pitch wiring pattern and frequency components of the 2-dimensional Fourier frequency distribution of the luminance or the transmittance of the pixel array pattern;

applying human's visual response characteristics to the calculated respective frequency components of the moiré so as to obtain a moiré evaluation value, which is a sum of intensities of the respective frequency components; and producing the non-equal pitch wiring pattern in a state where the obtained moiré evaluation value in the non-equal pitch wiring pattern is less than a moiré evaluation value in the equal pitch wiring pattern.

* * * * *